United States Patent [19]

Ogura et al.

[11] Patent Number: 5,463,231
[45] Date of Patent: Oct. 31, 1995

[54] METHOD OF OPERATING THYRISTOR WITH INSULATED GATES

[75] Inventors: Tsuneo Ogura, Yokohama; Kiminori Watanabe, Kawasaki; Akio Nakagawa, Hiratsuka; Yoshihiro Yamaguchi, Urawa; Norio Yasuhara, Yokohama; Tomoko Matsudai, Tokyo; Shigeru Hasegawa, Yokohama; Kazuya Nakayama, Sagamihara, all of Japan

[73] Assignee: Kabushiki Kaisha Toshiba, Kawasaki, Japan

[21] Appl. No.: 353,385

[22] Filed: Dec. 2, 1994

Related U.S. Application Data

[63] Continuation of Ser. No. 164,756, Dec. 10, 1993, Pat. No. 5,428,228, which is a continuation-in-part of Ser. No. 896,422, Jun. 10, 1992, Pat. No. 5,315,134.

[30] Foreign Application Priority Data

| Jun. 10, 1991 | [JP] | Japan | 3-137894 |
| Dec. 26, 1991 | [JP] | Japan | 3-345501 |
| Dec. 10, 1992 | [JP] | Japan | 4-352213 |
| Jun. 30, 1993 | [JP] | Japan | 5-183415 |

[51] Int. Cl.[6] .......................... H01L 29/74; H01L 31/111
[52] U.S. Cl. .......................... 257/138; 257/128; 257/142; 257/144; 257/162
[58] Field of Search .......................... 257/123, 124, 257/128, 133, 138, 141, 142, 144, 162, 212, 157, 167, 590

[56] References Cited

U.S. PATENT DOCUMENTS

| 4,680,604 | 7/1987 | Nakagawa et al. | 257/142 |
| 4,857,983 | 8/1989 | Baliga et al. | 257/123 |
| 4,959,703 | 9/1990 | Ogura et al. | 257/153 |
| 4,963,951 | 10/1990 | Adler et al. | 257/141 |

Primary Examiner—William L. Sikes
Assistant Examiner—Fetsum Abraham
Attorney, Agent, or Firm—Oblon, Spivak, McClelland, Maier & Neustadt

[57] ABSTRACT

A thyristor with insulated gates includes turn-off and turn-on MOSFETs. The turn-on MOSFET has a turn-on gate employing a p-type base as a channel and extending over an n-type base and an n-type emitter. The turn-off MOSFET has n-type drain and source layers formed in a p-type base layer, and a turn-off gate extending over the drain and source layers. The n-type drain layer is short-circuited with the p-type base layer via a drain electrode. The drain electrode is formed near an n-type emitter layer. When the thyristor is to be turned off, the first voltage is applied to the turn-on gate, and the second voltage is applied to the turn-off gate while the first voltage is applied to the turn-on gate. After the application of the second voltage continues for a predetermined period of time, the application of the first voltage to the turn-on gate is stopped. With this operation, the thyristor can be turned off even with a large current.

20 Claims, 36 Drawing Sheets

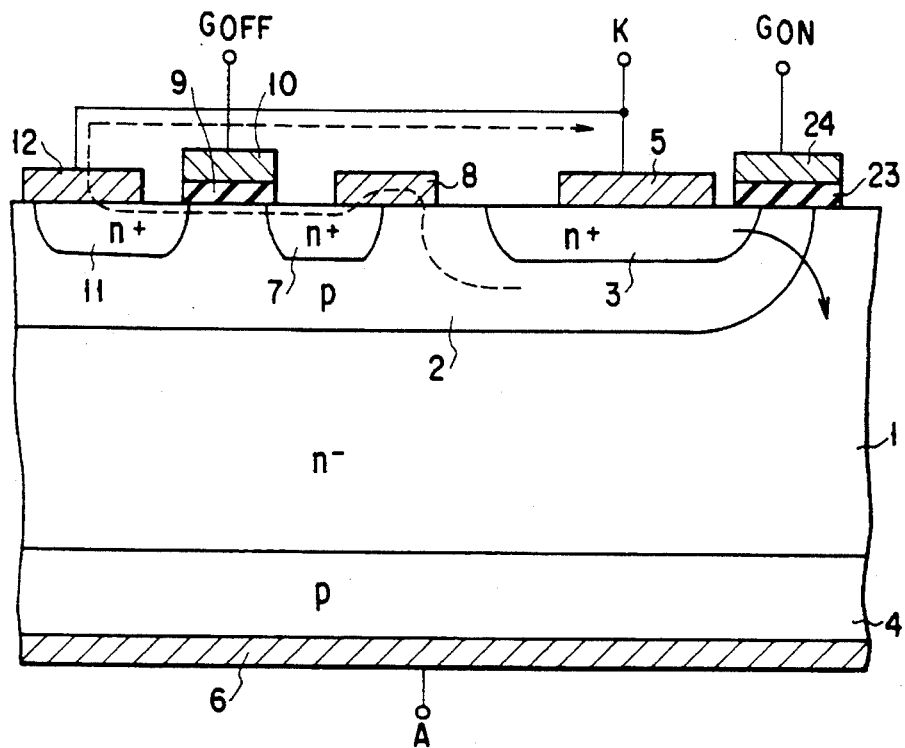
F I G. 1
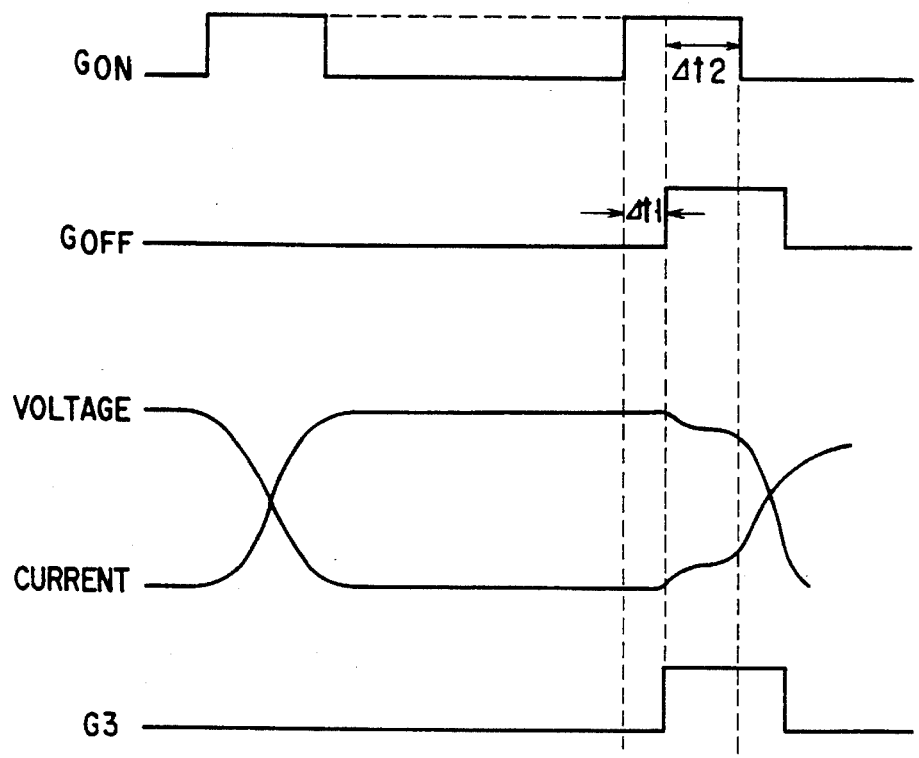
F I G. 2

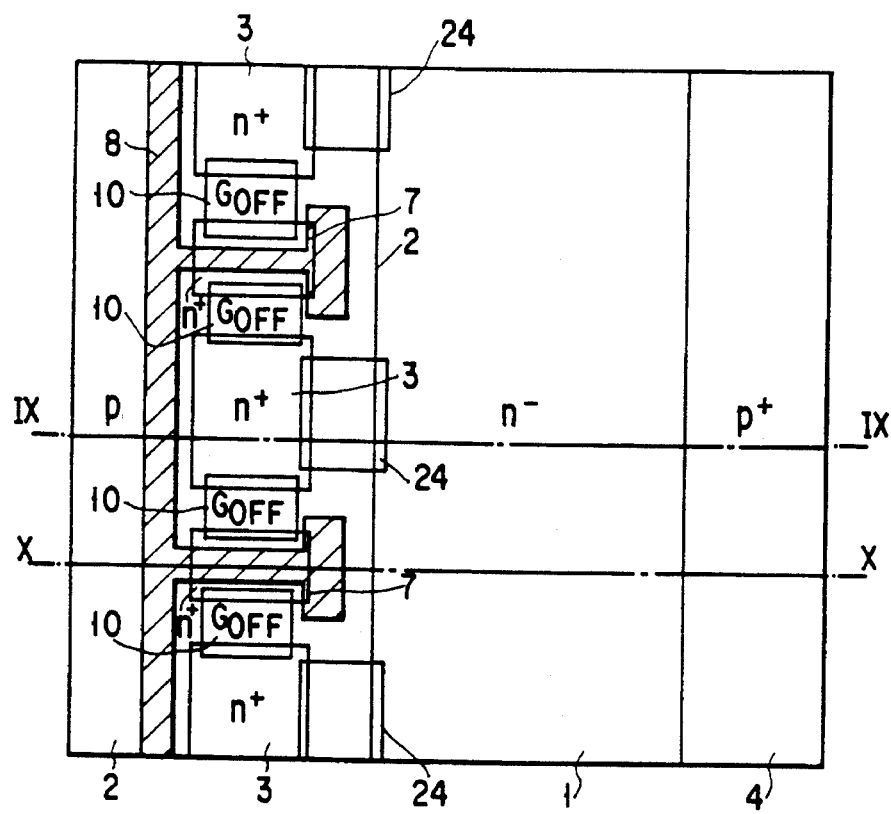
F I G. 8
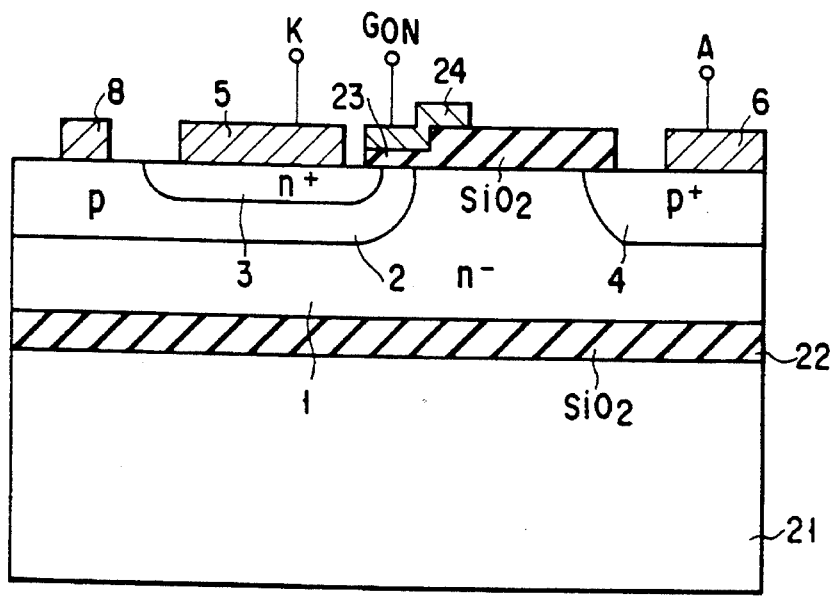
F I G. 9

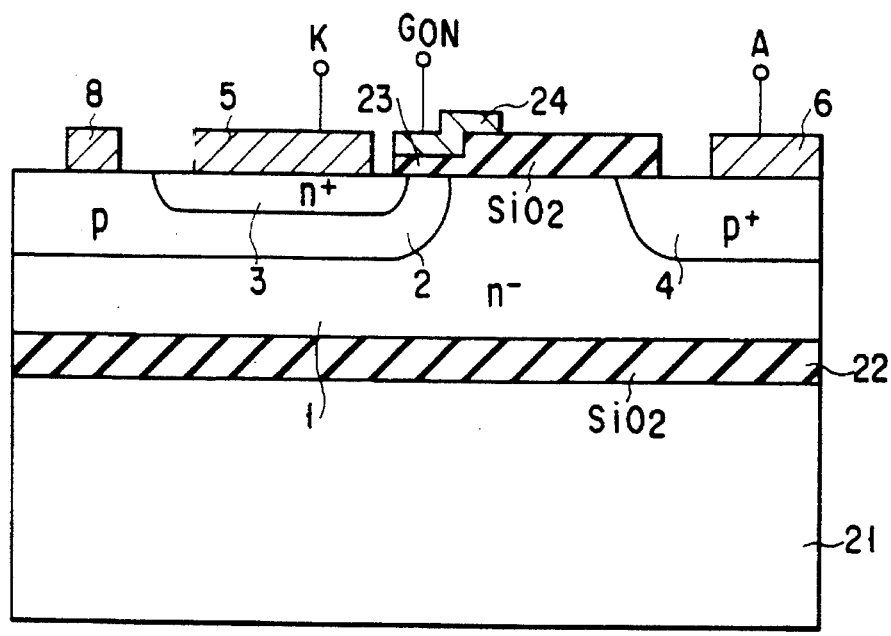
F I G. 1 2
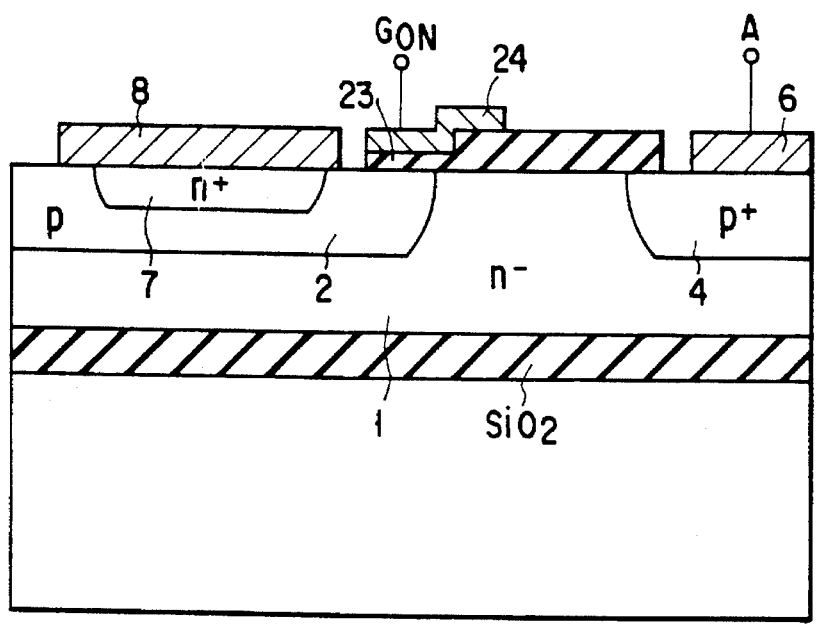
F I G. 1 3

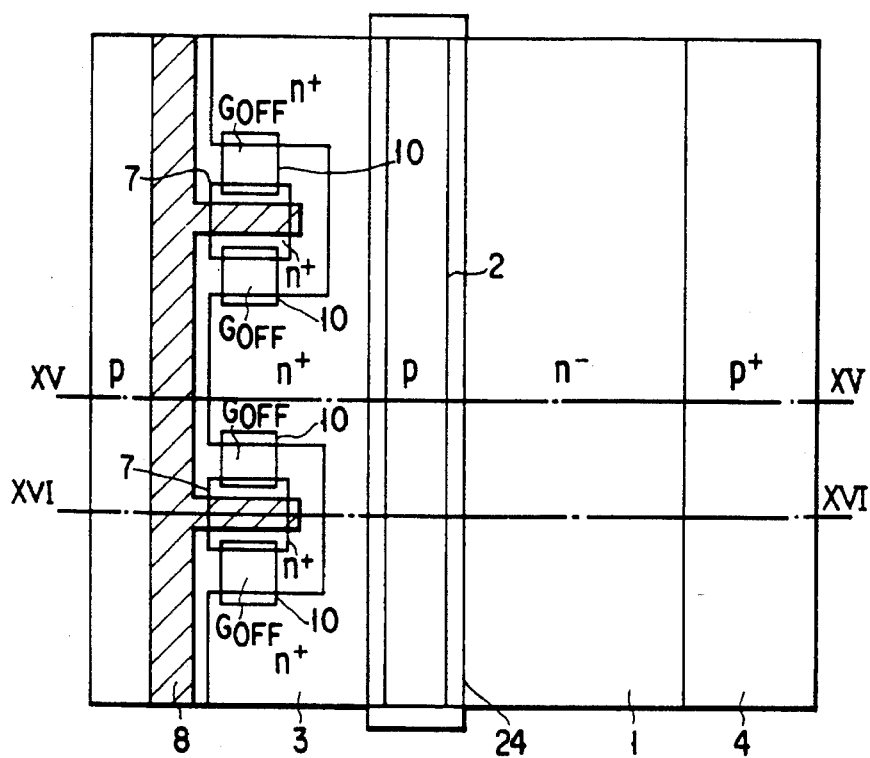
F I G. 14
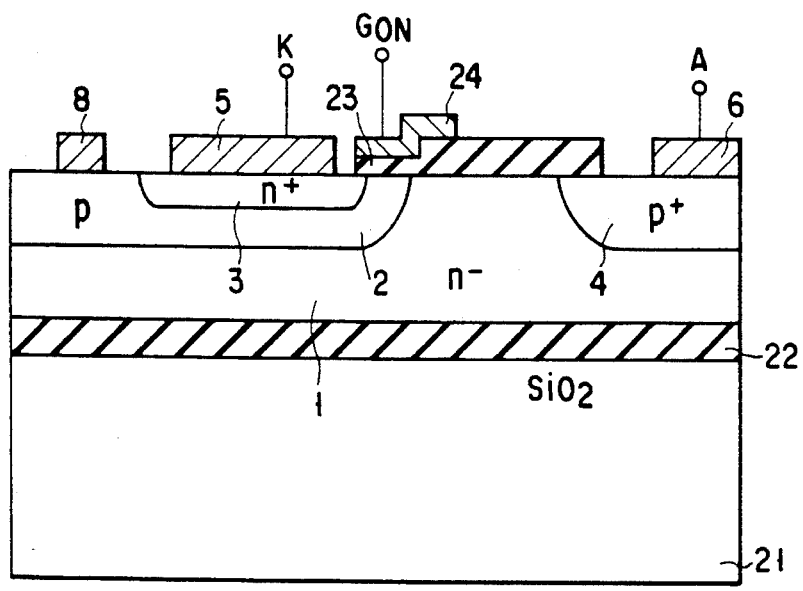
F I G. 15

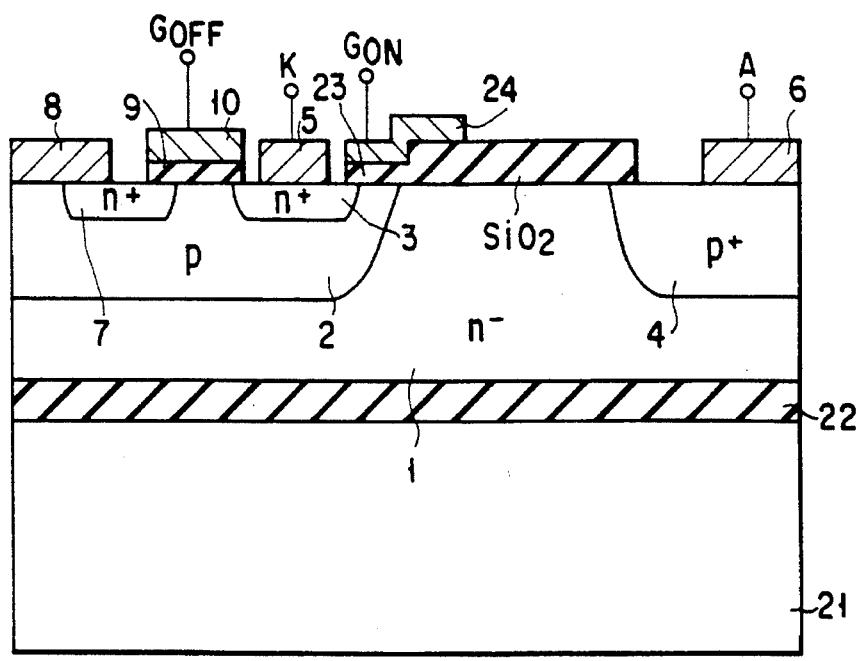
F I G. 18
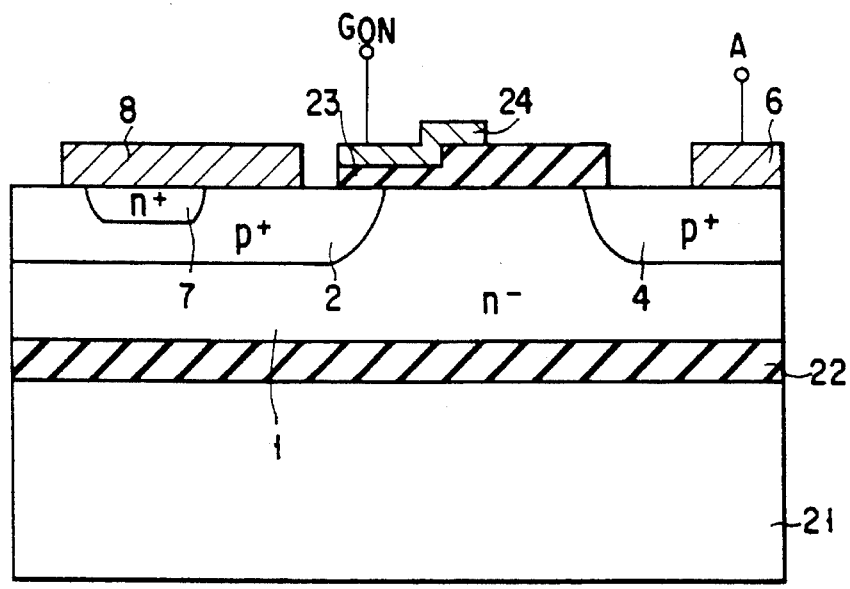
F I G. 19

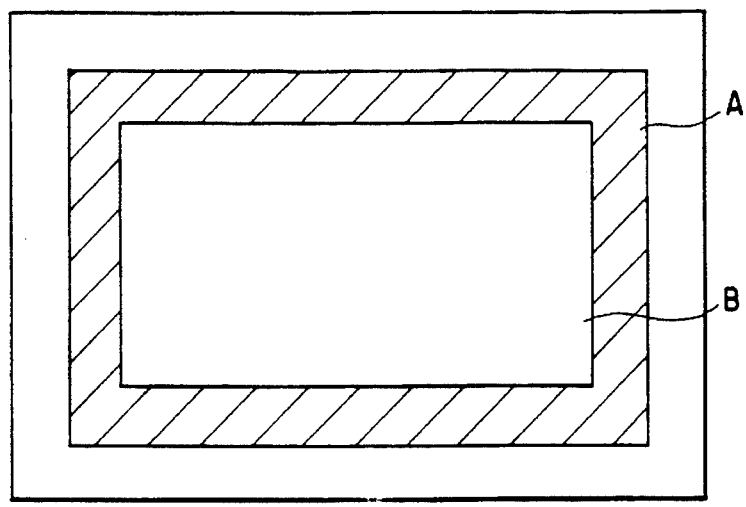
F I G. 24
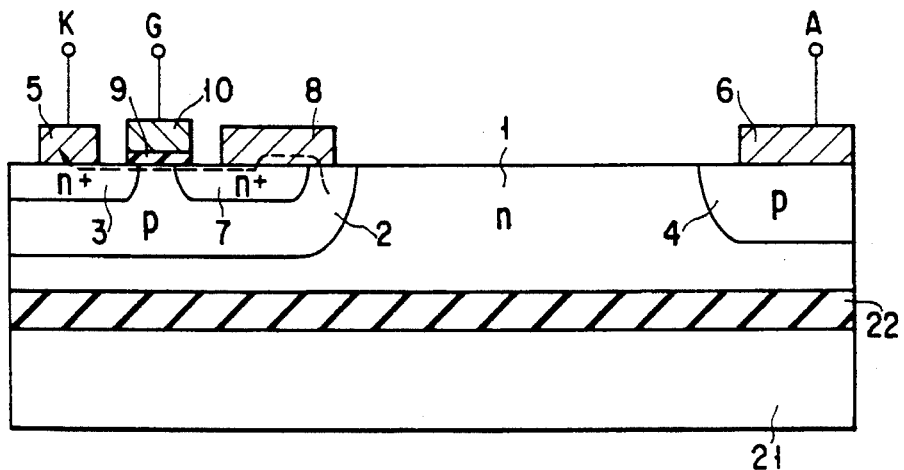
F I G. 25
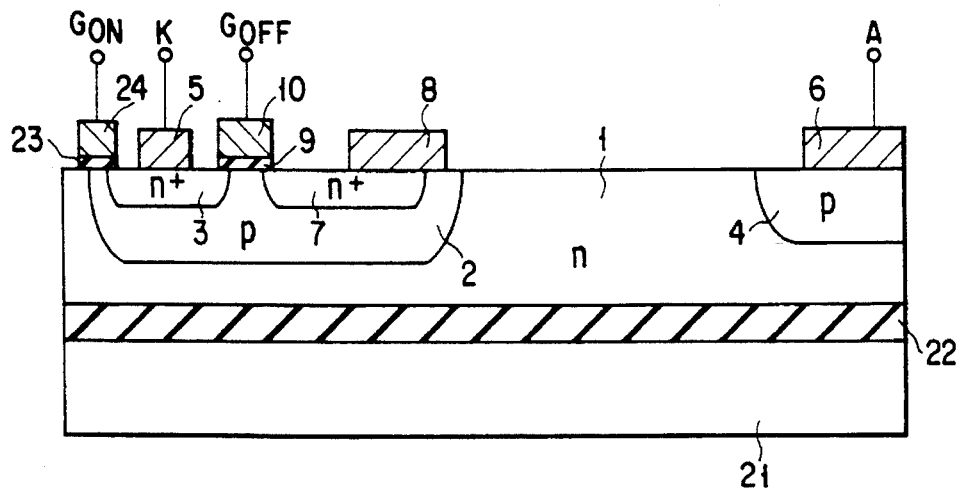
F I G. 26

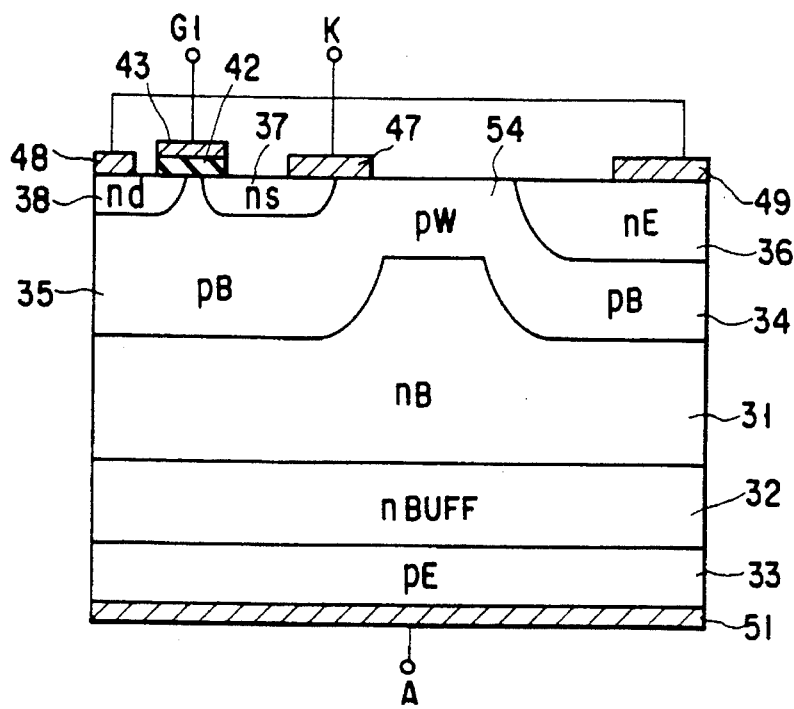
F I G. 35
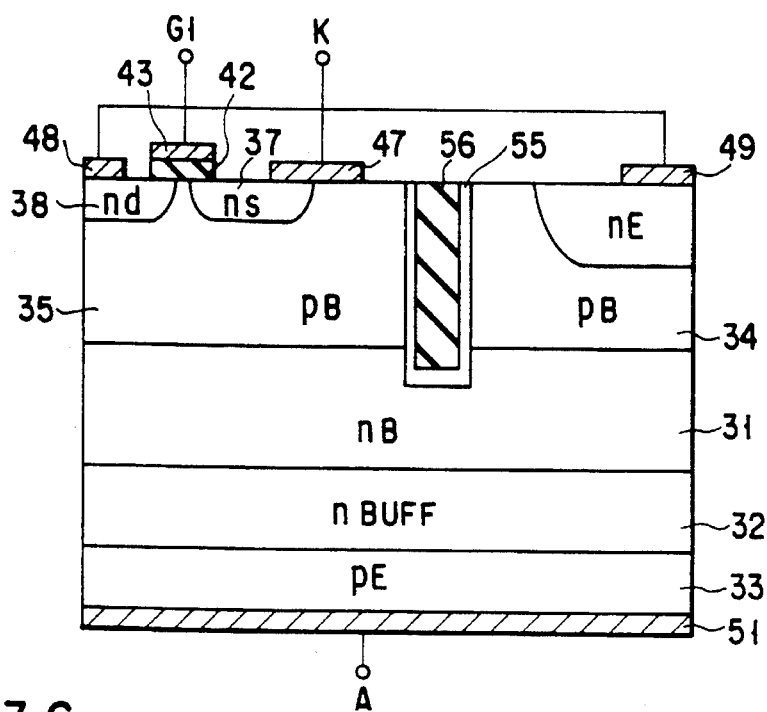
F I G. 36

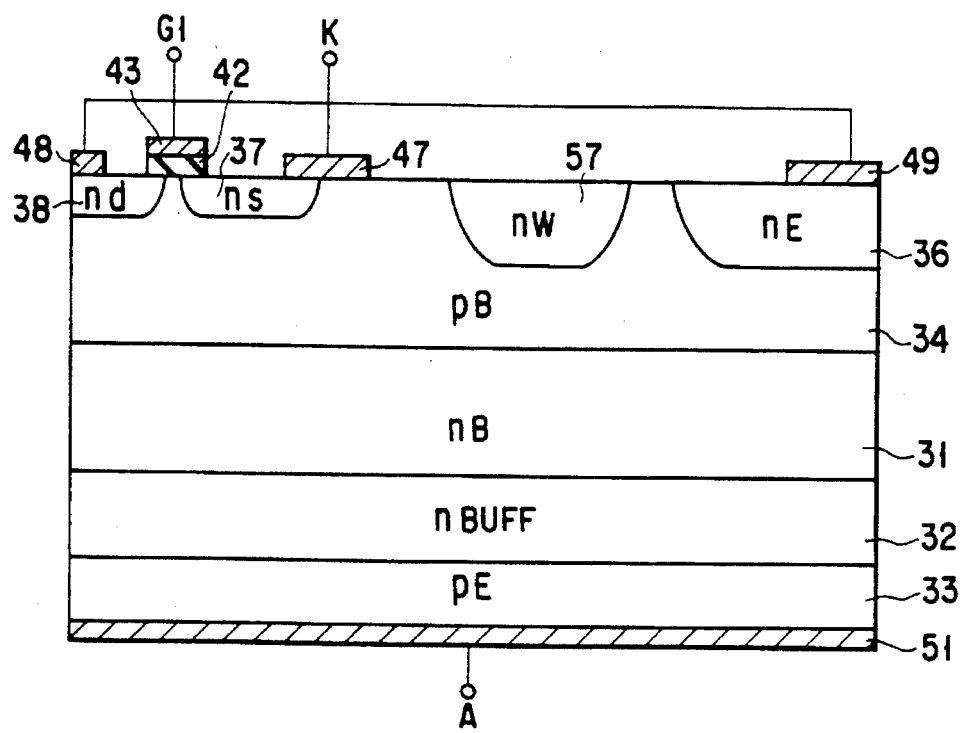
F I G. 37
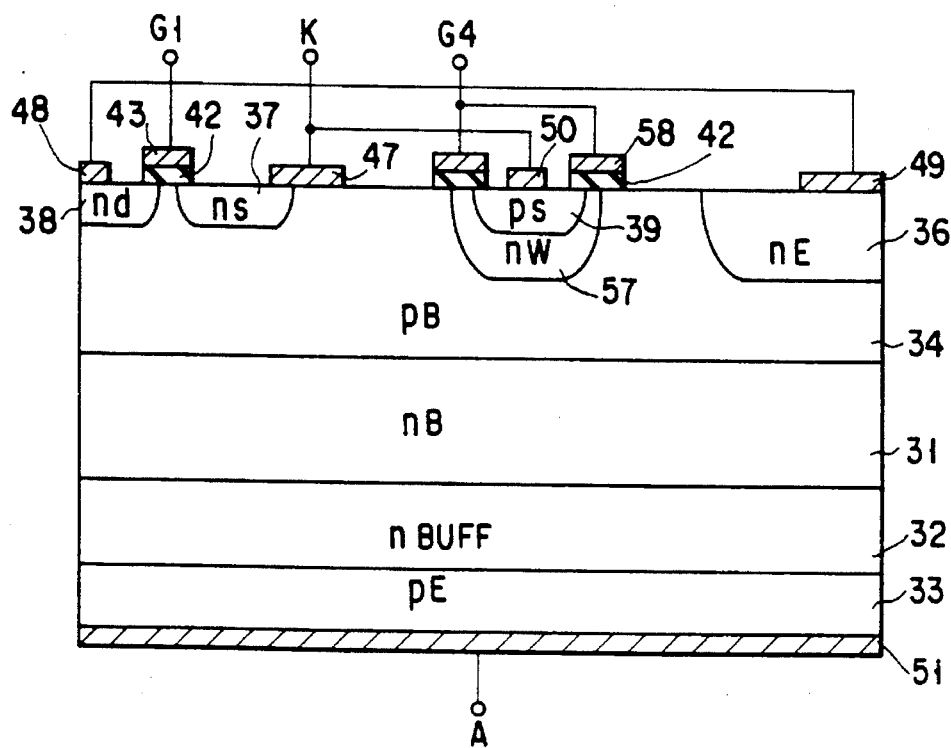
F I G. 38

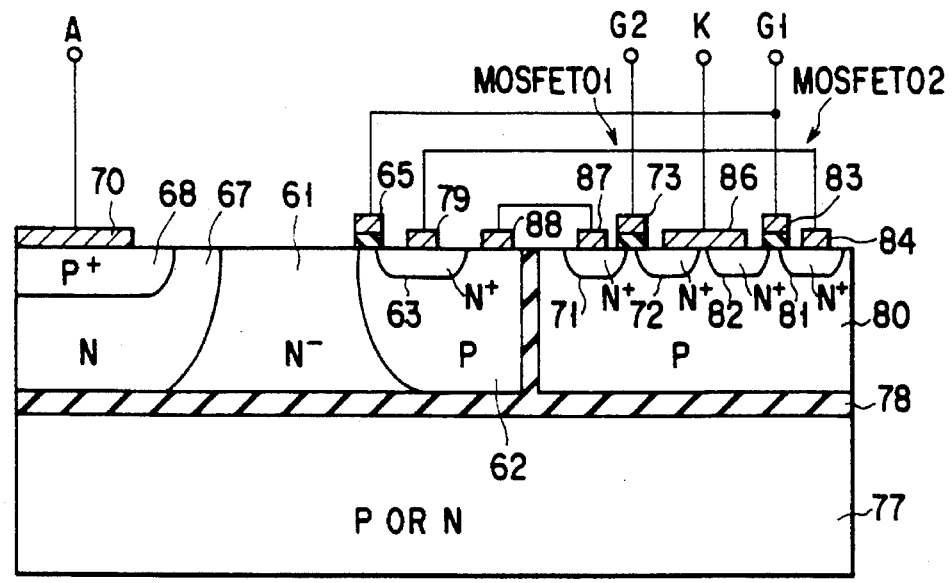
F I G. 41
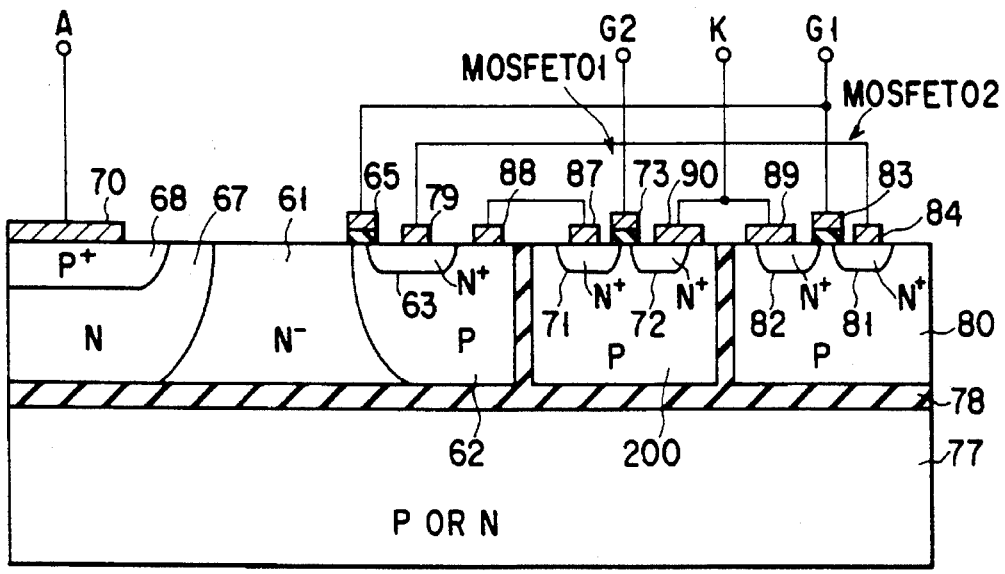
F I G. 42

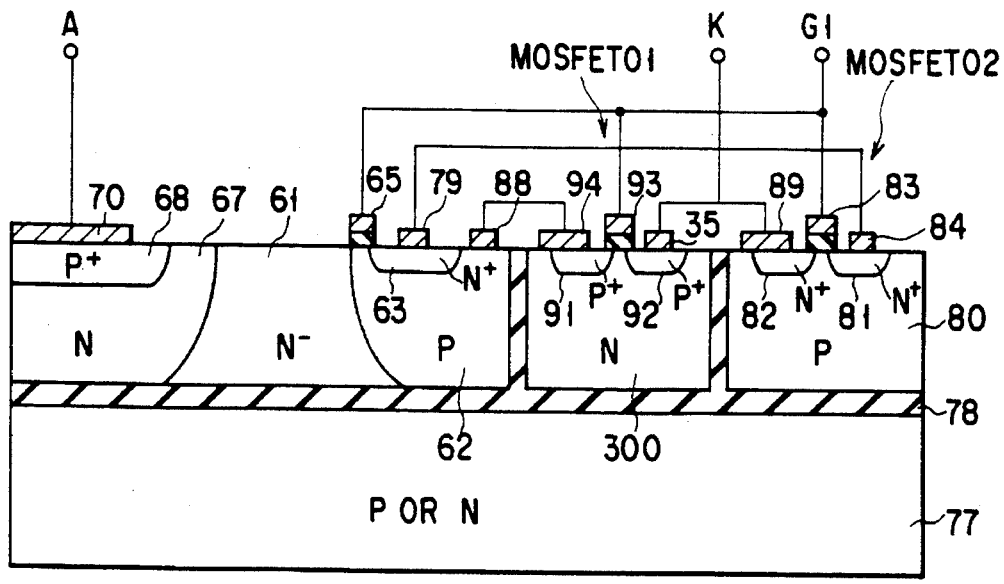
F I G. 43
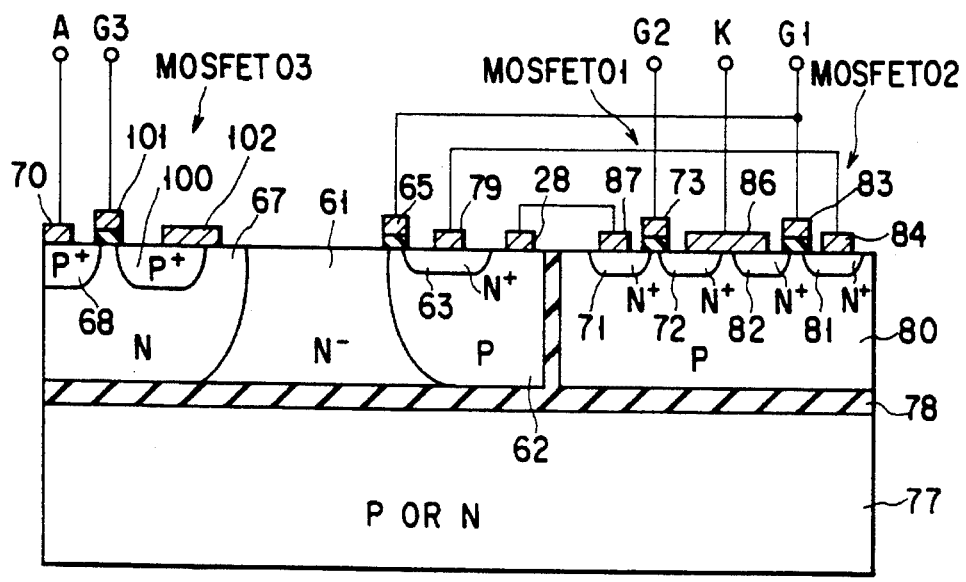
F I G. 44

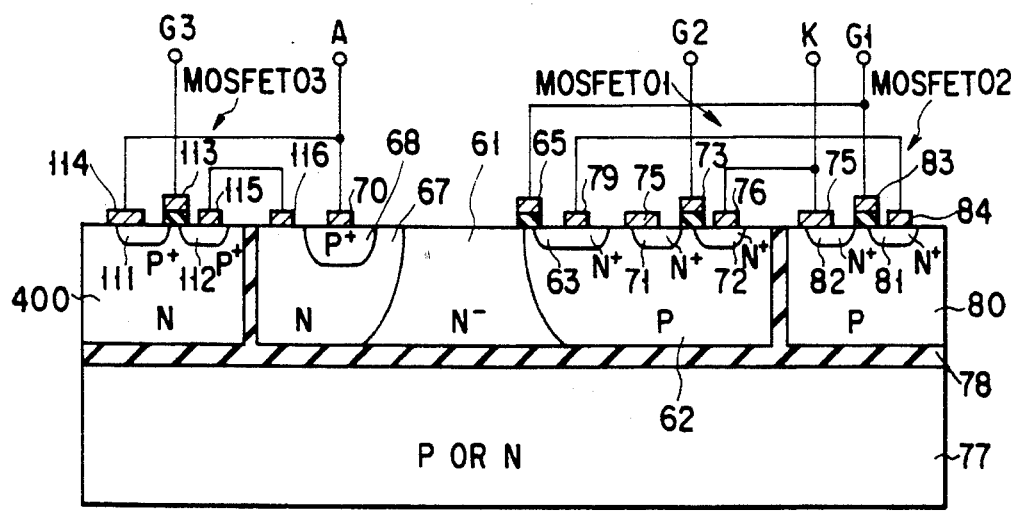
F I G. 45
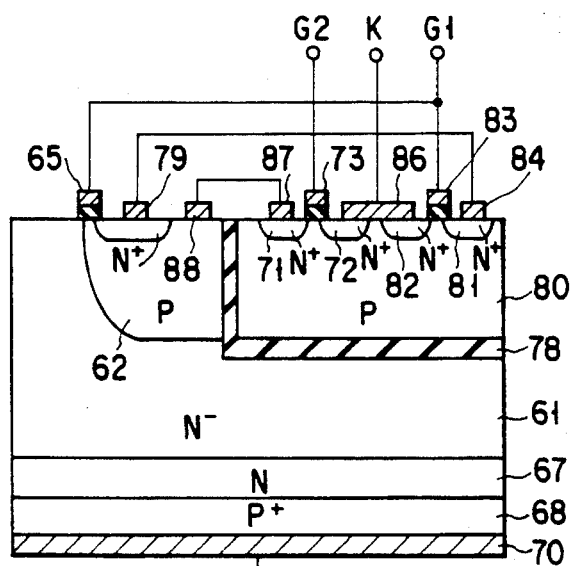
F I G. 46
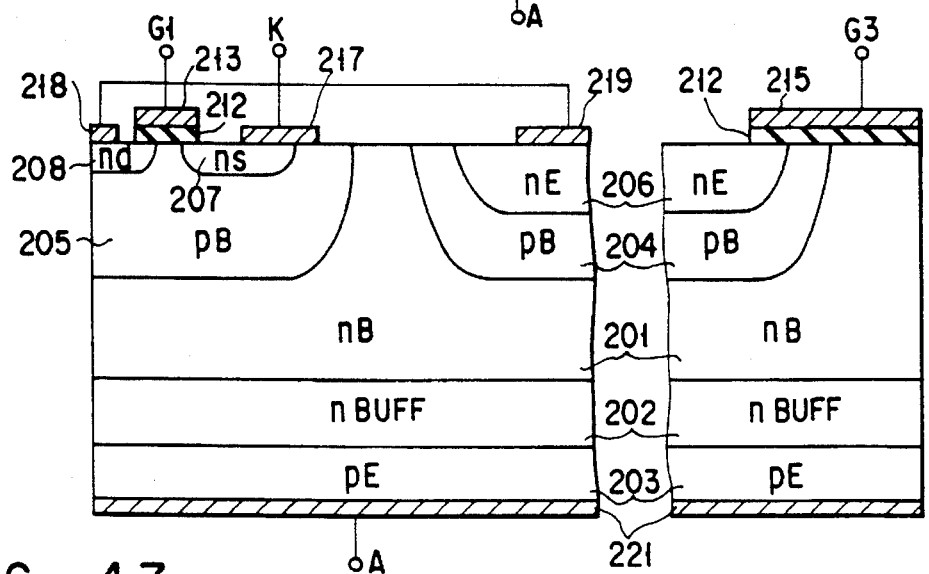
F I G. 47

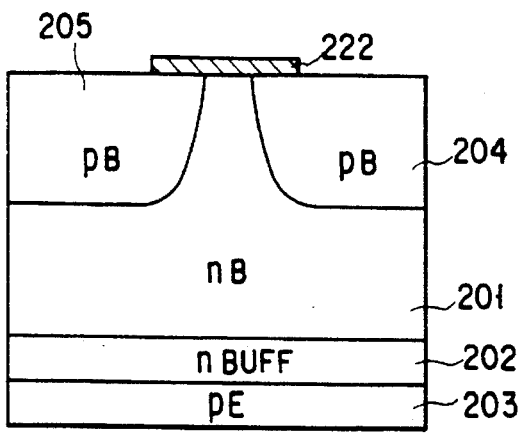
F I G. 52A
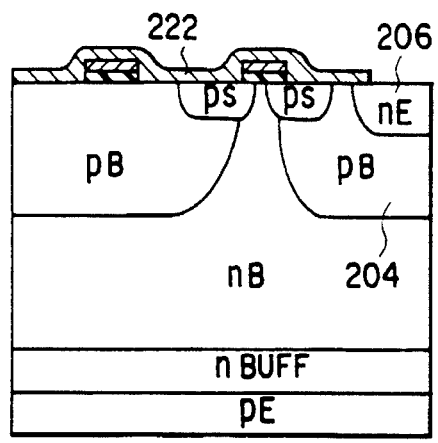
F I G. 53A
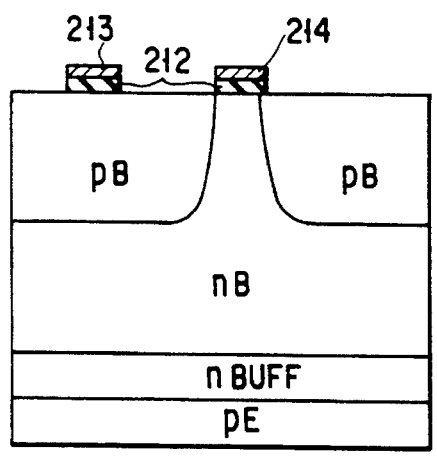
F I G. 52B
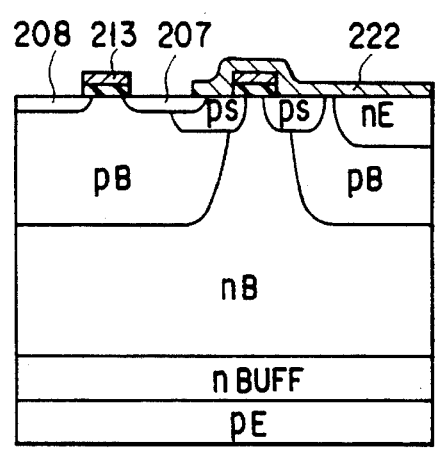
F I G. 53B
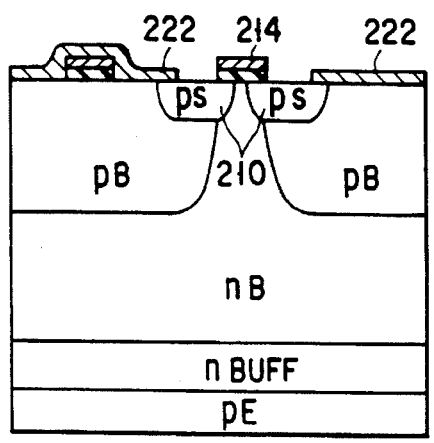
F I G. 52C
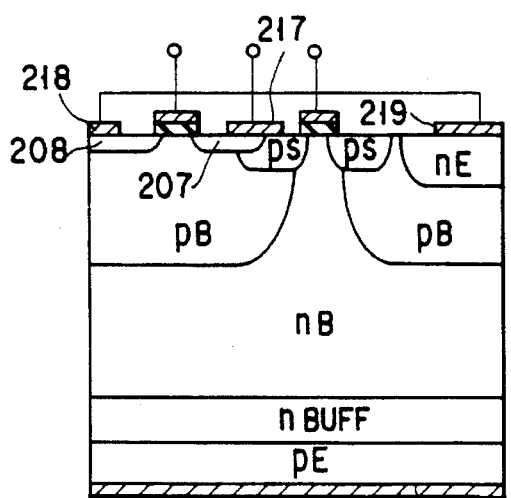
F I G. 53C

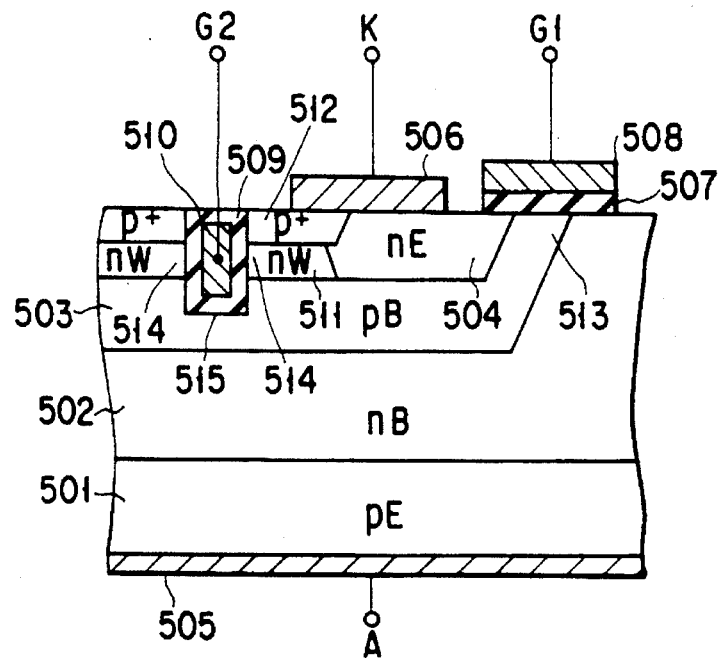
F I G. 58A
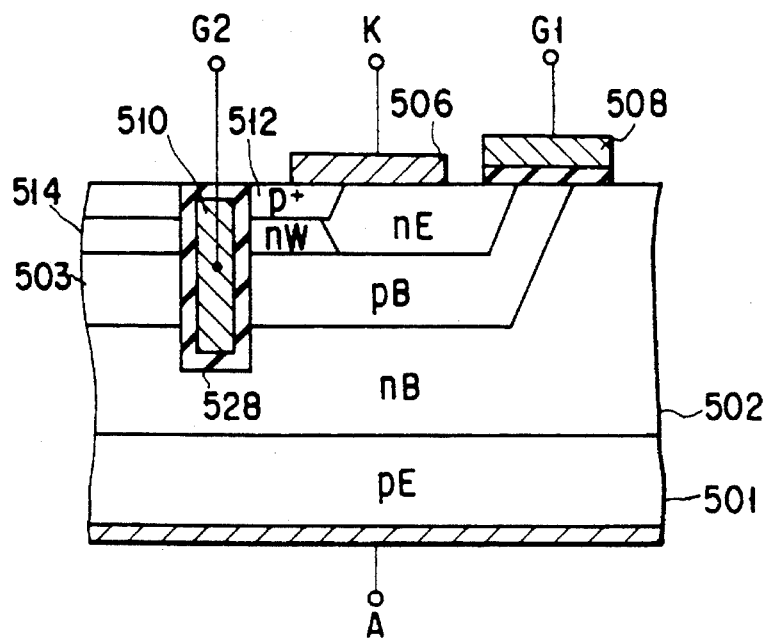
F I G. 58B

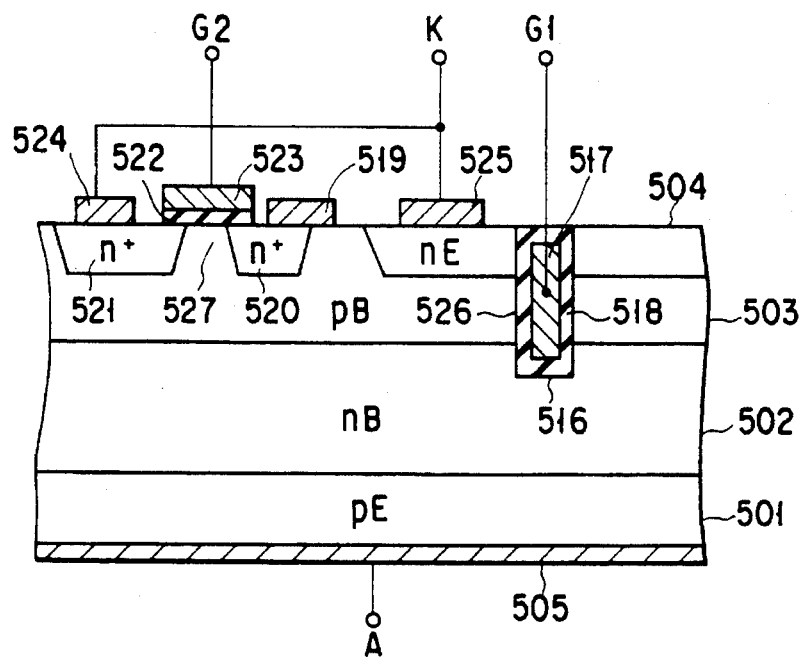
F I G. 59A
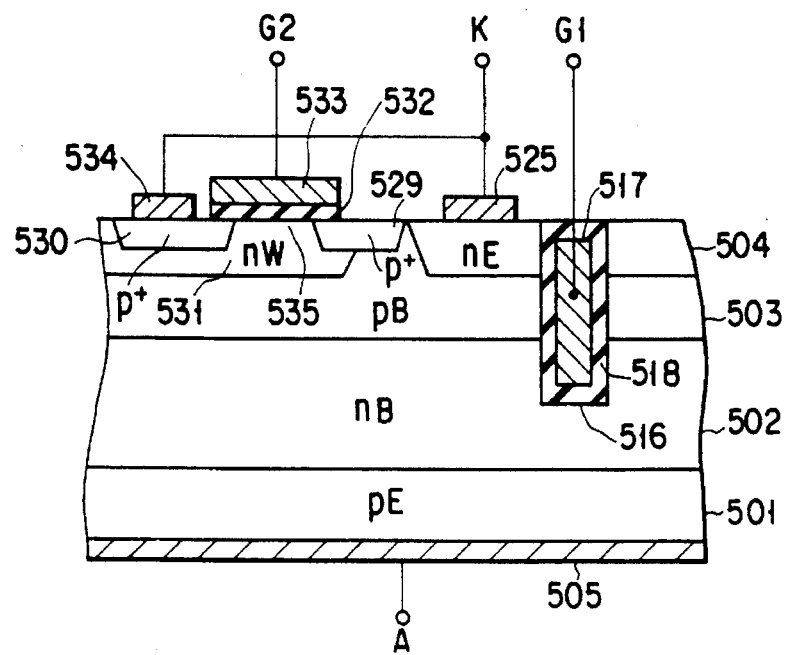
F I G. 59B

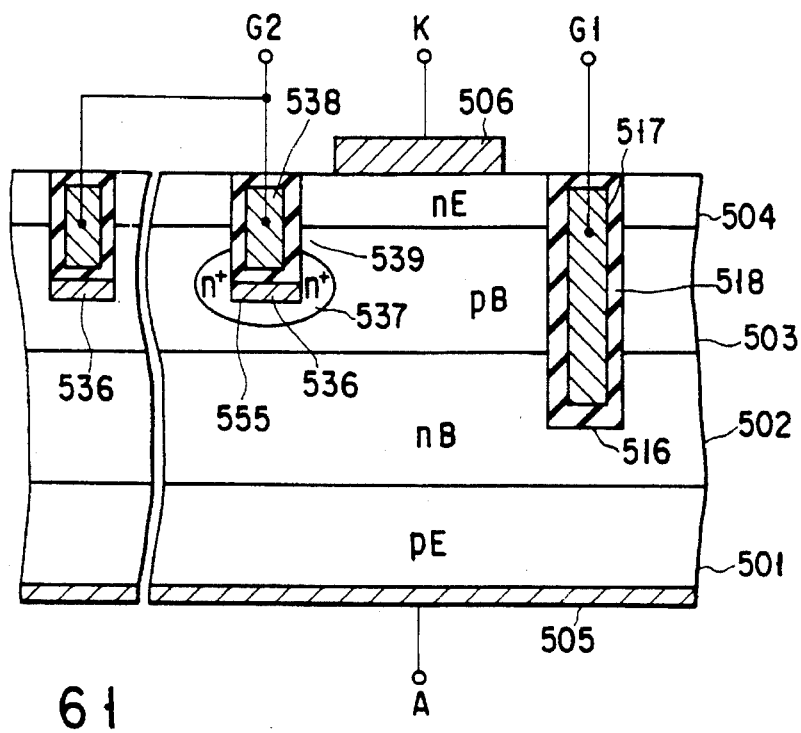
F I G. 61
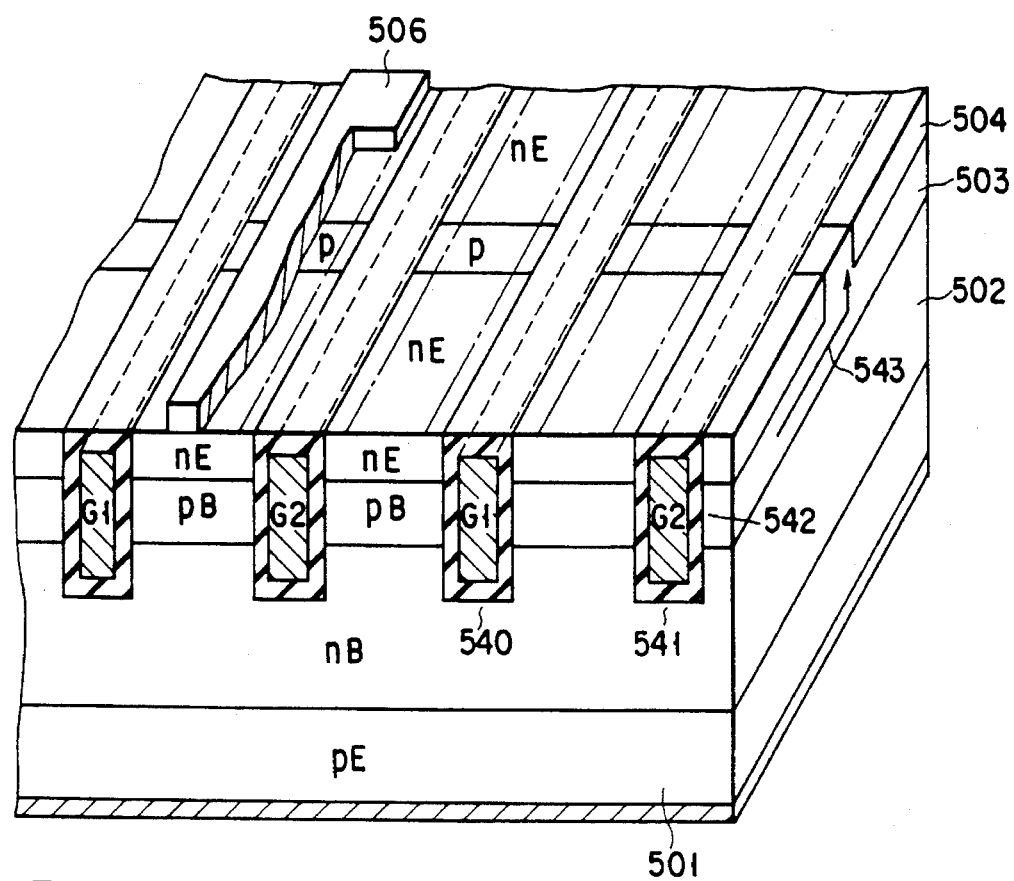
F I G. 62

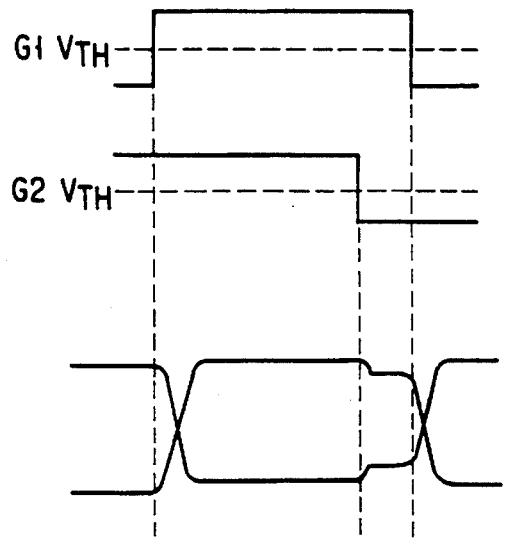
F I G. 63A
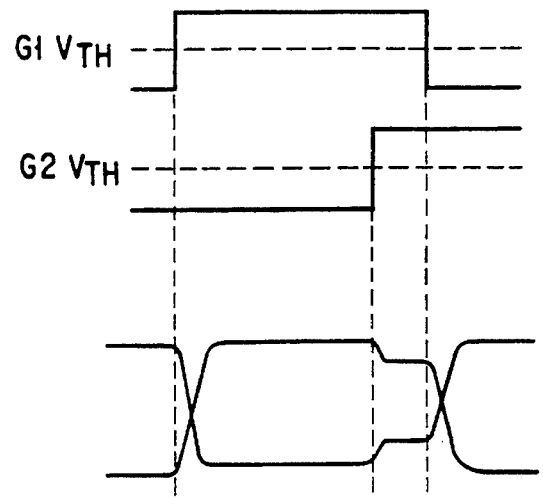
F I G. 63B

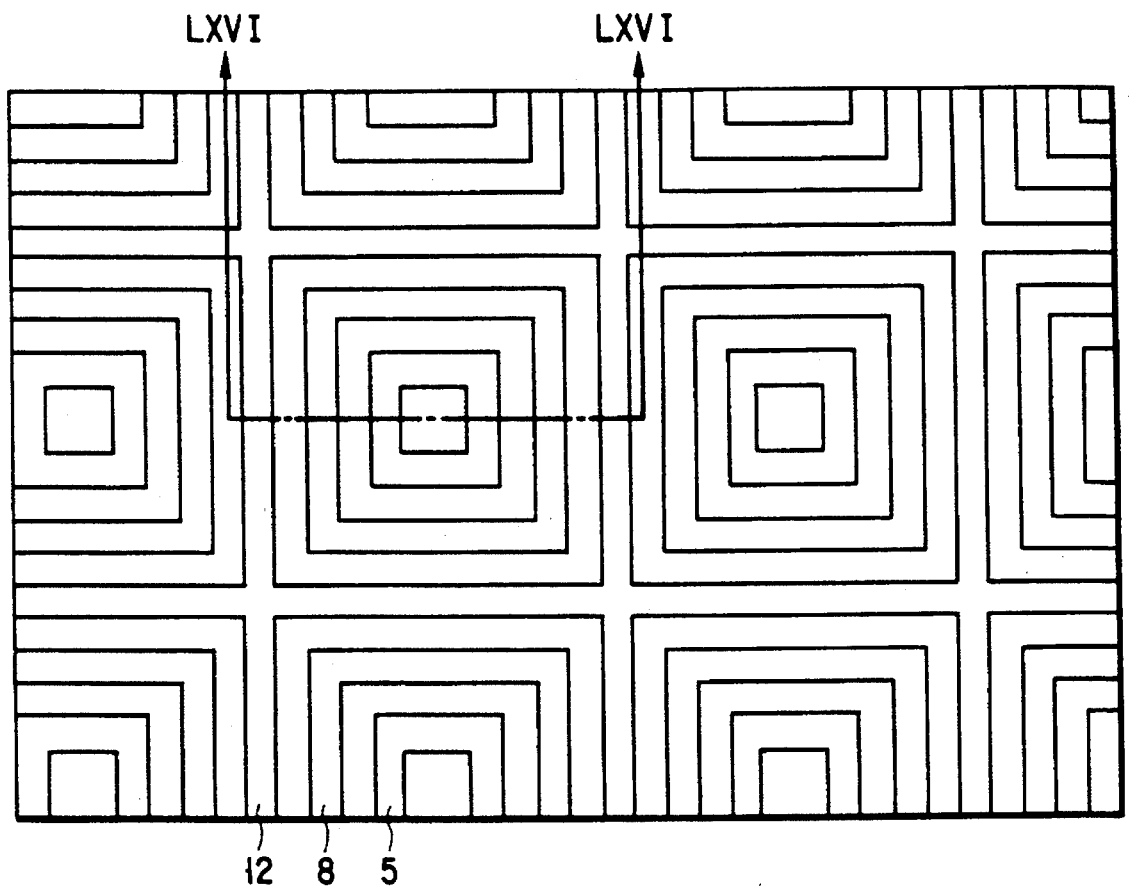
F I G. 65

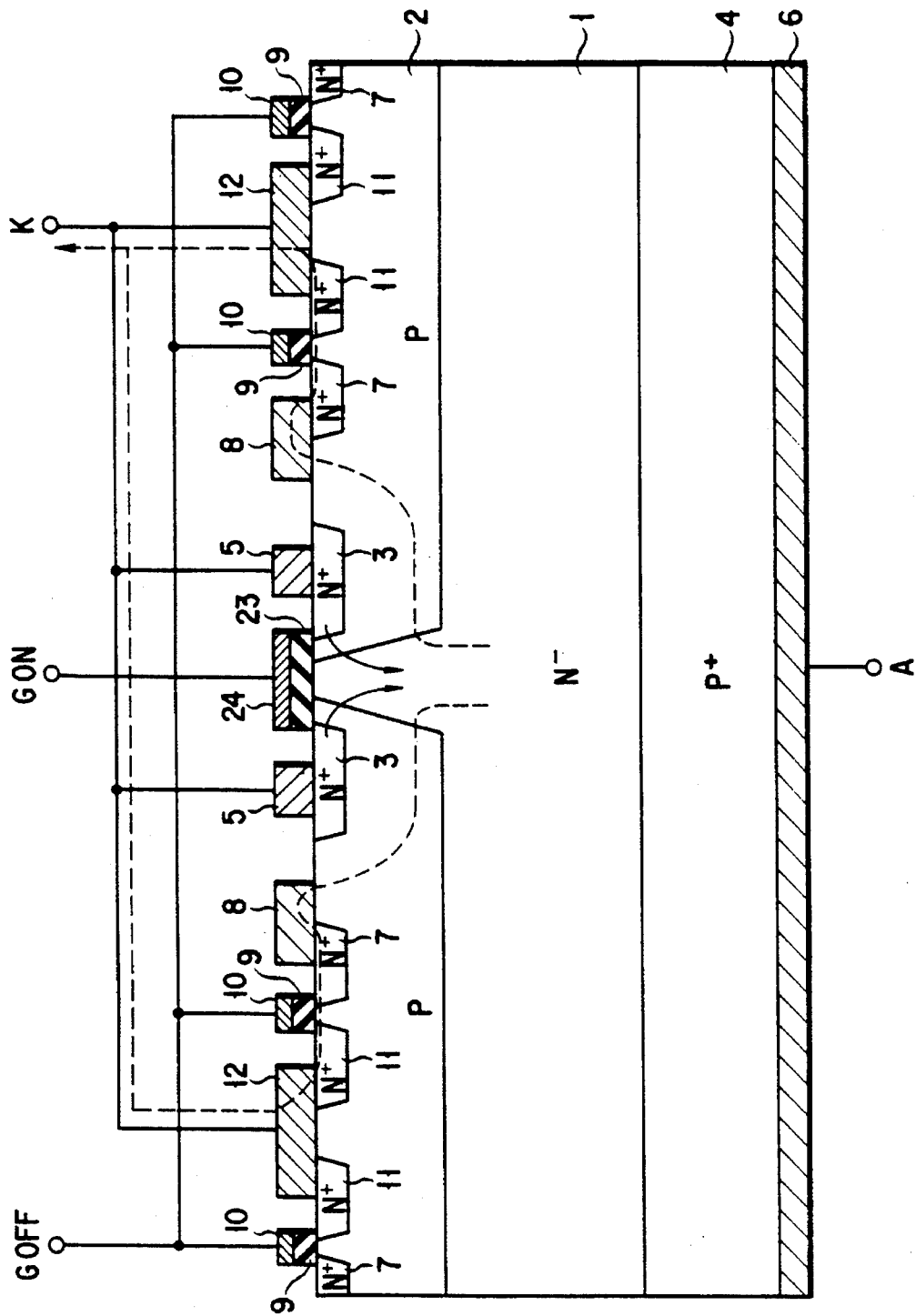

METHOD OF OPERATING THYRISTOR WITH INSULATED GATES

CROSS-REFERENCE TO THE RELATED APPLICATION

This is a Continuation of application Ser. No. 08/164,756 filed on Dec. 10, 1993, now allowed U.S. Pat. No. 5,428,228 which is a Continuation-In-Part of application Ser. No. 07/896,422 filed on Jun. 10, 1992, now U.S. Pat. No. 5,315,134.

BACKGROUND OF THE INVENTION

1. Field of the Invention

The present invention relates to a thyristor with insulated gates.

2. Description of the Related Art

A thyristor of the voltage control type using an insulted gate electrode (MOS gate) is suitable for gate driving in a power device with a high breakdown voltage and a large current, since gate driving can be performed by a small current as compared with the thyristor of the current driving type.

FIG. 64 shows the structure of a turn-off insulated gate in the conventional thyristor of the insulated gate type. A p-type base layer 2 is formed on one surface of an n-type base layer 1 having high resistance. An n-type emitter layer 3 is formed in the p-type base layer 2. A p-type emitter layer 4 is formed on the other surface of the n-type base layer 1. A cathode electrode 5 is formed on the n-type emitter layer 3 and an anode electrode 6 is formed on the p-type emitter layer 4.

An n-type drain layer 7 is formed at the position, which is away from the n-type emitter layer 3 at a predetermined distance. A gate electrode 10 is formed on the p-type base layer 2 via a gate insulating film 9, and between the n-type drain layer 7 and the n-type cathode layer 3. The gate electrode 10 is used for turn-off and comprises an n channel MOSFET in which the n-type emitter layer is used as a source. A drain electrode 8 is formed in contact with the p-type base layer 2, and the p-type base layer 2 and the n-type drain layer 7 are short-circuited by the drain electrode 8.

A gate electrode for turn-on (not shown) is formed at a peripheral portion of the p-type base layer 2, which is selectively diffused, and comprises a MOS structure similar to the gate electrode for turn-off.

According to the above-structured thyristor of the insulated gate type, a positive voltage with respect to the cathode is applied to the insulated gate electrode 10 at the time of turn-off. Thereby, an n-channel is formed under the gate electrode 10. Then, a part of hole current, which has directly flowed into the n-type emitter layer 3 from the p-type base layer 2, changes its passages and flows into the drain electrode 8 as shown by a broken line, and passes through the n-type drain layer 7 and the portion under the gate electrode 10. Thus, the hole current is bypassed to the cathode electrode 5 from the n-type emitter layer 3. By the bypass of the hole current, injection of electrons to the p-type base layer 2 from the n-type emitter layer 3 is stopped, and the device is turned off.

In the conventional thyristor with the insulated gate, there is a problem in that sufficient turn-off capability cannot be obtained. This is due to resistance of a hole current bypass passage shown in FIG. 64. As resistance of the hole current bypass passage, there are mainly horizontal resistance of the p-type base layer 2 and on-resistance of the channel under the insulated gate electrode 10. If voltage drop, which is determined by these resistance and the bypass current, becomes higher than a built-in voltage between the n-type emitter layer 3 and the p-type base layer 2, injection of electrons from the n-type emitter layer 3 is not stopped. Due to this, if the main current increases, the device cannot be turned off.

As described above, in a conventional thyristor with insulated gates, a large turn-off current cannot be obtained.

SUMMARY OF THE INVENTION

It is, therefore, an object of the present invention to provide a method of operating a thyristor with insulated gates, which can obtain a larger turn-off current.

According to a first aspect of the present invention, there is provided a method of operating a thyristor with insulated gates, the thyristor including: a base layer of a first conductivity type; a base layer of a second conductivity type which is in contact with the base layer of the first conductivity type; an emitter layer of the second conductivity type formed to be in contact with the base layer of the first conductivity type and not to be in contact with the base layer of the second conductivity type; an emitter layer of the first conductivity type formed to be in contact with the base layer of the second conductivity type and not to be in contact with the base layer of the first conductivity type; a drain layer of the first conductivity type short-circuited with the base layer of the second conductivity type via a drain electrode; a source layer of the first conductivity type connected to the drain layer of the first conductivity type via a first interposed region of the second conductivity type; a first gate electrode formed via a gate insulating film on a second interposed region of the second conductivity type as a portion of the base layer of the second conductivity type between the base layer of the first conductivity type and the emitter layer of the first conductivity type; a second gate electrode formed via a gate insulating film on the first interposed region between the drain layer of the first conductivity type and the source layer of the first conductivity type; a first main electrode connected to the emitter layer of the second conductivity type; and a second main electrode connected to the emitter layer of the first conductivity type and the source layer of the first conductivity type, the method comprising the steps of: turning on the thyristor; applying a first voltage to the first gate electrode to reverse a polarity of the second interposed region, thereby electrically connecting the base layer of the first conductivity type to the emitter layer of the first conductivity type; applying a second voltage to the second gate electrode to reverse a polarity of the first interposed region, thereby electrically connecting the drain layer of the first conductivity type to the source layer of the first conductivity type while the first voltage is applied to the first gate electrode; and stopping application of the first voltage to the first gate electrode after application of the second voltage continues for a predetermined period of time, thereby turning off the thyristor.

According to a second aspect of the present invention, there is provided a method of operating a thyristor with insulated gates, the thyristor including: a base layer of a first conductivity type; a base layer of a second conductivity type which is in contact with the base layer of the first conductivity type; an emitter layer of the second conductivity type formed to be in contact with the base layer of the first conductivity type and not to be in contact with the base layer of the second conductivity type; an emitter layer of the first conductivity type formed to be in contact with the base layer of the second conductivity type and not to be in contact with the base layer of the first conductivity type; a drain layer of the second conductivity type connected to the base layer of the second conductivity type via a first interposed region of the first conductivity type; a first gate electrode formed via a gate insulating film on a second interposed region of the second conductivity type as a portion of the base layer of the second conductivity type between the base layer of the first conductivity type and the emitter layer of the first conductivity type; a second gate electrode formed via a gate insulating film on the first interposed region between the base layer of the second conductivity type and the drain layer of the second conductivity type; a first main electrode connected to the emitter layer of the second conductivity type; and a second main electrode connected to the emitter layer of the first conductivity type and a drain layer of the second conductivity type, the method comprising the steps of: turning on the thyristor; applying a first voltage to the first gate electrode to reverse a polarity of the second interposed region, thereby electrically connecting the base layer of the first conductivity type to the emitter layer of the first conductivity type; applying a second voltage to the second gate electrode to reverse a polarity of the first interposed region, thereby electrically connecting the base layer of the second conductivity type to the drain layer of the second conductivity type while the first voltage is applied to the first gate electrode; and stopping application of the first voltage to the first gate electrode after application of the second voltage continues for a predetermined period of time, thereby turning off the thyristor.

In the structure of a conventional thyristor with insulated gates, since a turn-off MOSFET has an n-type emitter layer as a source layer, a drain electrode into which a hole current flows is formed apart from an emitter layer. In contrast to this, in the thyristor with insulated gates used in the method of the present invention, the n-type source layer and n-type emitter layer of the turn-off MOSFET are isolated from each other, while the drain layer and the drain electrode are formed near the n-type emitter layer. In addition, the drain electrode into which a hole current flows at the time of turn-off is formed near the n-type emitter layer to be in direct contact with the p-type base layer.

With this arrangement, in the thyristor with insulated gates used in the method of the present invention, no horizontal resistance of the p-type base layer is generated in the bypass of a hole current at the time of turn-off. Furthermore, in the method of the present invention, since the turn-on gate is set in an ON state at the time of turn-off, an electron current flows, and a current concentration phenomenon due to a reduction in conducting region of the electron current as in a normal case does not occur.

As compared with the prior art, therefore, a large ON current can flow, and even a large current can be turned off.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view of a thyristor with insulated gates according to the present invention;

FIG. 2 is a timing chart showing a method of operating the thyristor of the present invention;

FIG. 8 shows the layout of another thyristor on a cathode side according to the present invention;

FIG. 9 is a cross sectional view taken along line IX—IX of FIG. 8;

FIG. 12 is a cross sectional view taken along line XII—XII FIG. 11;

FIG. 13 is a cross sectional view taken along line XIII—XIII of FIG. 11;

FIG. 14 shows the layout of another thyristor on a cathode side according to the present invention;

FIG. 15 is a cross sectional view taken along line XV—XV of FIG. 14;

FIG. 18 is a cross sectional view taken along line XVIII—XVIII of FIG. 17;

FIG. 19 is a cross sectional view taken along line XIX—XIX of FIG. 17;

FIG. 24 is a plan view of the thyristor in which the turn-off MOSFET region is isolated from the thyristor region;

FIG. 25 is a sectional view of a main part of a thyristor according to another embodiment of the present invention;

FIG. 26 is a sectional view of a main part of a thyristor obtained by modifying the thyristor in FIG. 25;

FIG. 35 is a sectional view of a thyristor in which a p-type well layer having a low impurity concentration is formed between two p-type base layers;

FIG. 36 is a sectional view of a thyristor in which two p-type base layers are isolated from each other via an insulating layer buried in a trench;

FIG. 37 is a sectional view of a thyristor in which an n-type well layer is provided for a single p-type base layer;

FIG. 38 is a sectional view of a thyristor in which a p-type source layer is formed in an n-type well layer formed in a p-type base layer between an n-type emitter layer and a cathode electrode;

FIG. 41 is a sectional view of a thyristor in which a turn-on MOSFET and a turn-off MOSFET are formed in the same semiconductor region which has undergone dielectric isolation;

FIG. 42 is a sectional view of a thyristor in which a turn-on MOSFET and a turn-off MOSFET are formed in different semiconductor regions which have undergone dielectric isolation;

FIG. 43 is a sectional view of a thyristor obtained by modifying the thyristor shown in FIG. 42;

FIG. 44 is a sectional view of a thyristor having three MOSFETs;

FIG. 45 is a sectional view of a thyristor obtained by modifying the thyristor shown in FIG. 44;

FIG. 46 is a sectional view showing an example in which the thyristor shown in FIG. 41 is applied to a vertical type thyristor;

FIG. 47 is a sectional view of a thyristor according to still another embodiment of the present invention;

FIGS. 52A to 52C are sectional views sequentially showing the steps in a manufacturing process of the thyristor shown in FIG. 51;

FIGS. 53A to 53C are sectional views sequentially showing the steps following the step in FIG. 52C in the manufacturing process of the thyristor in FIG. 51;

FIGS. 58A and 58B are sectional views, each showing a thyristor in which a hole discharge MOSFET is formed as a vertical type MOSFET in a trench;

FIGS. 59A and 59B are sectional views, each showing a thyristor in which an electron injection MOSFET is formed as a vertical type MOSFET;

FIG. 61 is a sectional view of a thyristor in which a hole discharge MOSFET is formed as a vertical type MOSFET in a trench;

FIG. 62 is a perspective view of a thyristor using an electron injection MOSFET for turning on and off a channel current in the vertical direction and a hole discharge MOSFET for using a channel current in the horizontal direction;

FIGS. 63A and 63B are timing charts showing a method of operating a thyristor;

FIG. 65 shows the layout of another thyristor with insulated gates according to the present invention;

FIG. 66 is a sectional view taken along a line LXVI—LXVI of FIG. 65;

DETAILED DESCRIPTION OF THE PREFERRED EMBODIMENTS

The embodiments of the present invention will be explained with reference to the drawings.

Figure 64:
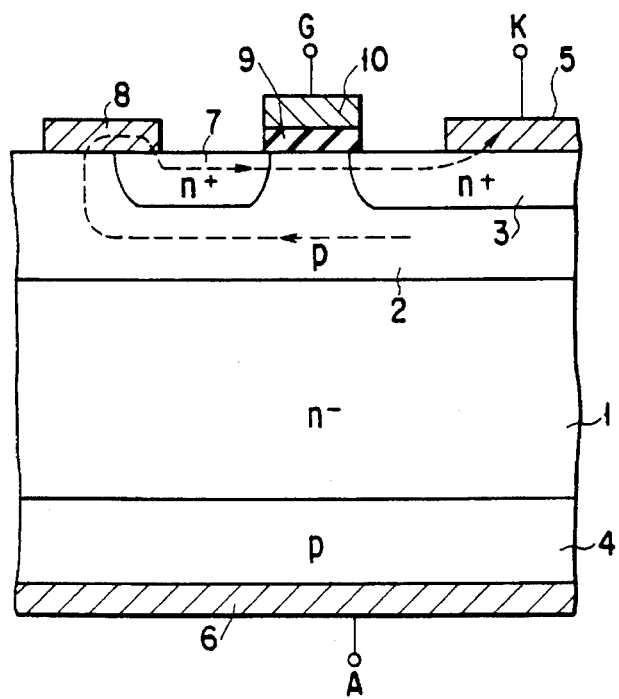
FIG. 64 is a sectional view of a conventional thyristor with insulated gates.

FIG. 1 shows the structure of a thyristor with insulated gates, which is operated by a method according to the present invention. The same reference numerals as the prior art of FIG. 64 are added to the portions corresponding to those of the prior art of FIG. 64, and the detail explanation will be omitted. As is obvious from the comparison between the first embodiment of the present invention and the prior art of FIG. 64, an drain electrode 8 is formed to be in contact with a p-type base layer 2 at the position adjacent to an n-type emitter layer 3 according to this embodiment. An n-type drain layer 7 is short-circuited with the p-type base layer 2 by the drain electrode 8.

An n-type source layer 11 is formed at the position, which is a away from the n-type drain layer 7 at a predetermined distance. An insulated gate electrode 10 is formed between the drain layer 7 and the source layer 11. A source electrode 12 is integrally formed with and electrically connected to the cathode electrode 5. According to this embodiment, similar to the drain electrode 8, the source electrode 12 is formed to be in contact with the p-type base layer 2 as well as the source layer 11. The source electrode 12 may be formed to be in contact with only the source layer 11.

In addition, a gate electrode 24 is formed on a surface portion of the p-type base layer 2 between the n-type emitter layer 3 and an n-type base layer 1 via a gate insulating film 23, thus forming an n-channel MOSFET.

The thyristor with insulated gates shown in FIG. 1 is turned off by a gate operation method based on the timing chart indicated by solid lines in FIG. 2. More specifically, when a time $\Delta t_1$ has elapsed after a positive voltage with respect to the cathode is applied to the turn-on insulated gate electrode 24 to turn on the gate electrode 24, a positive voltage with respect to the cathode is applied to the gate electrode 10. Alternatively, a positive voltage may be kept applied to the turn-on insulated gate electrode 24 during the interval from a turn-on operation to a turn-off operation, as indicated by a broken line in FIG. 2.

Referring to FIG. 1, an electron current flowing when the gate electrode 10 is turn on is indicated by a solid line, and the bypass of a hole current is indicated by a broken line. As shown in FIG. 1, the hole current flows from a portion near the n-type emitter layer 3 into the drain electrode 8 and is discharged to the source electrode 12, i.e., the cathode 5, via a channel under the gate electrode 10.

A transistor having such a current path is equivalent to a so-called IGBT (insulated gate bipolar transistor). For this reason, when the turn-on gate electrode 24 is turned off a predetermined time $\Delta t_2$ after a positive voltage is applied to the gate electrode 10, the injection of electrons is stopped to turn off the thyristor. At this time, in the structure shown in FIG. 1, the horizontal resistance of the p-type base layer 2, based on the turn-off MOSFET, is not present in the bypass of the hole current, as is apparent from the comparison with the conventional structure shown in FIG. 64. In addition, at the time of turn-off, a uniform electron current flows, and a decrease in turn-off current due to a reduction in conducting region of the electron current does not occur, unlike a turn-off operation performed by the conventional operation method.

The time $\Delta t_2$ is preferably set to be about 1 to 20 μsec. If the time is longer than this time range, the ON voltage of the device increases, resulting in an increase in loss. In contrast to this, if the time is shorter than this time range, the effect of the present invention cannot be obtained.

Figure 3:
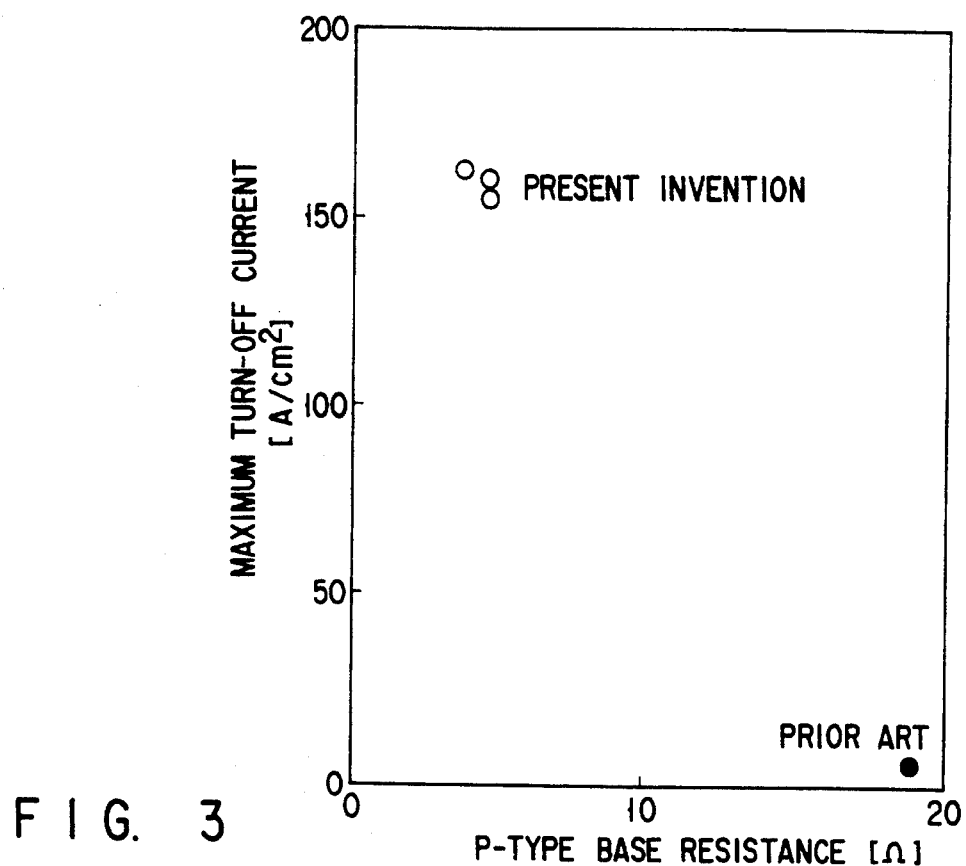
FIG. 3 is a graph showing the comparison between the maximum turn-off current obtained by the method of operating the thyristor of the present invention and that obtained by the conventional method of operating a thyristor with insulated gates.

FIG. 3 shows experiment results indicating the above-described effect. More specifically, as is apparent from FIG. 3, with the method of operating a thyristor with insulated gates according to the present invention, the maximum turn-off current which is 10 or more times that in the conventional operation method can be obtained. Note that when the operation method of the present invention was applied to the conventional thyristor shown in FIG. 64, the maximum turn-off current obtained was about 1.5 times that obtained when the conventional thyristor shown in FIG. 64 was operated by the conventional operation method.

The following are embodiments associated with other thyristor structures to which the above-described operation method of the present invention, used at the time of turn-off, can be applied.

In view of the point that a logic circuit is integrated, a horizontal type thyristor using a semiconductor substrate having a dielectric isolation structure is suitable for a power IC. The present invention can be applied to the such a horizontal type thyristor with insulated gates. The following will explain the embodiment of the horizontal type thyristor with insulated gates. In the following embodiment, the same reference numerals as FIG. 1 are added to the portions corresponding to those of FIG. 1, and the detail explanation will be omitted.

Figure 4:
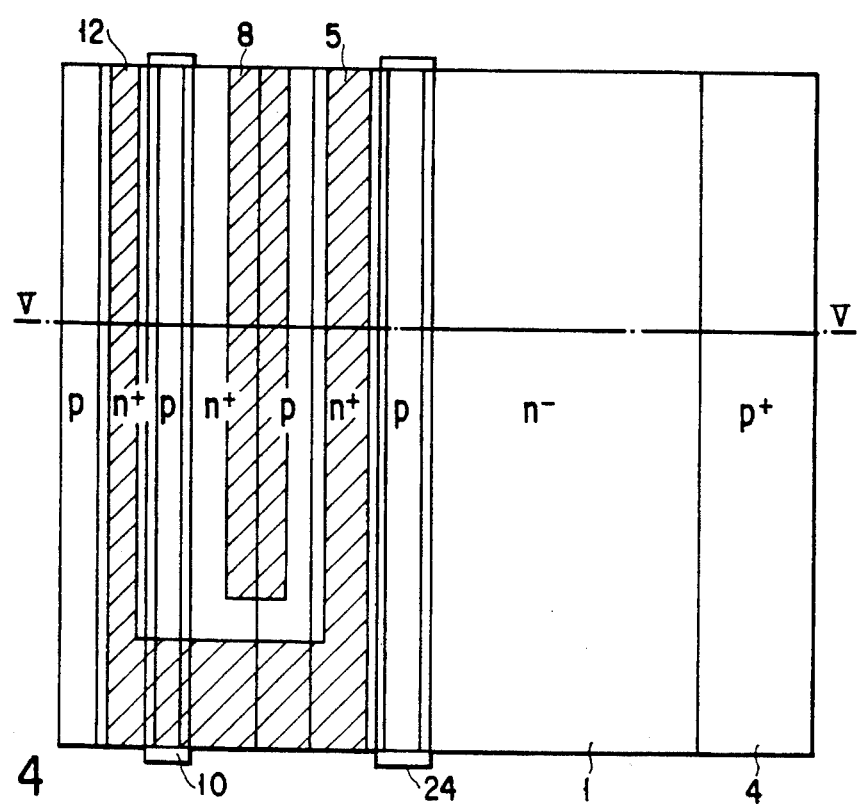
FIG. 4 shows the layout of a horizontal type thyristor on a cathode side according to the present invention.
Figure 5:
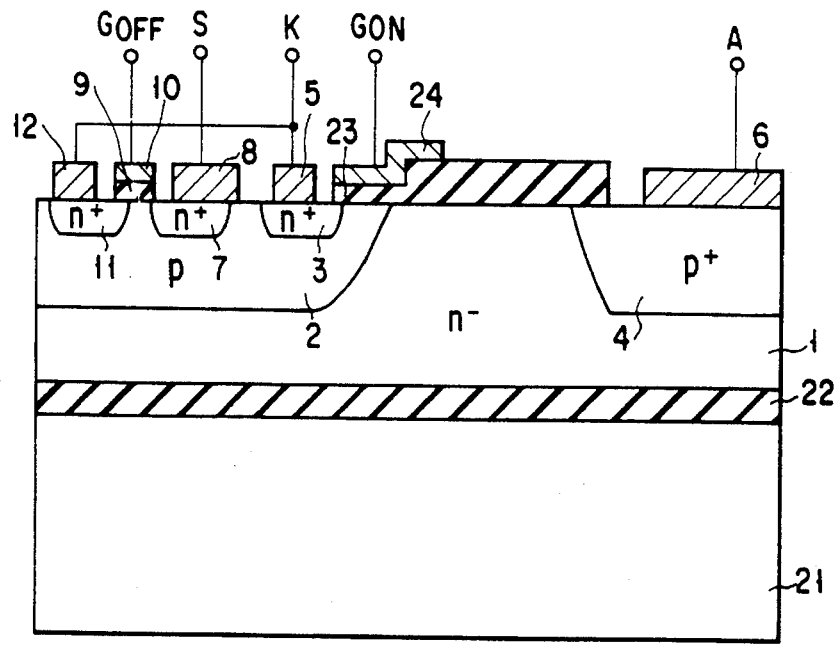
FIG. 5 is a cross sectional view taken along line V—V of FIG. 4.

FIG. 4 shows the layout of another thyristor with insulated gates, which is operated by a method according to the present invention, and FIG. 5 is a cross sectional view taken along line V—V of FIG. 4.

As shown in FIGS. 4 and 5, an n-type base layer 1 is formed on a silicon substrate 21 with an oxide film 22 interposed therebetween. This structure can be obtained by, for example, a technique in which two silicon substrates are directly adhered. A p-type base layer 2 and a p-type emitter layer 4, which are opposite to each other, are formed in a striped form, on the surface of the n-type base layer 1 with a predetermined distance. In the p-type base layer 2, an n-type emitter layer 3 having a stripe pattern, an n-type drain layer 7, and an n-type source layer 11 are formed. A drain 8 is formed in a striped pattern so as to be in contact with the n-type drain layer 7 as well as the p-type base layer 2 at a portion, which is right close to the n-type emitter layer 3. A turn-off insulated gate electrode 10 having a strip pattern is formed between the n-type drain layer 7 and the n-type source layer 11. The cross sectional structure of the turn-off MOSFET is the same as the embodiment of FIG. 1.

A gate electrode 24 is formed in a striped pattern on a region of the p-type base layer 2, which is sandwiched by the n-type emitter layer 3 and the n-type base layer 1, via a gate insulating film 23.

The cathode electrode 5 and the source electrode 12 are integrally formed such that they are coupled to each other at the peripheral portion as shown in FIG. 4.

The thyristor shown in FIGS. 4 and 5 is operated and turned off in the same manner as that of the thyristor shown in FIG. 1.

Similarly, in this embodiment, since the drain electrode 8 is arranged at the position adjacent to the n-type emitter layer 3, the large current can be turned off.

Figure 6:
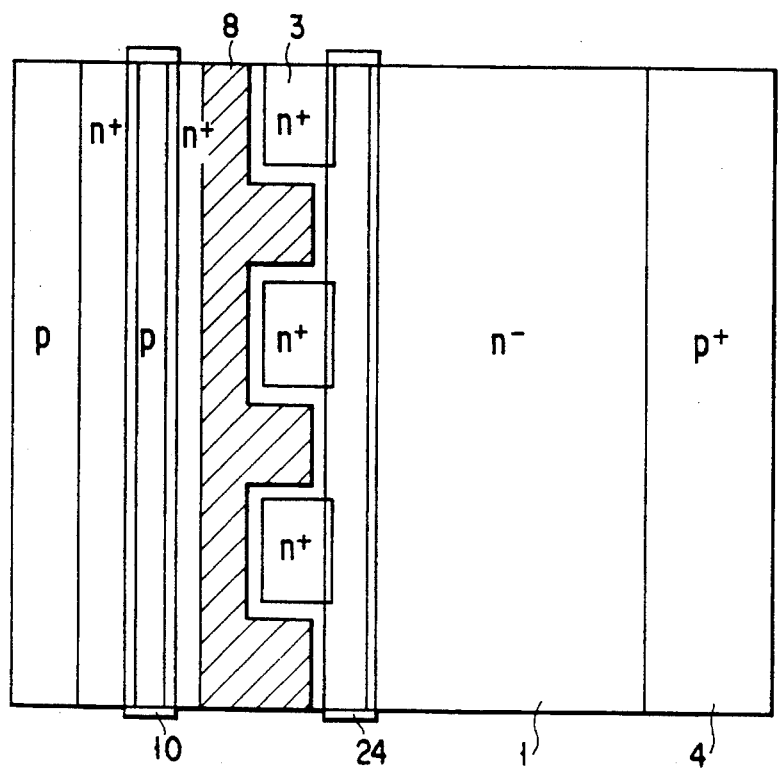
FIG. 6 shows the layout of another thyristor on a cathode side according to the present invention.

FIG. 6 is the layout of another thyristor according to the present invention, in which the embodiment of FIG. 4 is modified. According to this embodiment, the n-type emitter layer 3 is divided into a plurality of portions, and parts of the drain electrode 8 are inserted to divided space regions in the form of a comb, and are brought into contact with the p-type base layer 2.

According to this embodiment, the voltage drop due to the horizontal resistance of the p-type base layer under the n-type emitter layer 3 can be reduced, and a higher turn-off capability can be obtained.

The thyristor shown in FIG. 6 is operated and turned off in the same manner as that of the thyristor shown in FIG. 1.

Figure 7:
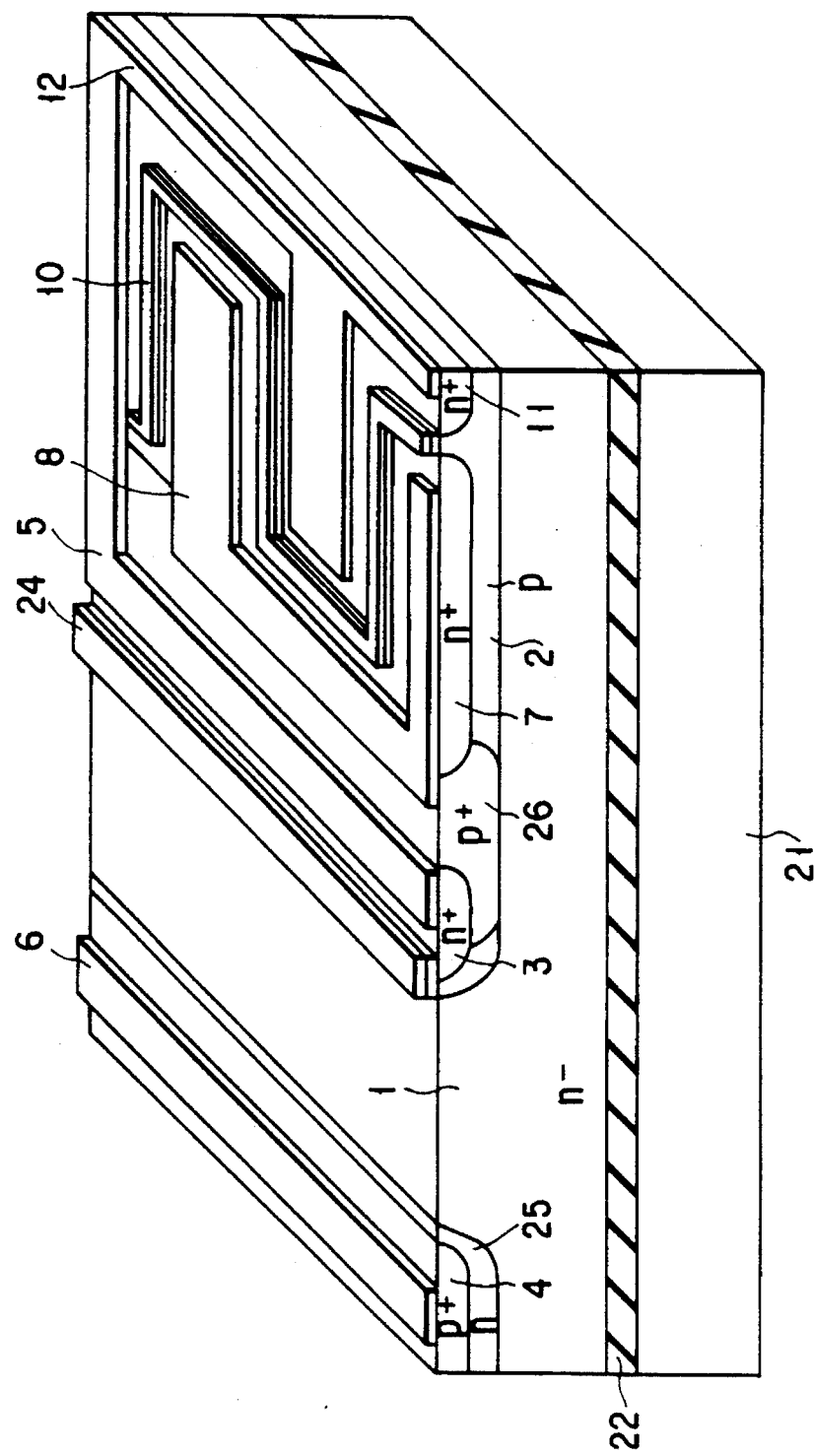
FIG. 7 is a perspective view of another thyristor according to the present invention.

FIG. 7 is a perspective view of the horizontal type thyristor with insulated gates, which is operated by a method according to the present invention. According to this embodiment, the turn off gate electrode 10 is formed in a zig-zag pattern, so that the channel width of the turn-off MOSFET, which is formed of the n-type source layer 11, n-type drain layer 7 and the gate electrode 10, can be sufficiently long and the channel resistance of the MOSFET is reduced. Also, an n-type buffer layer 25 is formed around the p-type emitter layer 4 so as to obtain a high breakdown voltage. A p-type layer 26 having a high impurity concentration is formed between the n-type emitter layer 3 and the n-type drain layer 7 so as to obtain a low resistance.

According to this embodiment, the voltage drop due to the horizontal resistance of the p-type base layer under the n-type emitter layer 3 can be reduced, and a higher turn-off capability can be obtained.

The thyristor shown in FIG. 7 is operated and turned off in the same manner as that of the thyristor shown in FIG. 1.

In the above-mentioned embodiments, the n-type source layer is formed separately from the n-type emitter layer, the hole current flowing from the drain electrode is supplied to the cathode via the MOS transistor and the source layer. The following embodiments explain improvement of the conventional structure in which the n-type emitter layer and the n-type source are used in common.

Figure 10:
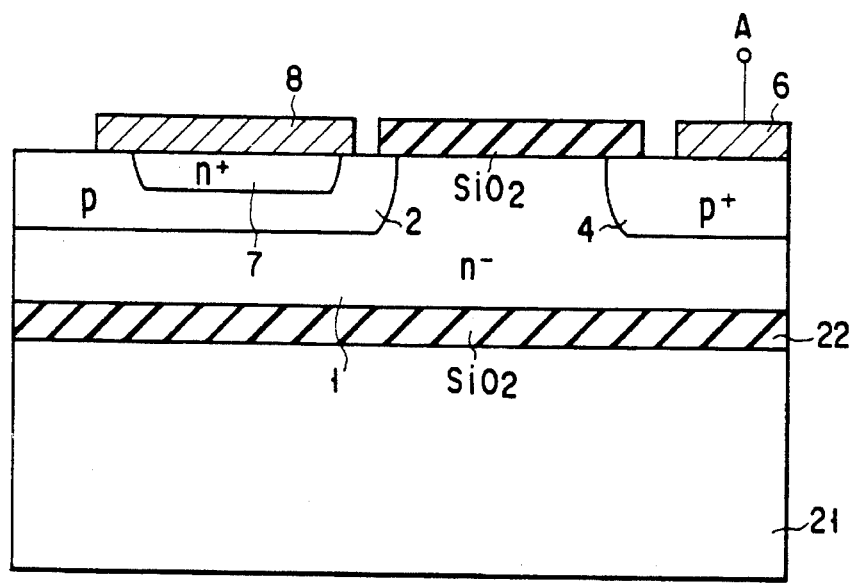
FIG. 10 is a cross sectional view taken along line X—X of FIG. 8.

FIG. 8 shows the layout of another thyristor on a cathode side according to the present invention. FIGS. 9 and 10 are cross sectional views taken along lines IX—IX and X—X of FIG. 8, respectively. Similar to the previous embodiments, the dielectric isolation substrate is used in this embodiment. According to this embodiment, the n-type emitter layer 3 is divided into a plurality of portions in the p-type base layer 2. The n-type drain layer 7 consisting of a plurality of separated portions is formed such that each portion is arranged in the region, which is sandwiched by the respective n-type emitter layers 3. The insulated gate electrode 10 consisting of a plurality of separated portions, which constituting the turn-off MOSFET, is formed such that each portion is arranged between each portion of the n-type drain layer 7 and the n-type emitter layer 3.

The drain electrode 8 is arranged to be parallel with the arrangement of the n-type emitter layer 3 and the turn-off MOSFET. That is, the drain electrode 8 directly comes in contact with the p-type base layer 2 at the position adjacent to the side different from the side on which the turn-off MOSFET of the n-type emitter layer 3 is formed. The striped drain electrode 8 is arranged to cross the n-type drain layer 7 in a branch state, and brought into contact with the n-type drain layer 7.

The turn-on insulated gate electrode 24 consisting of a plurality of separated portions formed on the p-type base layer 24 between the divided n-type emitter layers 3 and the n-type base layer 1. The drain electrode 8 is brought into contact with the p-type base layer 2 even in a divided space region between the portions of the turn-off insulated gate 24.

The thyristor according to this embodiment can be turned off by applying thereto the operation method used for the thyristor shown in FIG. 1. Therefore, the large current can be turned off.

Figure 11:
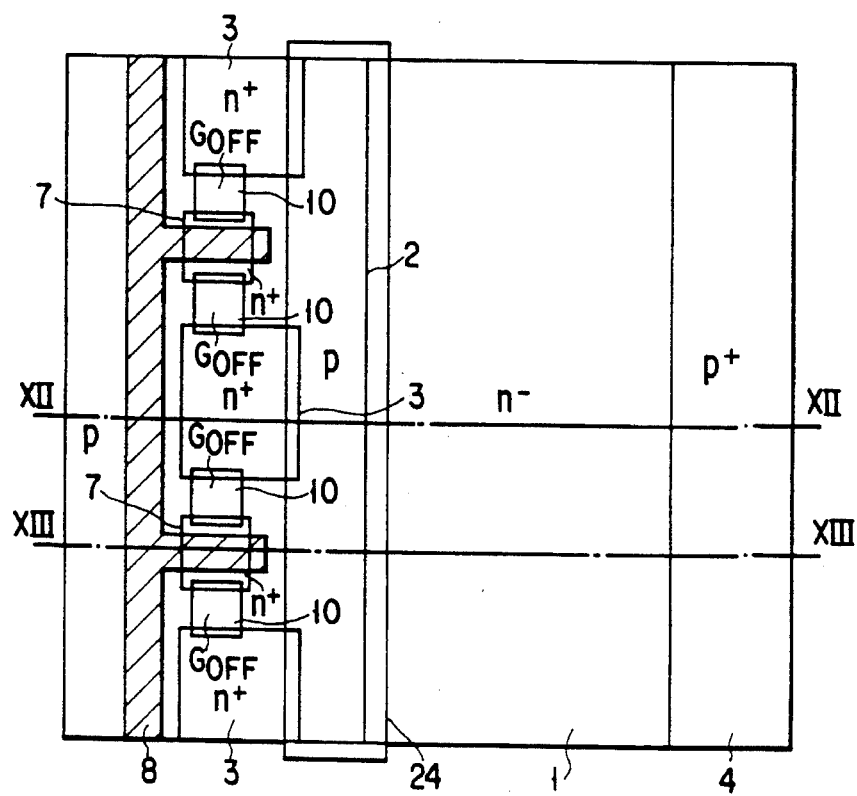
FIG. 11 shows the layout of another thyristor on a cathode side according to the present invention.

FIGS. 11 to 13 show the layout of another thyristor according to the present invention in which the embodiment of FIGS. 8 to 10 is modified, and cross sectional views taken along lines XII—XII and XIII—XIII of FIG. 11, respectively. In this embodiment, the turn-on insulated gate electrode 24 is arranged in a striped form without being divided. According to this embodiment, the same technical advantage as the previous embodiment can be obtained.

Figure 16:
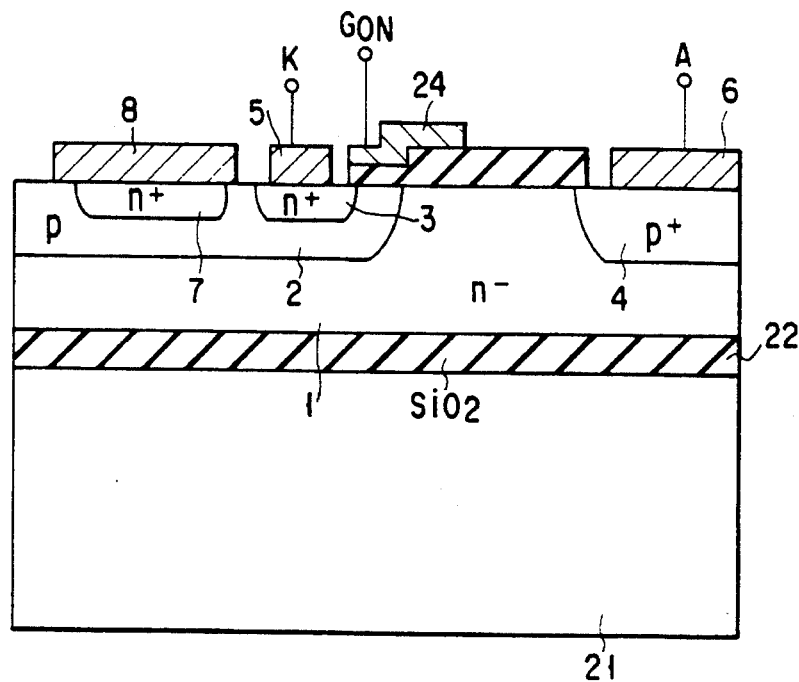
FIG. 16 is a cross sectional view taken along line XVI—XVI of FIG. 14.

FIG. 14 to 16 show the layout of another thyristor according to the present invention in which the embodiment of FIGS. 8 to 10 is modified, and cross sectional views taken along lines XV—XV and XVI—XVI FIG. 14, respectively. In this embodiment, the island n-type emitter layer 3 is not completely divided into portions. Instead, the emitter layer is formed to be continuous at the end portion near the p-type base layer 2. The turn-on insulated gate electrode 24 is formed in a striped pattern at the end portion of the p-type base layer 2.

In the embodiment of FIGS. 8 to 10, since the n-type emitter layers is completely divided into a plurality of portions, the channel width of the turn-on MOSFET is reduced by the division. This cannot be changed even if the gate electrode 24 is formed in the striped pattern as shown in the embodiment of FIGS. 11 to 13. In contrast, according to this embodiment, the channel width of the turn-on MOSFET can be sufficiently largely formed, and the turn-on characteristic can be prevented from being deteriorated when the divided emitter structure is used.

Figure 17:
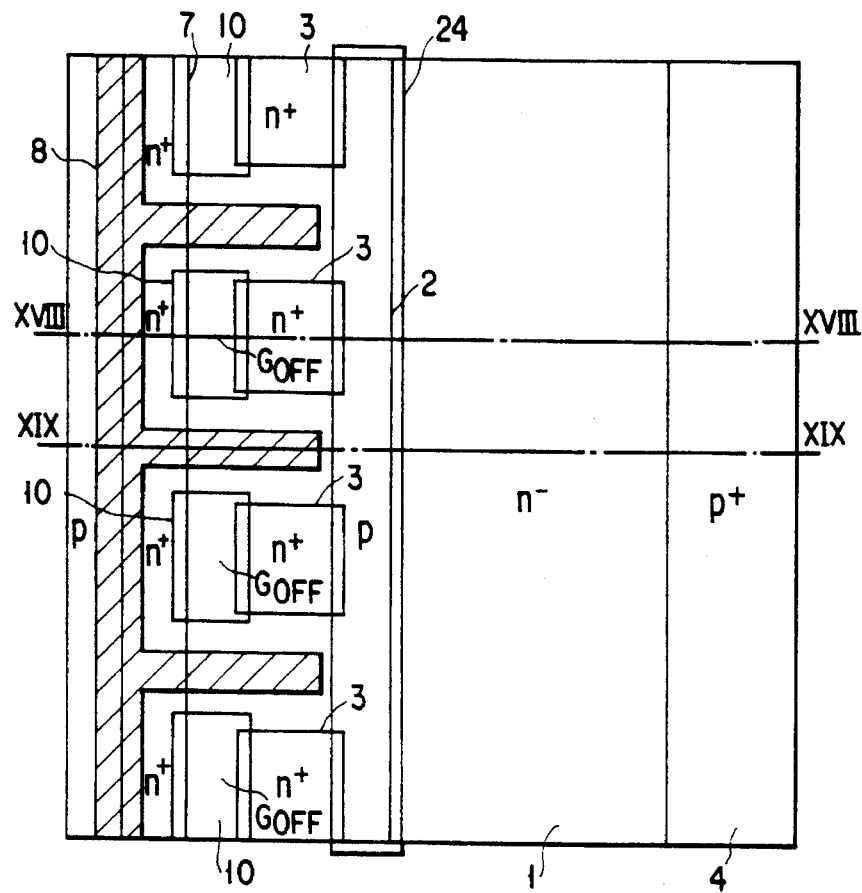
FIG. 17 shows the layout of another thyristor on a cathode side according to the present invention.

FIGS. 17 to 19 show the layout of another thyristor with insulated gates according to the present invention, and cross sectional views taken along lines XVIII—XVIII and XIX—XIX of FIG. 17, respectively. According to this embodiment, in view of the contact position, the relationship between the turn-off MOSFET and the divided n-type emitter layer 3 and the relation-ship between the drain electrode 8 and the p-type base layer 2 are reversed as compared to the embodiment shown in FIGS. 8 to 10. More specifically, the n-type drain layer 7 is formed in a striped form to be parallel with the divided n-type emitter layer 3. The drain electrode 8 contacting the n-type drain layer 7 is formed in a striped form along the the n-type drain layer 7. Also, the drain electrode 8 is inserted into regions between separated portions of the n-type emitter layer 3 such that the drain electrode 8 is branched. Then, the drain electrode 8 is brought into contact with the p-type base layer 2 in the region sandwiched by the separated portions of the n-type emitter layers 3.

According to this embodiment, since the drain electrode 8, which is adjacent to two sides of the n-type emitter layer 3, comes in contact with the p-type base layer 2, a turn-off capability, which is much higher than the previous embodiment, can be obtained.

Figure 20:
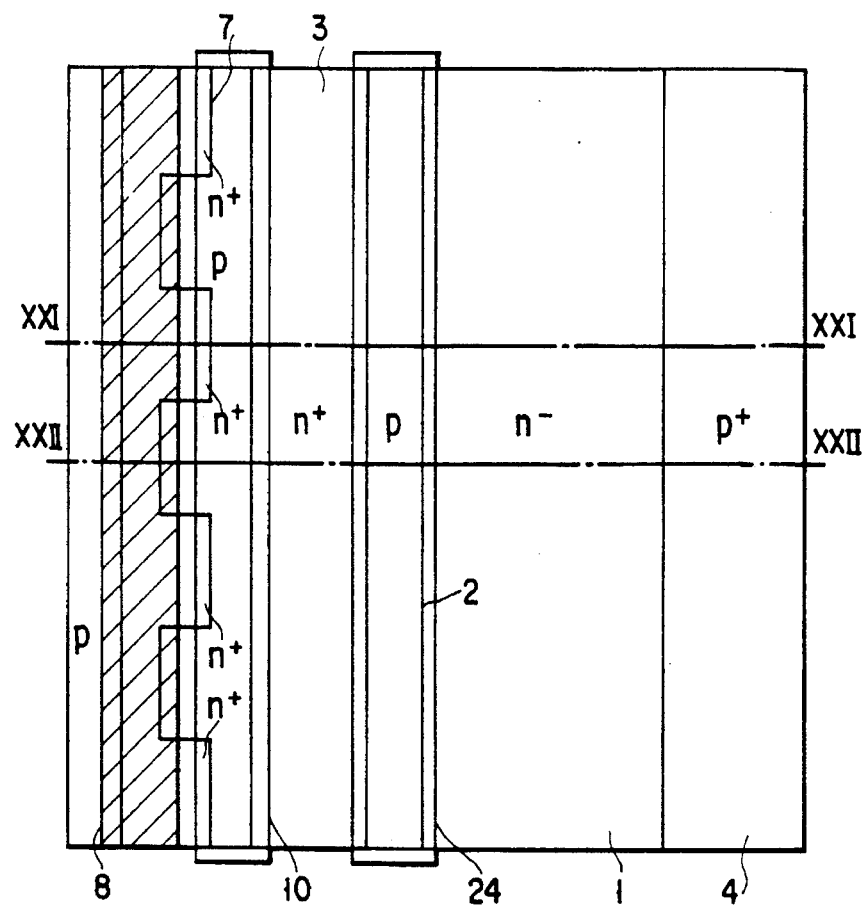
FIG. 20 shows the layout of another thyristor on a cathode side according to the present invention.
Figure 21:
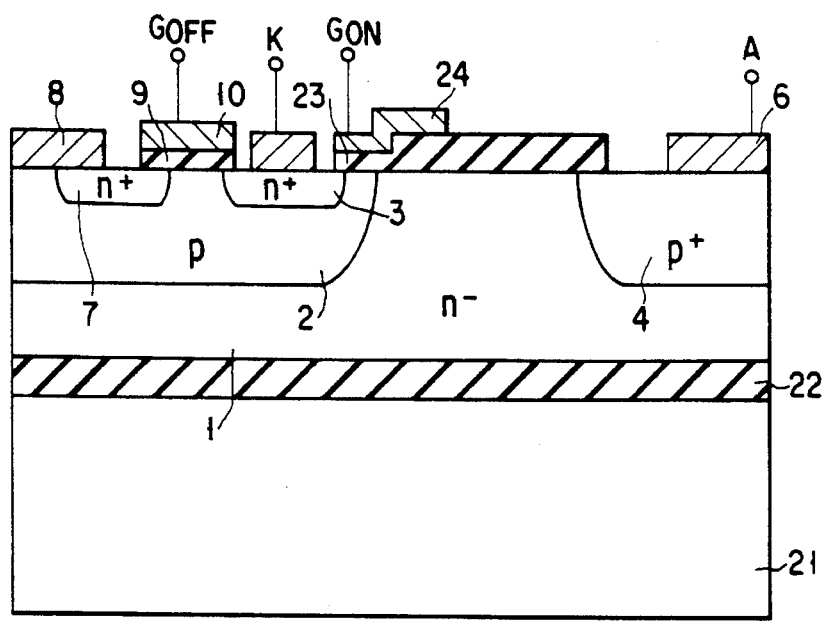
FIG. 21 is a cross sectional view taken along line XXI—XXI of FIG. 20.
Figure 22:
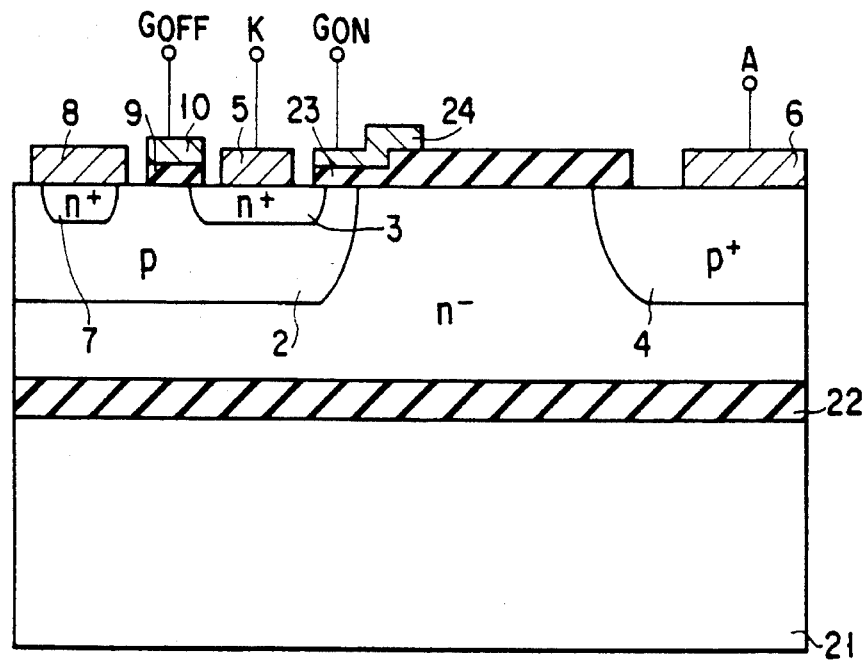
FIG. 22 is a cross sectional view taken along line XXII—XXII of FIG. 20.

FIGS. 20 to 22 show the layout of another thyristor with insulated gates according to the present invention, and cross sectional views taken along lines XXI—XXI and XXII—XXII of FIG. 20, respectively. According to this embodiment, the n-type emitter layer 3 is formed in a striped pattern. The n-type drain layer 7 is formed in the concave and convex pattern on the side of its n-type emitter layer 3. The turn-off insulated gate electrode 10 is formed such that the electrode 10 covers only the convex portions of the n-type drain layer 7, and the turn-off MOSFET is formed in only the convex portions (FIG. 21). In other words, the turn-off MOSFET is substantially formed irregularly.

The convex portions of the n-type drain layer 7 are not covered with the gate electrode 10 (FIG. 22). The drain electrode 8, which is formed in the striped pattern, is brought into contact with the p-type base layer 2 at exposed regions, which are not covered with the gate electrode 10.

According to this embodiment, at the time of turn-off, the hole current flows into the drain electrode 8 from the p-type base layer 2 without horizontally flowing through a portion under the n-type drain layer 7 where no turn-off MOSFET is substantially formed. Therefore, even in this embodiment, the hole current can flow without generating large voltage drop at the time of turn off, and a high turn-off capability can be obtained.

Figure 23:
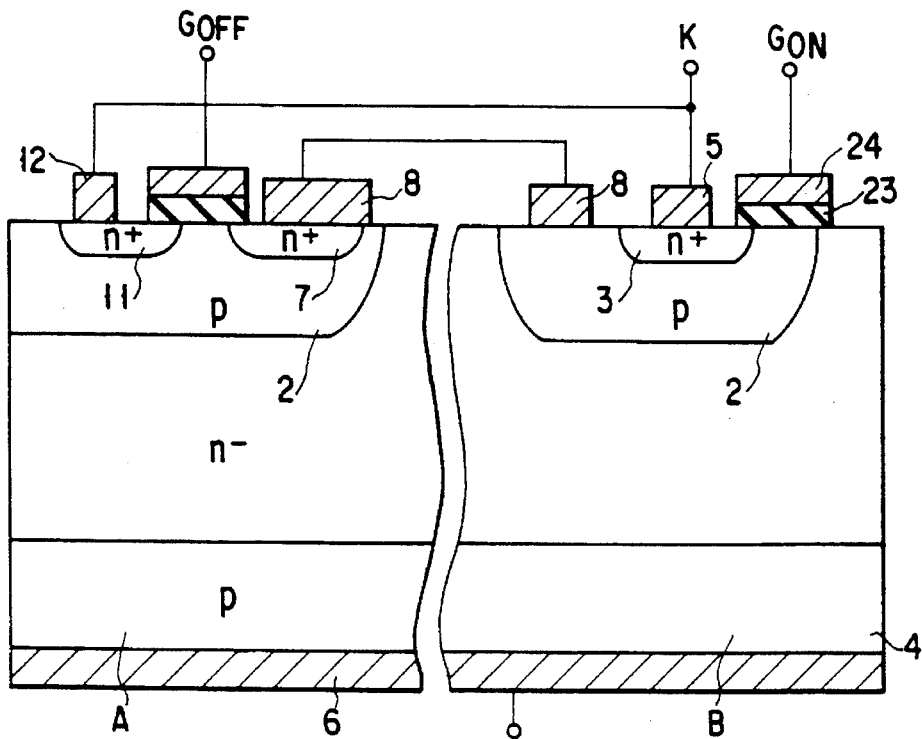
FIG. 23 is a sectional view of a thyristor in which a turn-off MOSFET region is isolated from a thyristor region.

FIGS. 23 and 24 are sectional and plan views, respectively, showing a thyristor with insulated gates according to another embodiment of the present invention. In this embodiment, the turn-off MOSFET region (region A) and the thyristor region (region B) shown in the first embodiment and the like are isolated from each other. As shown in FIG. 24, the thyristor according to this embodiment is characterized in that a region A is formed around a region B to surround it. With this structure, integration of an element is facilitated. Note that even if the positions of the regions A and B are reversed, or another arrangement, e.g., an arrangement in which the regions A and B are formed separately in left and right portions, is employed, the same effect as described above can be obtained. In addition, one pellet may be divided into regions, and each region may be divided into regions A and B.

An embodiment in which an n-type semiconductor layer is formed thin to increase the turn-off speed will be described next.

FIG. 25 is a sectional view showing a main part of a horizontal type thyristor with insulated gates according to another embodiment of the present invention. A p-type base layer 2 and a p-type emitter layer 4 are formed in the surface of an n-type semiconductor layer 1. An n-type emitter layer 3 is formed in the p-type base layer 2. A cathode electrode 5 is formed on the n-type emitter layer 3, and an anode electrode 6 is formed on the p-type emitter layer 4.

An n-type drain layer 7 is formed at a position separated from the n-type emitter layer 3 in the p-type base layer 2 by a predetermined distance. A drain electrode 8 is formed to be in contact with both an n-type drain layer 7 and the p-type base layer 2. The n-type drain layer 7 and the p-type base layer 2 are short-circuited with each other via the drain electrode 8. A gate electrode 10 is formed on the p-type base layer 2 between the n-type drain layer 7 and the n-type emitter layer 3 via a gate insulating film 9. This gate electrode 10 is for turn-off, and an n-channel MOSFET having the n-type emitter layer 3 as a source is formed.

The n-type semiconductor layer 1 is isolated from a substrate 21 via an insulating film 22. The thickness of the n-type semiconductor layer 1 is limited to 25 μm or less, and preferably 10 μm or less.

Although a turn-on mechanism is not shown in the embodiment in FIG. 25, if, for example, a MOS gate is locally formed on a peripheral portion of the p-type base layer 2 which is selectively formed by diffusion, and a positive voltage is applied to the MOS gate to form an n-type channel connecting the n-type emitter layer 3 to the n-type semiconductor layer 1, the thyristor can be turned on. At this time, as electrons flow from the n-type semiconductor layer 1 into the p-type emitter layer 4, holes are injected from the p-type emitter layer 4 into the n-type semiconductor layer 1. As holes flow from the p-type base layer 2 into the n-type emitter layer 3, electrons are injected from the n-type emitter layer 3 into the p-type base layer 2, thus operating the thyristor.

A turn-off operation is performed as follows. When a positive voltage with respect to the cathode is applied to the gate electrode 10, an n-type channel is formed under the gate electrode 10. As a result, part of a hole current directly flowing from the p-type base layer 2 into the n-type emitter layer 3 flows in the bypass indicated by a broken line FIG. 25. Owing to this bypassing of the hole current, the injection of electrons from the n-type emitter layer 3 into the p-type base layer 2 is stopped to turn off the thyristor.

In the thyristor with insulated gates according to this embodiment, since the n-type semiconductor layer 1 is thin, the number of carriers stored during an ON period is small.

For this reason, the turn-off speed is high, and the turn-off loss is small.

FIG. 26 is a sectional view showing a main part of a thyristor with insulated gates based on the embodiment shown in FIG. 25 and obtained by selectively forming a p-type base layer 2 on the surface of an n-type semiconductor layer 1, and forming a turn-on gate electrode 24 on a portion of the end portion of the p-type base layer 2 via a gate insulating film 23. The structure of this embodiment is the same as that of the embodiment shown in FIG. 25 except for the turn-on gate.

In this device, a positive voltage with respect to the cathode is applied to the gate electrode 24 with a gate electrode 10 being set at a zero or negative bias to form an n-type channel under the gate electrode 24 so as to connect a n-type emitter layer 3 to a n-type semiconductor layer 1. With this operation, the thyristor is turned on. In contrast to this, by applying a positive voltage with respect to the cathode to the gate electrode 10 with the gate electrode 24 being set at a zero or negative bias, the thyristor can be turned off, similar to the embodiment shown in FIG. 25. In this embodiment, however, the thyristor can be turned off by the same operation method as that of the first embodiment, and a high turn-off capability can be obtained.

In the thyristor with insulated gates of this embodiment, the n-type semiconductor layer 1 is also isolated from a substrate 21 via an insulating film 22, and is formed thin, so that the number of carriers during an ON period is small. Therefore, the turn-off speed is high, and the turn-off loss is small.

Figure 27:
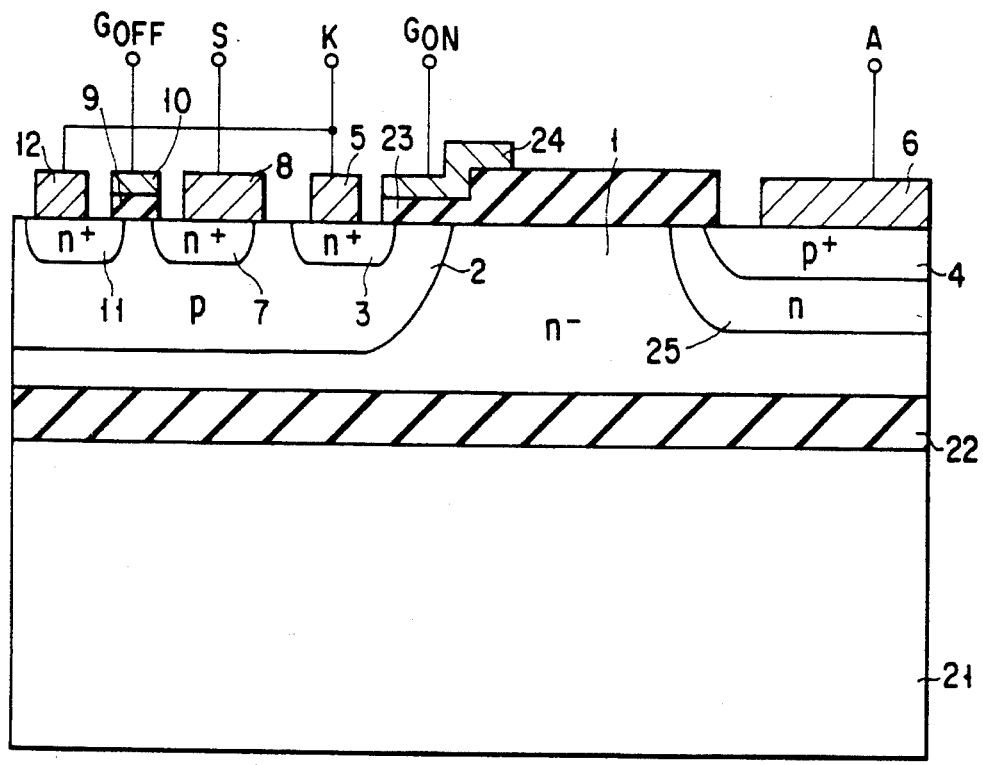
FIG. 27 is a sectional view of a thyristor obtained by modifying the thyristor shown in FIG. 5.

FIG. 27 is a sectional view of a thyristor with insulated gates obtained by modifying the thyristor shown in FIGS. 25 and 26. In this device, in order to prevent punch-through and increase the breakdown voltage, an n-type buffer-layer-25 is formed around a p-type emitter layer 4. This thyristor is operated by the same operation method as that of the first embodiment shown in FIG. 1. In this modification, by forming a thin n-type semiconductor layer 1, a thyristor with insulated gates which has a high turn-off speed can be obtained.

Figure 28:
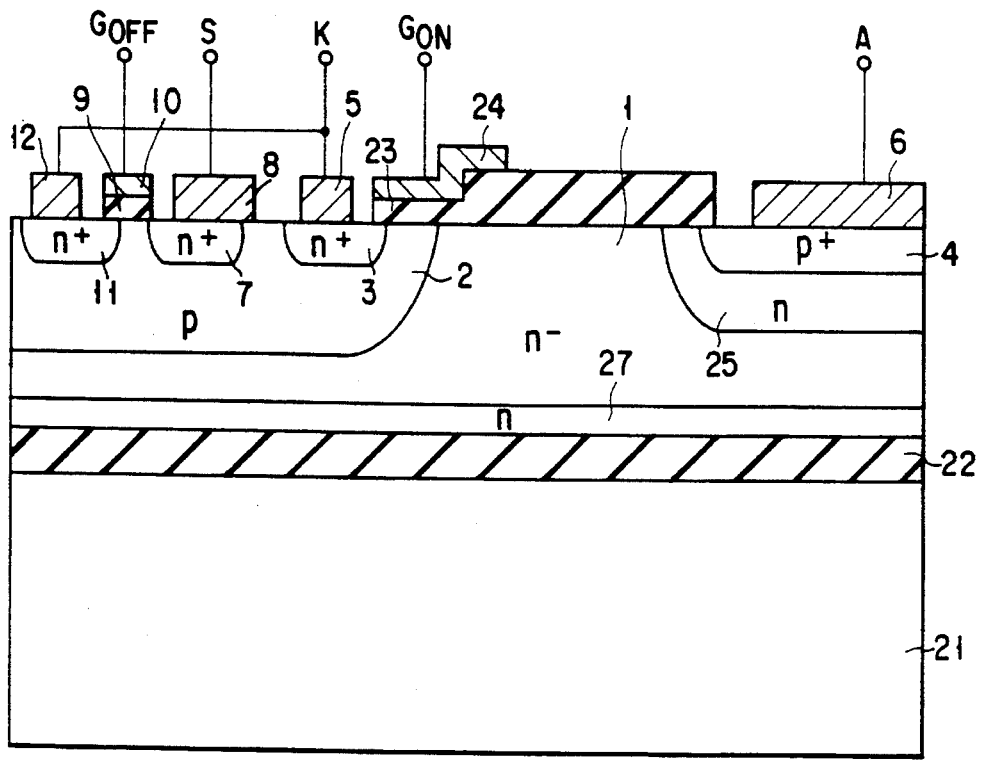
FIG. 28 is a sectional view of a thyristor obtained by modifying the thyristor shown in FIG. 27.

FIG. 28 shows a thyristor with insulated gates which is obtained by modifying the thyristor shown in FIG. 27. In this device, an n-type layer 27 having an impurity concentration higher than that of an n-type semiconductor layer 1 is formed on its bottom portion. In general, as the thickness of the n-type semiconductor layer 1 decreases, the intensity of the vertical component of an electric field under the anode increases at the time of application of a voltage, leading to a decrease in breakdown voltage. In the thyristor shown in FIG. 28, a high breakdown voltage is maintained because the electric field in the semiconductor layer is reduced owing to spatial charges produced when the n-type layer 27 is depleted. In this case, the electric field in an insulating film 22 increases instead. This thyristor is operated by the same method as that of the embodiment shown in FIG. 1.

Note that the technique of obtaining a high breakdown voltage by forming an n-type buffer layer 25 around a p-type emitter layer 4 or forming the n-type layer 27 on the bottom portion of the n-type semiconductor layer 1 can be applied to the embodiments shown in FIGS. 4 to 26.

Figure 29:
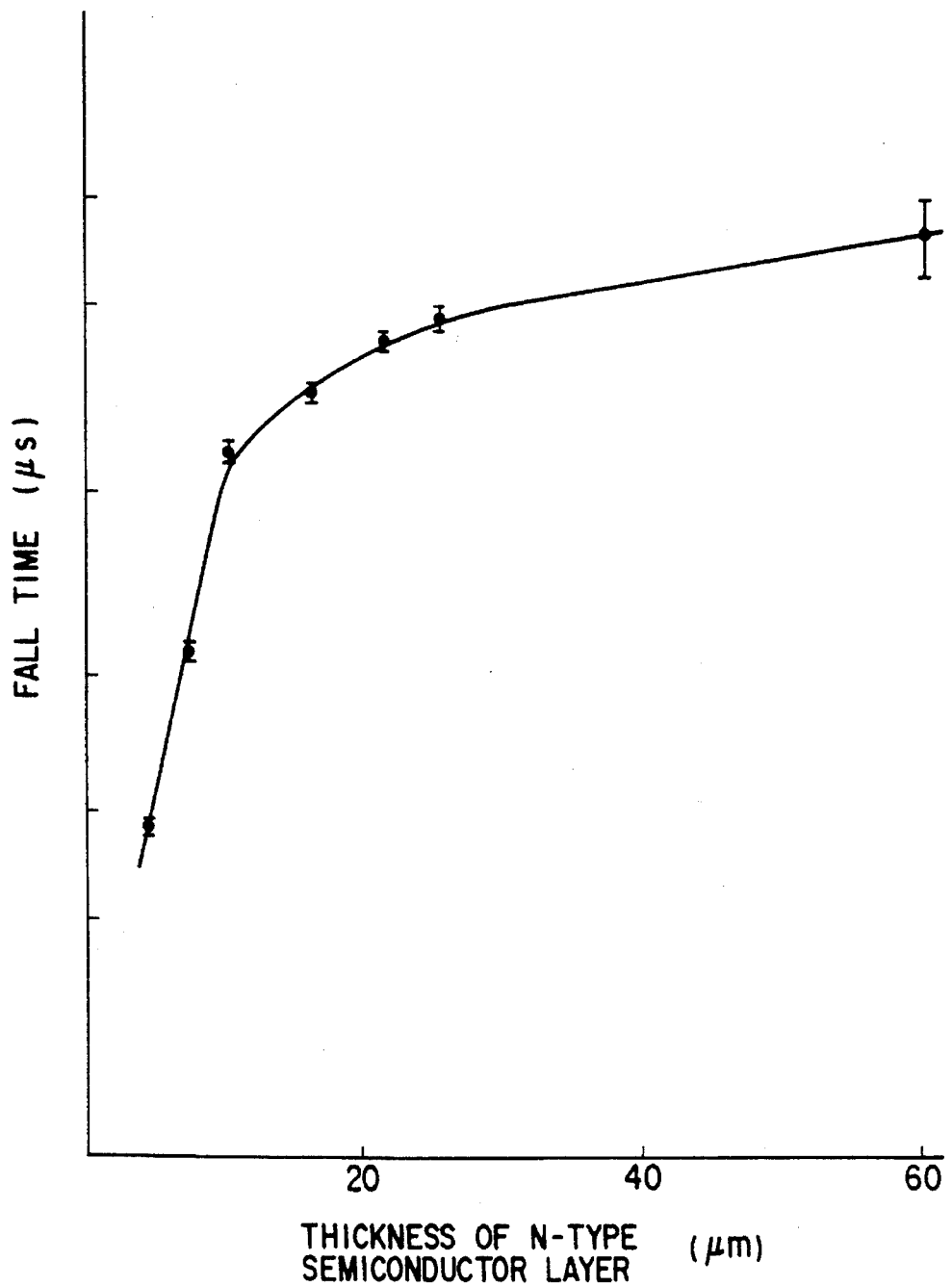
FIG. 29 is a graph showing the relationship between the thickness of an n-type semiconductor layer of a thyristor having the structure shown in FIG. 27 and the fall time in a turn-off operation.

FIG. 29 shows the relationship between the thickness of the n-type semiconductor layer 1 of the thyristor in FIG. 27 and the fall time in a turn-off operation. It is apparent from FIG. 29 that as the n-type semiconductor layer 1 becomes thinner, the turn-off speed increases. The thickness of the n-type semiconductor layer 1 is preferably 25 μm or less, and more preferably 10 µm or less. Note that in the horizontal type thyristors shown in FIGS. 4 to 28, other than the thyristor in FIG. 27, the thickness of the n-type semiconductor layer 1 is preferably 25 µm or less, and more preferably 10 µm or less, because the number of carriers stored during an ON period is related to the turn-off speed according to the same principle as described above.

Figure 30:
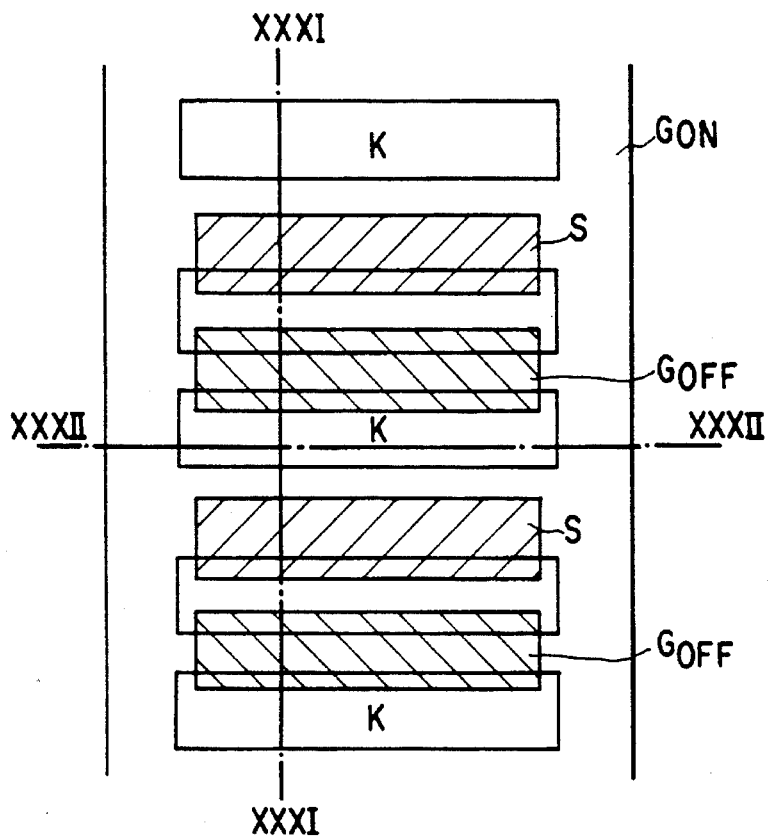
FIG. 30 is a plan view showing a plurality of thyristors which are continuously formed.
Figure 31:
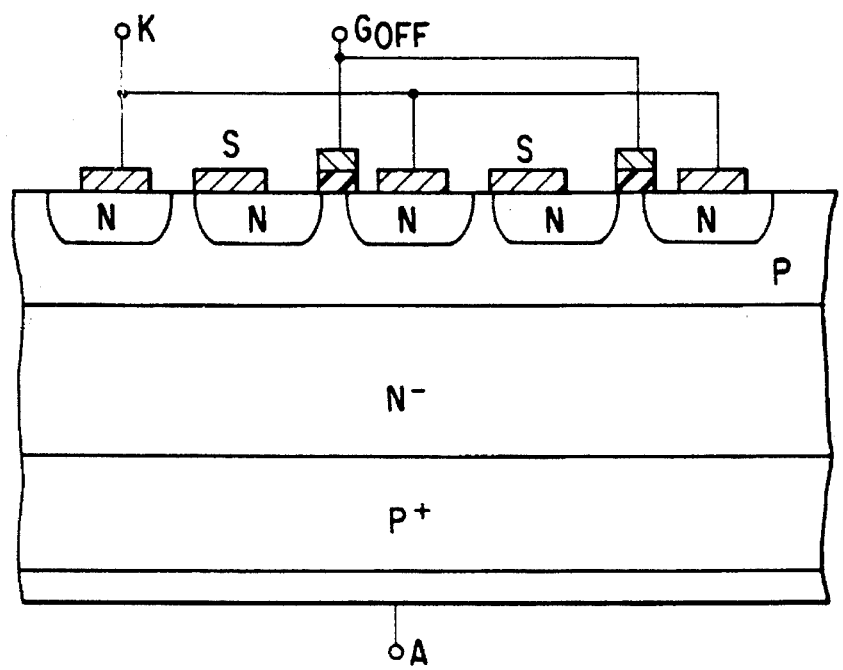
FIG. 31 is a sectional view taken along a line XXXI—XXXI of FIG. 30.
Figure 32:
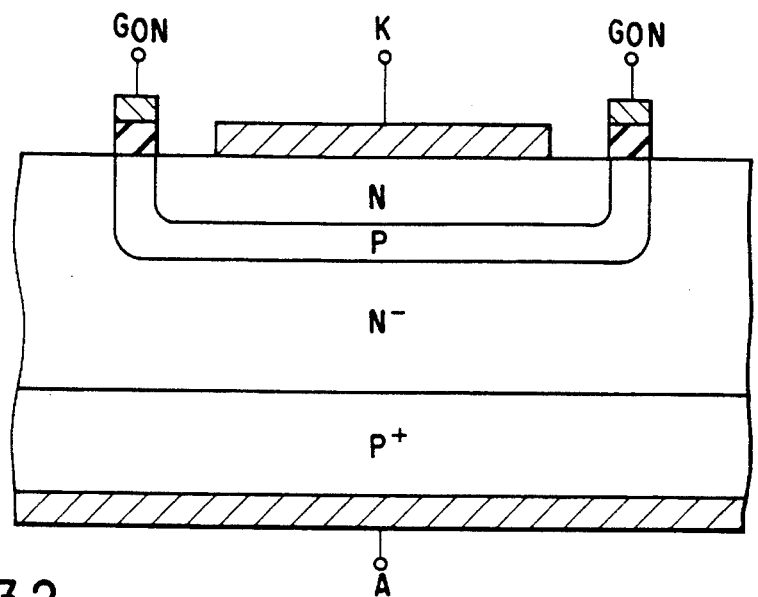
FIG. 32 is a sectional view taken along a line XXXII—XXXII of FIG. 30.

FIG. 30 is a plan view showing a plurality of thyristors with insulated gates which are continuously formed. FIGS. 31 and 32 are sectional views taken along lines XXXI—XXXI and XXXII—XXXII, respectively. In this thyristor array, a plurality of thyristors with insulated gates may be continuously formed in the form of a circle.

Figure 33:
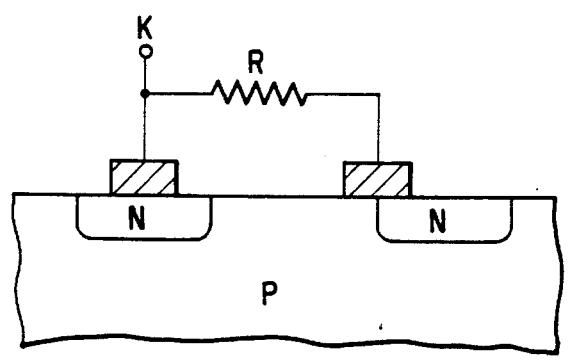
FIG. 33 is a sectional view showing an example of a thyristor in which a p-type base layer is connected to a cathode electrode via a resistor having a high resistance.

FIG. 33 shows a case wherein a p-type base layer and a cathode electrode are connected to each other via a resistor R having a high resistance. With this structure, when the thyristor with insulated gates is in an OFF state, an erroneous operation due to a leakage current can be prevented. In addition, since the number of carriers to be injected can be controlled, the turn-off current can be increased.

In the above-described embodiments, the present invention is applied to horizontal type thyristors, except for the embodiments shown in FIGS. 1, 23, and 30. However, the structures of the embodiments of the horizontal type thyristors can be applied to vertical type thyristors. In each embodiment of a horizontal type thyristor, a dielectric isolation substrate is used. However, a p-n junction isolation substrate may be used. In addition, it is apparent that the present invention can be applied to a single thyristor. Furthermore, various modifications can be made. For example, an n-type buffer layer may be formed on the p-type base layer side of an n-type base layer having a high resistance, or an emitter may be short-circuited with a base by using a transistor structure so as to increase the turn-off speed.

Figure 34:
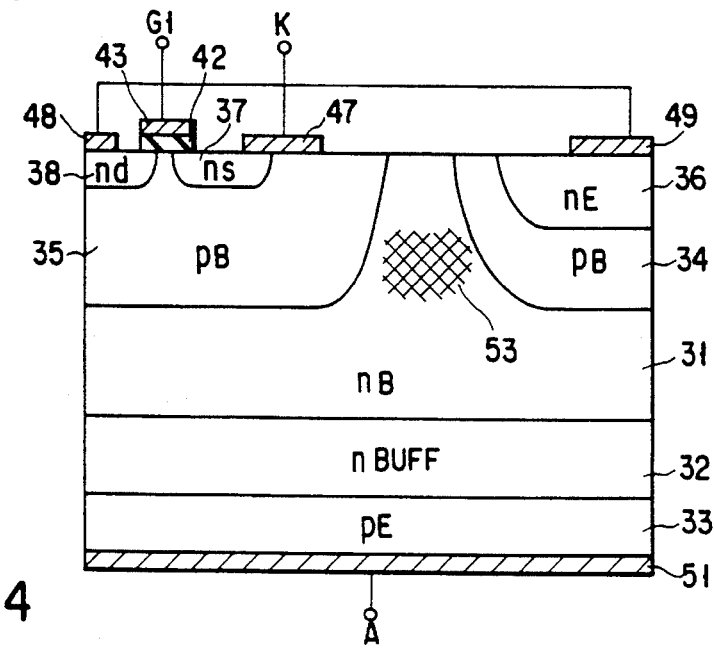
FIG. 34 is a sectional view of a thyristor in which a short-life-time layer is locally formed between two p-type base layers.

FIG. 34 is a sectional view of a thyristor with insulated gates according to still another embodiment of the present invention.

Referring to FIG. 34, p-type base layers 34 and 35 are formed on the surface of an n-type base layer 31 at predetermined positions to be close to each other. An n-type emitter layer 36 is formed on one p-type base layer 34, and an n-type source layer 37 and an n-type drain layer 38 are formed on the other p-type base layer 35 to be separated from each other by a predetermined distance. A first gate electrode 43 is formed on the surface of the p-type base layer 35 between the n-type source layer 37 and the n-type drain layer 38 via an insulating film 42.

A drain electrode 48 is formed on the surface of the n-type drain layer 38. A cathode emitter electrode 49 is formed on the surface of the n-type emitter layer 36. These electrodes are short-circuited with each other at a proper position on the element. A cathode electrode 47 is formed near the n-type emitter layer 36 so as to short-circuit the p-type base layer 35 with the n-type source layer 37. A p-type emitter layer 33 is formed on the lower surface of the n-type base layer 31 via an n-type buffer layer 32, and an anode electrode 51 is formed on the p-type emitter layer 33.

The thyristor shown in FIG. 34 is turned on when the gate G1 and a turn-on gate, which is not shown, are turned on and electrons are injected into the n-type base layer 31 through the cathode electrode 47, n-type source layer 37, n-type drain layer 38, electrodes 48 and 49, n-type emitter layer 36 and the turn-on gate. At this time, electrons are also injected by the n-type emitter layer 36, which has the same potential as that of the n-type drain layer 38, whereby the on-resistance of the thyristor is decreased.

A short-life-time layer 53 is locally formed on a portion between the p-type base layers 34 and 35 by, for example, radiating an electron beam on the portion. This structure serves to more effectively prevent holes from escaping into the cathode electrode 47 at the time of turn-on, thereby improving the turn-on characteristic.

FIG. 35 shows a thyristor with insulated gates, in which a p-type well layer 54 having a low impurity concentration is formed between two p-type base layers 34 and 35. Note that if the thyristor uses a structure preventing holes from escaping into a cathode electrode 47 at the time of turn-on, p-type base layers need not be completely isolated from each other. This condition can be satisfied by forming a p-type well layer 54 having a high resistance in the horizontal direction.

FIG. 36 shows a thyristor with insulated gates, in which two p-type base layers 34 and 35 are isolated from each other via an insulating layer 56 buried in a trench. With this structure, the same effect as that of the thyristor shown in FIG. 34 can also be obtained.

FIG. 37 shows a thyristor with insulated gates, in which an n-type well layer 57 is formed in a single p-type base layer 34 at a proper position, thus partly reducing the width of the p-type base layer or partly dividing the layer. With this structure, the same effect as that of the thyristor shown in FIG. 34 can also be obtained.

FIG. 38 shows a thyristor with insulated gates, in which a p-type source layer 39 is formed in an n-type well layer 57 formed in a p-type base layer 34 between an n-type emitter layer 36 and a cathode electrode 47. A source electrode 50 connected to the cathode electrode is formed on the surface of the p-type source layer 39. A fourth gate electrode 58 is formed on the surface of the n-type well layer 57 via a gate insulating film 42 between the p-type base layer 34 and the p-type source layer 39. Assume that this fourth gate is of an enhancement type. In this case, if the fourth gate electrode 58 is connected to a first gate electrode 43, the fourth gate electrode 58 can be controlled by a single gate signal.

When the fourth gate electrode 58 is enabled at the time of turn-off, stored holes are discharged not only from the cathode electrode 47 but also from a source electrode 50, thus considerably improving the turn-off characteristic.

Figure 39:
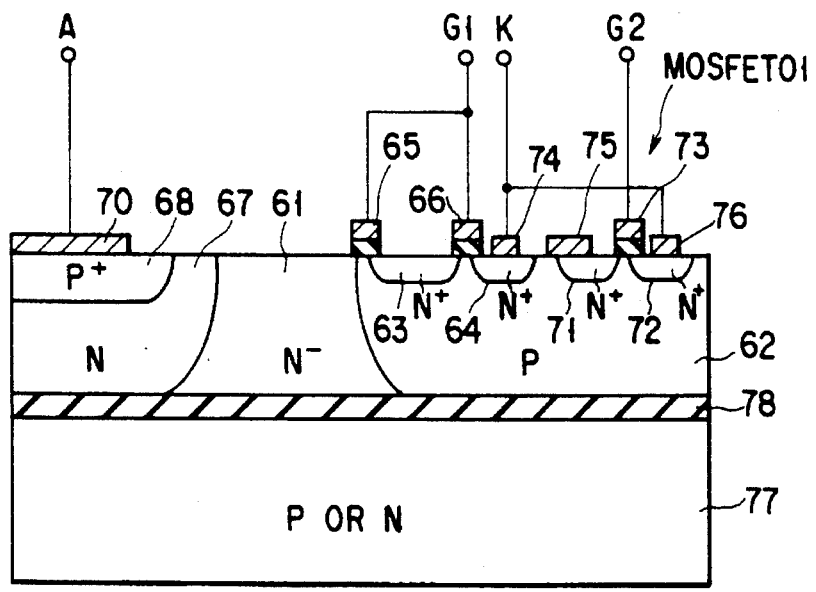
FIG. 39 is a sectional view of a thyristor according to still another embodiment of the present invention.

FIG. 39 is a sectional view of a thyristor with insulated gates according to still another embodiment of the present invention. Referring to FIG. 39, an n-type drain layer 71 and an n-type source layer 72 are formed in a p-type base layer 62. A gate electrode 73 is formed on the surface of the p-type base layer 62 via an insulating film between the n-type drain layer 71 and the n-type source layer 72. In addition, a drain electrode 75 is formed to be in ohmic contact with both the n-type drain layer 71 and the p-type base layer 62, and a source electrode 76 is formed to be in ohmic contact with the source layer 72. An turn-off MOSFET 01 is constituted by these components.

Note that in this thyristor with insulated gates, a cathode electrode 74 of the second n-type emitter layer is not in contact with the p-type base layer 62, unlike the prior art. In this embodiment, as a substrate, a dielectric isolation substrate obtained by forming a n-type base layer 61 having a high resistance on a semiconductor substrate 77 via an insulating film 78 is used.

A turn-on operation of the thyristor with insulated gates according to this embodiment is performed in the following manner. When a positive voltage with respect to the p-type base layer 62 is applied to first and second gate electrodes 65 and 66, n-type channel layers are formed in the surface of the p-type base layer 62 under the first and second gate electrodes 65 and 66. Electrons are then injected from a first n-type emitter layer 63 into the n-type base layer 61 via the n-type channel layers and reach a p-type emitter layer 68 through an n-type buffer layer 67. At this time, holes are injected from the p-type emitter layer 68 into the n-type buffer layer 67 and the n-type base layer 61 and flow in the p-type base layer 62.

In this embodiment, since a cathode electrode 74 is not in contact with the p-type base layer 62, holes directly flow into the first n-type emitter layer 63 to cause injection of electrons from the first n-type emitter layer 63, thereby performing a thyristor operation of the element. Therefore, according to the thyristor with insulated gates of this embodiment, a thyristor operation can be performed by using a small hole current, and an ON state with a low ON voltage can be obtained.

A turn-off operation will be described next. First, a positive voltage with respect to the p-type base layer 62 is applied to the gate electrode 73 of the turn-off MOSFET 01 formed in the p-type base layer 62 to form an n-type channel in the surface of the p-type base layer 62 under the gate electrode 73, thereby short-circuiting the p-type base layer 62 with the cathode electrode 74. As a result, holes are partly discharged via the turn-off MOSFET 01.

Subsequently, when a zero or negative voltage with respect to the p-type base layer 62 is applied to the first and second gate electrodes 65 and 66, the n-type channels in the surface of the p-type base layer 62 under the first and second gate electrodes 65 and 66 disappear, and the first n-type emitter layer 63 is disconnected from the cathode electrode 74. As a result, the injection of electrons from the first n-type emitter layer 63 is stopped. With this operation, the thyristor operation of the thyristor with insulated gates is terminated, and a turn-off operation is started.

The stored holes are then discharged through the turn-off MOSFET 01, and the thyristor with insulated gates is turned off. As described above, at the time of turn-off of the thyristor with insulated gates, the p-type base layer 62 is connected to the cathode electrode 74 through the turn-off MOSFET 01, which is equivalent to connecting the p-type base layer 62 to the cathode electrode 74 via a resistor, thereby allowing a turn-off operation of a large current.

Figure 40:
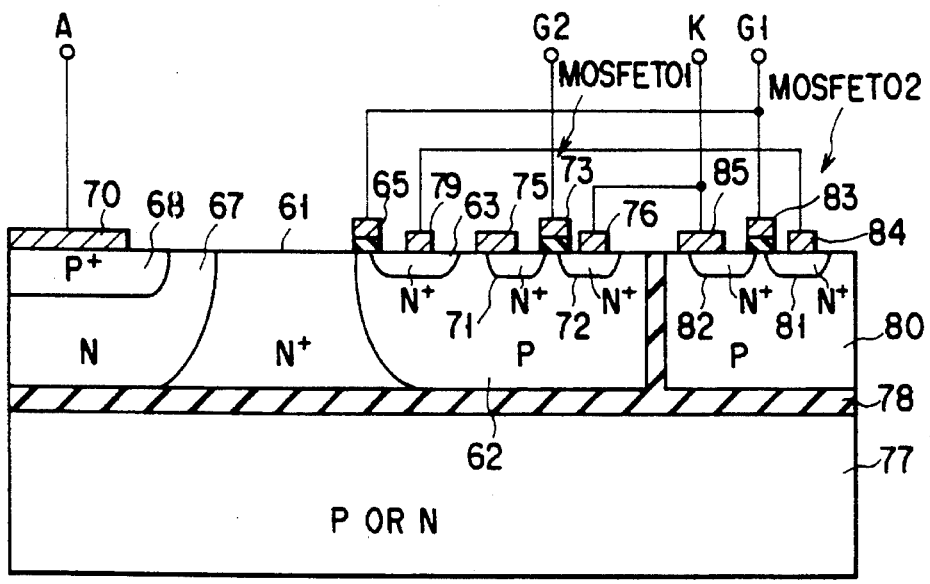
FIG. 40 is a sectional view of a thyristor in which a p-type base layer is divided into two regions by dielectric isolation.

FIG. 40 is a sectional view of a thyristor with insulated gates according to still another embodiment of the present invention. Referring to FIG. 40, an n-type drain layer 81 and an n-type source layer 82 are formed in a dielectric isolation semiconductor region 80, and a gate electrode 83 is formed on the surface of the semiconductor region 80 via an insulating film between the n-type drain layer 81 and the n-type source layer 82. In addition, a source electrode 85 is formed to be in ohmic contact with both the n-type source layer 82 and the semiconductor region 80, and a drain electrode 84 is formed to be in ohmic contact with the n-type drain layer 81. A turn-on MOSFET 02 is constituted by these components.

In this embodiment, the second n-type emitter layer shown in FIG. 39 is not formed, and an emitter electrode 79 is formed on the surface of the n-type emitter layer and is connected to the drain electrode 84. In addition, a source electrode 76 of a turn-off MOSFET 01 formed on a p-type base layer 62 is connected to a source electrode 85 of the turn-on MOSFET 02, thus forming a cathode electrode.

A turn-on operation of the thyristor with insulated gates according to this embodiment is performed in the following manner. First, a positive voltage with respect to the cathode electrode is applied to a gate electrode 65 and the gate electrode 83 to form n-type channels in the surface of the p-type base layer 62 under the first gate electrode 65 and in the surface of the semiconductor region 80 under the gate electrode 83. As a result, the turn-on MOSFET 02 is set in an ON state, and electrons are injected from an n-type emitter layer 63 into an n-type base layer 61. The injected electrons pass through an n-type buffer layer 67 to reach the p-type emitter layer 68. At this time, holes are injected from the p-type emitter layer 68 into the n-type buffer layer 67 and the n-type base layer 61 and flow in the p-type base layer 62.

The holes directly flow in the n-type emitter layer 63 to cause electrons to flow from the n-type emitter layer 63, thereby performing a thyristor operation of the element. Therefore, similar to the thyristor shown in FIG. 39, the thyristor with insulated gates according to this embodiment can perform a thyristor operation with a small hole current, thereby obtaining an ON state with a low ON voltage.

A turn-off operation will be described next. When a positive voltage with respect to the cathode electrode is applied to a gate electrode 73 of the turn-off MOSFET 01 formed in the p-type base layer 62, an n-type channel is formed in the p-type base layer 62 under the gate electrode 73, thus short-circuiting the p-type base layer 62 with the cathode electrode. As a result, holes are partly discharged through the turn-off MOSFET 01.

When a zero or negative voltage with respect to the cathode electrode to the first gate electrode 65 and the gate electrode 83, the n-type channels in the surface of the p-type base layer 62 under the first gate electrode 65 and in the surface of the semiconductor region 80 under the gate electrode 83 disappear. As a result, the n-type emitter layer 63 is disconnected from the cathode electrode, and the injection of electrons from the n-type emitter layer 63 is stopped. With this operation, the thyristor operation of the thyristor with insulated gates is terminated, and a turn-off operation is started. Subsequently, when the stored holes are discharged through the turn-off MOSFET 01 and disappear, the thyristor with insulated gates are turned off.

In the thyristor shown in FIG. 39, a second n-type emitter layer 64 is formed in the p-type base layer 62, and this n-type emitter layer 64 is forward-biased at the time of turn-off owing to a voltage drop in the turn-off MOSFET 01. If, therefore, the thyristor shown in FIG. 39 is used with a large current, this voltage drop exceeds the built-in voltage of the p-n junction of the second n-type emitter layer 64 to cause a thyristor operation again. Consequently, the thyristor shown in FIG. 39 cannot be turned off.

In the thyristor shown in FIG. 40, however, since the n-type emitter layer 63 is connected to the turn-on MOSFET 02 which has undergone dielectric isolation, injection of electrons from the n-type emitter layer 63 does not occur again unless the voltage drop in the turn-off MOSFET 01 exceeds the blocking voltage of the turn-on MOSFET 02. Therefore, the thyristor with insulated gates in FIG. 40 can be turned off even with a large current.

FIG. 41 is a sectional view of a thyristor with insulated gates according to still another embodiment of the present invention. In the thyristor of this embodiment, a turn-on MOSFET 02 and turn-off MOSFET 01 are formed in a semiconductor-region 80 which has undergone dielectric isolation. With this structure, a turn-off operation can be performed with a larger current because no parasitic thyristor is formed by the turn-off MOSFET 01.

FIG. 42 is a sectional view of a thyristor with insulated gates according to still another embodiment of the present invention. In this embodiment, a turn-on MOSFET 02 and a turn-off MOSFET 01 are respectively formed in different semiconductor regions 80 and 200 which are isolated from each other by dielectric isolation. With this structure, the same effect as that of the embodiment shown in FIG. 41 can be obtained.

FIG. 43 is a sectional view of a thyristor with insulated gates obtained by modifying the embodiment shown in FIG. 42. In this embodiment, the conductivity type of an turn-off MOSFET 01 is reversed, and each gate is connected to one electrode. With this arrangement, the thyristor with insulated gates can be turned on and off by a single gate signal.

FIG. 44 is a sectional view of a thyristor with insulated gates according to still another embodiment of the present invention. In this embodiment, a MOSFET 03 is constituted by a p-type drain layer 100 formed at a predetermined distance from a p-type emitter layer 68, and a gate electrode 101 formed on the surface of an n-type base layer via an insulating film between the p-type drain layer 100 and the p-type emitter layer 68. At the time of turn-off, when a negative voltage with respect to the p-type emitter layer 68 is applied to the gate electrode 101 of the MOSFET 03, the MOSFET 03 is set in an ON state, and an n-type buffer layer 67 is short-circuited with the p-type emitter layer 68 via the MOSFET 03. As a result, the injection of holes from the p-type emitter layer 68 is suppressed, and a high-speed turn-off characteristic can be realized.

The operation timing of the MOSFET 03 is substantially the same as that of a turn-off MOSFET 01. FIG. 2 shows the operation timings of the MOSFETs 01 to 03 respectively denoted by $G_{OFF}$, $G_{ON}$, and G3.

FIG. 45 is a sectional view of a thyristor with insulated gates obtained by modifying the embodiment shown in FIG. 44. In this embodiment, a MOSFET 03 for short-circuiting an n-type buffer layer 67 with a p-type emitter layer 68 is formed in a semiconductor region 400 which has undergone dielectric isolation. With this structure, the same effect as that of the embodiment shown in FIG. 44 can be obtained.

In the embodiments shown in FIGS. 39 to 45, various horizontal type thyristors with insulated gates have been described. However, the present invention can be equally applied to vertical type thyristors with insulated gates. FIG. 46 shows a case wherein the thyristor with insulated gates in FIG. 41 is applied to a vertical type thyristor.

FIG. 47 shows thyristor with insulated gates according to still another embodiment of the present invention. Referring to FIG. 47, p-type base layers 204 and 205 are formed in the surface of an n-type base layer 201 at predetermined positions to be close to each other. An n-type emitter layer 206 is formed in one p-type base layer 204, and an n-type source layer 207 and an n-type drain layer 208 are formed in the other p-type base layer 205 to be separated from each other by a predetermined distance. A first gate electrode 213 is formed on the surface of the p-type base layer 205 between the n-type source layer 207 and the n-type drain layer 208 via an insulating film 212.

A drain electrode 218 is formed on the surface of the n-type drain layer 208. A cathode emitter electrode 219 is formed on the surface of the n-type emitter layer 206. These electrodes are short-circuited with each other at a proper position on the element. A cathode electrode 217 is formed near the n-type emitter layer 206 so as to short-circuit the p-type base layer 205 with the n-type source layer 207. An anode electrode 221 is formed on a p-type emitter layer 203.

In addition, at another position on the element, a third gate electrode 215 is formed on the surface of the p-type base layer 204 between the n-type emitter layer 206 and the n-type base layer 201 via the insulating film 212. In this case, since the element can be controlled by a single gate signal, the three gate electrodes may be arbitrarily connected to each other.

In addition, the drain electrode 218 may be connected to not only the n-type drain layer 208 but also the p-type base layer 205. Furthermore, the third gate electrode 215 may be replaced with a base electrode connected to the p-type base layer 204 because the third gate electrode 215 is specially formed for a turn-on operation:

when this element is to be turned on, a positive voltage is applied to the first and third gate electrodes 213 and 215. As a result, electrons are injected from the cathode electrode 217 into the n-type base layer 201 upon passing through the n-type source layer 207, the first gate, the n-type drain layer 208, the drain electrode 218, the cathode emitter electrode 219, the n-type emitter layer 206, and the third gate in the order named. In accordance with this operation, holes are injected from the p-type emitter layer 203. As a result, the main thyristor is latched up. At this time, since the p-type base layer is formed and isolated, the holes do not easily escape into the cathode electrode. For this reason, the ON voltage is suppressed low as compared with the conventional structure.

When a turn-off operation is to be performed, the first and third gates may be disabled. As a result, the injection of electrons is stopped, and holes in the elements are discharged to the cathode electrode 217 via the second p-type base layer 205. At this time, most of the holes are discharged without passing through a portion, under the n-type source layer 207, which corresponds to the emitter portion of a parasitic thyristor. Therefore, latch-up of the parasitic thyristor does not easily occur as compared with the conventional structure.

Figure 48:
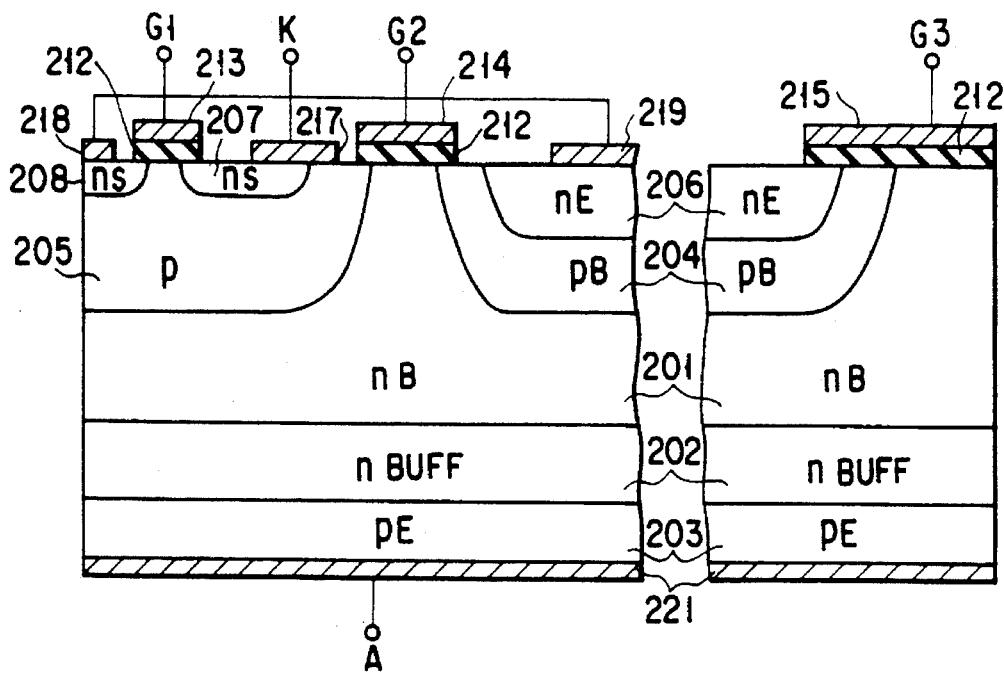
FIG. 48 is a sectional view of a thyristor as a modification of the thyristor shown in FIG. 47.

FIG. 48 shows a modification of the thyristor with insulated gates shown in FIG. 47. In this modification, a second gate electrode 214 is formed on the surface of an n-type base layer 201 between p-type base layers 204 and 205 via an insulating film 212. When a negative voltage is applied to this gate electrode at the time of turn-off, the p-type base layers 204 and 205 are short-circuited with each other, thus effectively discharging holes in the element.

Figure 49:
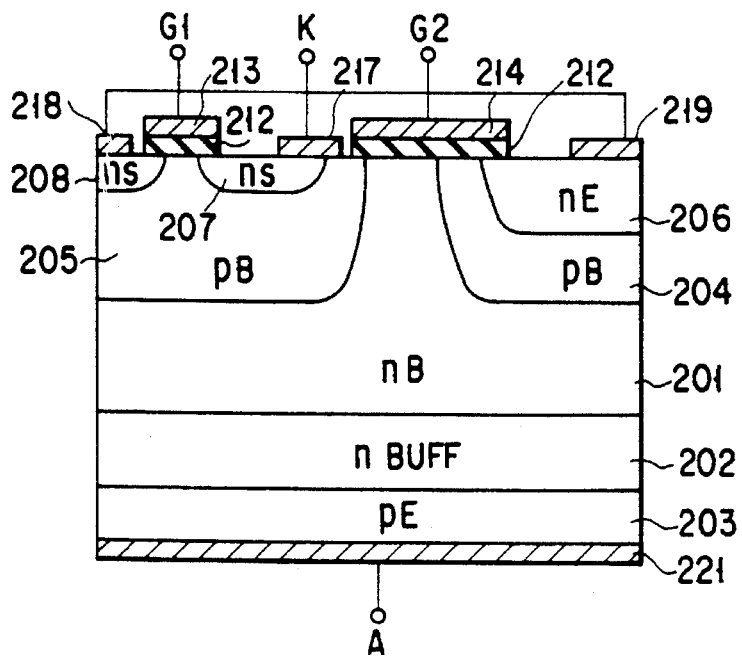
FIG. 49 is a sectional view of a thyristor as a modification of the thyristor shown in FIG. 47.

FIG. 49 shows another modification of the thyristor with insulated gates shown in FIG. 47. In this modification, a second gate electrode 214 is formed to extend to the surface of a p-type base layer 204. According to this structure, the thyristor can be turned on without forming a third gate electrode 215. With this structure, the effective area of the element can be further increased.

Figure 50:
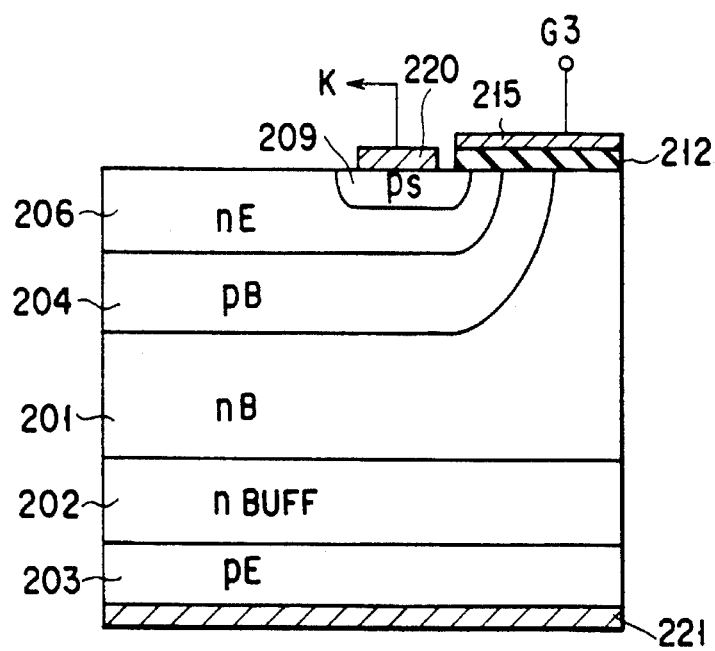
FIG. 50 is a sectional view showing a third gate electrode portion of a thyristor as a modification of the thyristor shown in FIG. 47.

FIG. 50 shows still another embodiment of the present invention, in which a portion corresponding to the third gate electrode 215 is modified. In this embodiment, a p-type source electrode 209 is formed on an n-type emitter layer 206. A source electrode 220 is formed on the p-type source electrode 209 and is connected to a cathode electrode 217 at a proper position on the element. A third gate electrode 215 is formed to extend over the n-type emitter layer 206. According to this structure, by applying a negative voltage to the third gate electrode 215 at the time of turn-off, a p-type base layer 204 can be short-circuited with the cathode electrode 217 via the p-type source electrode 209 to discharge holes more quickly.

Figure 51:
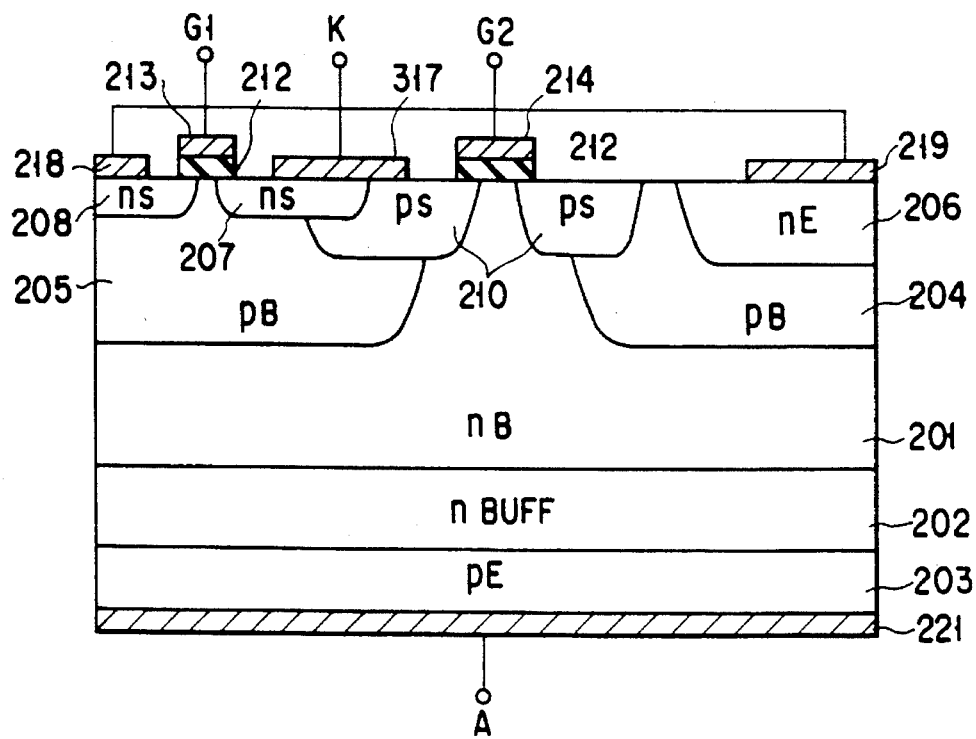
FIG. 51 is a sectional view of a thyristor in which the second gate is formed by using a p-type layer having a high impurity concentration.

FIG. 51 shows still another embodiment of the present invention. In this embodiment, the second gate is formed by using a p-type heavily doped layer 210. According to this structure, the second gate can be stably formed. In addition, since the p-type heavily doped layer is formed, the discharge resistance of a path through which holes are discharged at the time of turn-off is reduced to facilitate discharging of the holes.

FIGS. 52A to 52C and 53A to 53C are sectional views showing a simple manufacturing process of the thyristor with insulated gates shown in FIG. 51. As shown in FIG. 52A, p-type base layers 204 and 205 are formed by using a resist 222 as a mask. Gate electrodes 213 and 214 are then formed on the surface of the resultant structure at predetermined positions via an insulating film 212 (FIG. 52B). A p-type heavily doped layer 210 is formed by a self-alignment method using the resist 222 and the second gate electrode 214 as masks (FIG. 52C).

Subsequently, an n-type emitter layer 206 is formed in the p-type base layer 204 by using the resist 222 as a mask (FIG. 53A). An n-type source layer 207 and an n-type drain layer 208 are formed by the self-alignment method using the first gate electrode 213 and the resist 222 as masks (FIG. 53B). Finally, each electrode is formed at a predetermined position (FIG. 53C).

Figure 54:
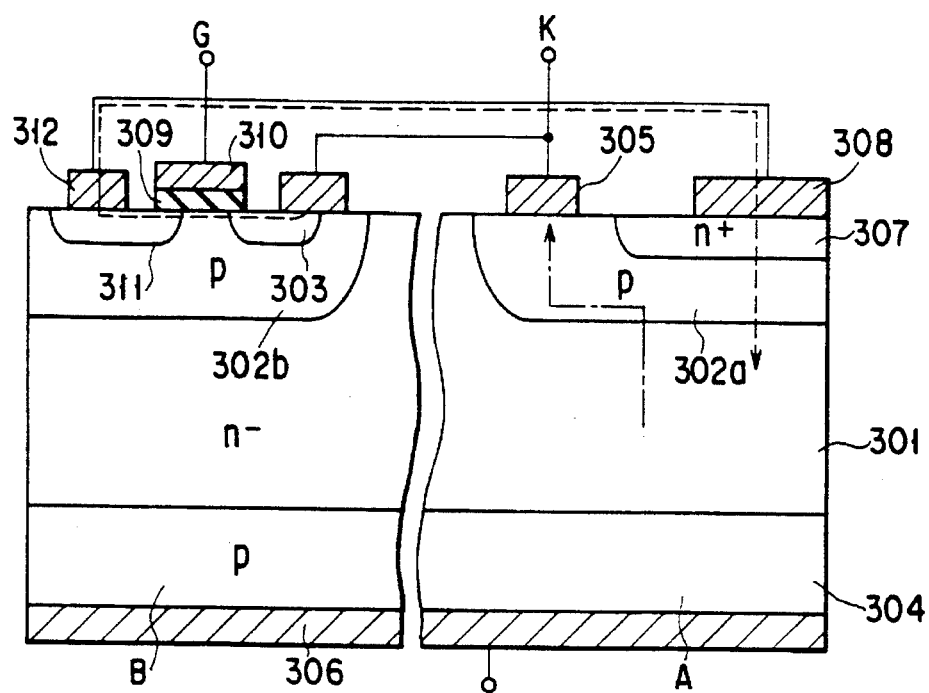
FIG. 54 is a sectional view of the structure of a turn-off gate of another thyristor of the present invention.

FIG. 54 shows the structure around the turn-off gate of a thyristor with insulated gates according to still another embodiment of the present invention. In this structure, a cathode electrode 305 is formed near a first n-type drain layer 307 to be in contact with a p-type base layer 302a. An n-type emitter layer 303 formed in an isolated p-type base layer 302b is short-circuited with the p-type base layer 302b via the cathode electrode 305. A second n-type drain layer 311 is formed at a predetermined distance from the n-type emitter layer 303. An insulated gate electrode 310 is formed between the n-type emitter layer 303 and the n-type drain layer 311. A second drain electrode 312 is electrically connected to a first drain electrode 308. Similar to the cathode electrode 305, the second drain electrode 312 may be arranged to be in contact with a p-type base layer 302 as well as the first drain electrode 308, unlike this embodiment. Note that the first drain electrode 308 is arranged to be in contact with only the first n-type drain layer 307.

As shown in FIG. 24, the horizontal MOSFET region (portion A) is two-dimensionally isolated from the first drain region (portion B). The relationship between the portions A and B may be reversed, or the portions A and B may be laterally isolated from each other.

In the thyristor with insulated gates according to this embodiment, a positive voltage with respect to the cathode is applied to the insulated gate electrode 310 at the time of turn-off. The path of an electron current produced in this case is indicated by a broken line in FIG. 54. As shown in FIG. 54, part of a hole current flows into the cathode electrode 305 at a position near the n-type emitter layer 303 and is discharged.

In this embodiment, the horizontal resistance of the p-type base layer 302 is not present in the hole current bypass. Therefore, a voltage drop caused by this bypassed hole current is very small, and hence a high turn-off capability can be obtained as compared with the conventional structure.

As a power IC, a horizontal type thyristor is preferably formed by using a semiconductor substrate having a dielectric isolation structure in consideration of the integration of logic circuits and the like. The present invention can be applied to such a horizontal type thyristor with insulated gates. Note that the same reference numerals in the following embodiment denote the same parts as in the embodiment shown in FIG. 54, and a detailed description thereof will be omitted.

Figure 55:
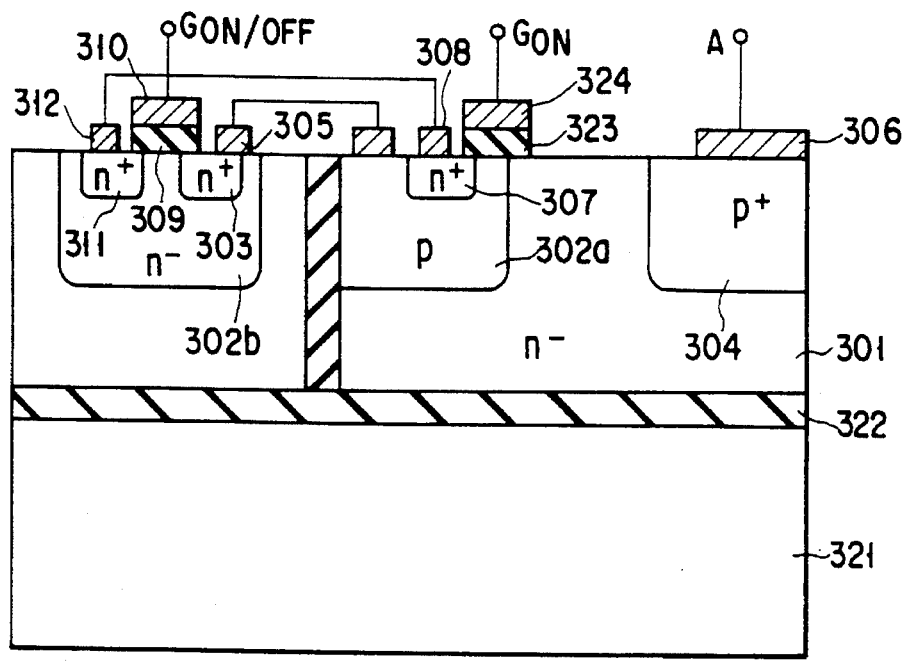
FIG. 55 is a sectional view of another horizontal type thyristor of the present invention.

FIG. 55 is a sectional view of a horizontal type thyristor with insulated gates. In this embodiment, an n-type base layer 301 is formed on a silicon substrate 321 in an isolated state via an oxide film 322. For example, this structure can be obtained by a technique of directly adhering two silicon substrates to each other. A p-type base layer 302a and a p-type emitter layer 304 are formed in a striped form in the surface of the n-type base layer 301 to oppose each other at a predetermined distance. An n-type emitter layer 303 and n-type drain layers 307 and 311 are formed in a striped pattern in an isolated p-type base layer 302b. The cathode electrode 305 is formed to be in contact with both the n-type emitter layer 303 and a p-type base layer 302. A turn-on/turn-off insulated gate electrode 310 is formed in a striped pattern between the n-type emitter layer 303 and the n-type drain layer 311. This MOSFET portion has the same sectional structure as that of the embodiment shown in FIG. 54.

A gate electrode 324 is formed in a striped pattern on a region sandwiched between the n-type drain layer 307 of the p-type base layer 302 and the n-type base layer 301 via a gate insulating film 323. This gate electrode 324 is a turn-on gate electrode which is omitted from the embodiment shown in FIG. 54.

The drain electrodes 308 and 312 are integrally formed in a coupled state, as shown in FIG. 53.

In the horizontal type thyristor with insulated gates according to this embodiment, a positive voltage is applied to the gate electrode 310 and the gate electrode 324 when a turn-on operation is to be performed. With this operation, electrons are injected from the n-type emitter layer 303 into the n-type base layer 301 via an n-type channel under the gate electrode 310 and an n-type channel under the gate electrode 324. As a result, corresponding holes are injected from the p-type emitter layer 304 into the n-type base layer 301 to turn on the thyristor. When a turn-off operation is to be performed, a zero or negative bias voltage is applied to the gate electrode 310. With this operation, similar to the above-described embodiment, a hole current is bypassed to turn off the thyristor.

In this embodiment, a large current can also be turned off, similar to the previous embodiments.

Still another embodiment of the present invention will be described next.

Figure 56:
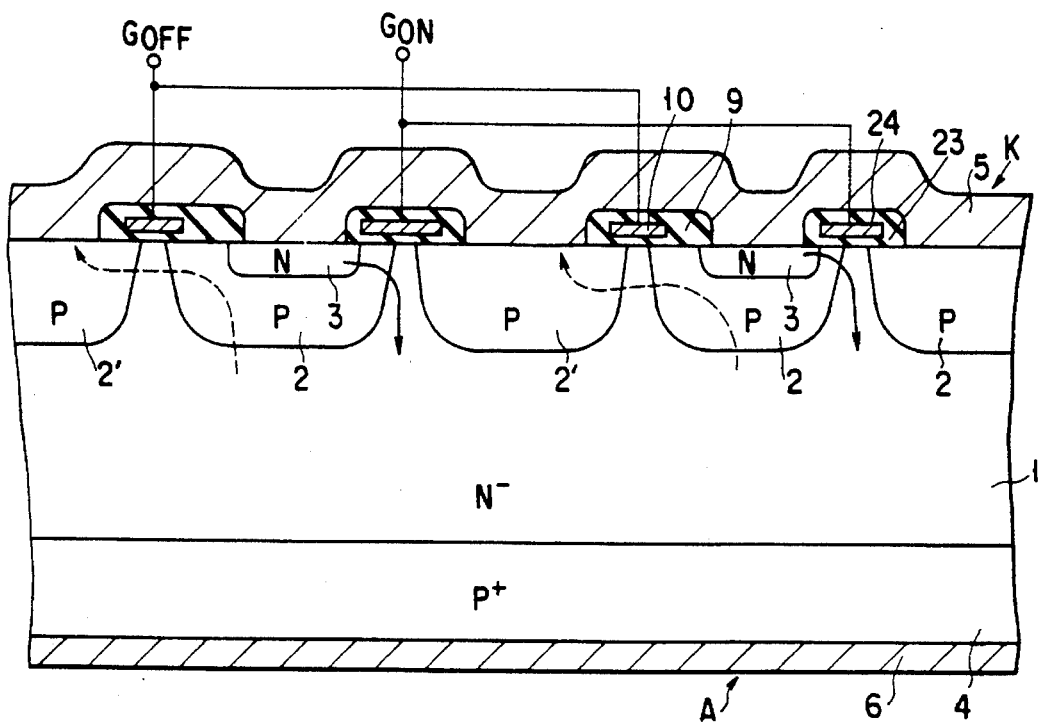
FIG. 56 is a sectional view of a thyristor in which a turn-off transistor is constituted by a p-channel MOSFET.

FIG. 56 is a sectional view showing the structure of a thyristor with insulated gates. Note that the same reference numerals in FIG. 56 denote the same parts as in FIG. 1, and a detailed description thereof will be omitted. As is apparent from the comparison with the thyristor with insulated gates shown in FIG. 1, in the thyristor with insulated gates according to this embodiment, in addition to a p-type base layer 2 having an n-type emitter layer 3, a p-type base layer 2' having no n-type emitter layer is formed. These two p-type base layers 2 and 2' are used as a source layer and a drain layer, respectively, and an n-type semiconductor layer 1 is used as a channel, thus forming a p-type MOSFET. This p-type MOSFET is operated by a gate insulating film 9 and a gate electrode 10 ($G_{OFF}$). In addition, an n-type MOSFET is constituted by the n-type emitter layer 3, the p-type base layer 2, and the n-type semiconductor layer 1. This n-type MOSFET is operated by a gate insulating film 23 and a gate electrode 24 ($G_{ON}$).

The thyristor with insulated gates shown in FIG. 56 is turned off by a gate operation method based on the timing chart indicated by the solid lines in FIG. 2. More specifically, after a positive voltage with respect to the cathode is applied to the turn-on gate electrode 24 to turn on the gate electrode 24, a negative voltage with respect to the cathode is applied to the gate electrode 10 after the lapse of a predetermined time $\Delta t_1$. Alternatively, a positive voltage may be kept applied to the turn-on gate electrode 24 during the interval from a turn-on operation to a turn-off operation, as indicated by the broken line in FIG. 2.

Referring to FIG. 56, an electron current produced when the gate electrode 10 is turned on is indicated by a solid line, and the bypass of a hole current is indicated by a broken line. As shown in FIG. 56, the hole current is discharged to a cathode electrode 5 via the p-type MOSFET at a position near the n-type emitter layer 3.

A transistor having such a current path is equivalent to a so-called IGBT (insulated gate bipolar transistor). For this reason, when the turn-on gate electrode 24 is turned off a predetermined time $\Delta t_2$ after a negative voltage is applied to the gate electrode 10, the injection of electrons is stopped to turn off the device. At this time, in the structure shown in FIG. 56, the horizontal resistance of the p-type base layer 2, based on the turn-off MOSFET, is not present in the bypass of the hole current, as is apparent from the comparison with the conventional structure shown in FIG. 64. In addition, at the time of turn-off, a uniform electron current flows, and a decrease in turn-off current due to a reduction in conducting region of the electron current does not occur, unlike a turn-off operation performed by the conventional operation method.

The time $\Delta t_2$ is preferably set to be about 1 to 20 µsec. If the time is longer than this time range, the ON voltage of the device increases, resulting in an increase in loss. In contrast to this, if the time is shorter than this time range, the effect of the present invention cannot be obtained.

Figure 57:
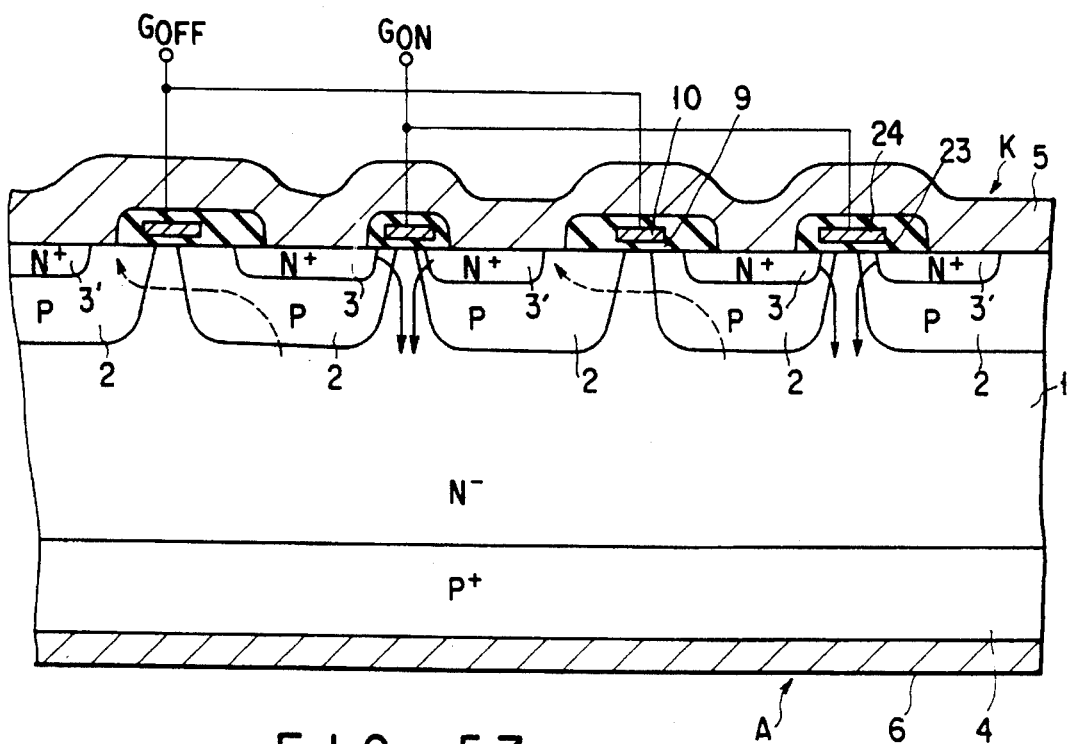
FIG. 57 is a sectional view showing a thyristor in which the ON current is increased by adding an n-type emitter to the arrangement shown in FIG. 56.

FIG. 57 is a sectional view showing the structure of a thyristor obtained by further improving the thyristor with insulated gates in FIG. 56. The same reference numerals in FIG. 56 denote the same parts as in FIG. 1, and a detailed description thereof will be omitted.

In this structure, an n-type emitter layer formed in a p-type base layer have two shapes, i.e., one shape (denoted by reference numeral 3 in FIG. 57) allowing the n-type emitter layer to be connected to only a cathode electrode 5, and the other shape (denoted by reference numeral 3') allowing the n-type emitter layer to be connected to a p-type base layer 2 via the cathode electrode 5. As shown in FIG. 57, the flow of carriers at the time of turn-off is basically the same as that in the embodiment shown in FIG. 56. This structure is characterized in that even while the n-type emitter layer denoted by reference numeral 3' in FIG. 57 is in ON state, no latch-up occurs and an IGBT operation is performed. With this structure, the ON voltage can be set to be lower than that in the embodiment shown in FIG. 56.

In the embodiments shown in FIGS. 56 and 57, the p-type drain layer and p-type emitter layer of the turn-off p-type MOSFET are isolated from each other. However, they may be partly connected to each other. The present invention can be applied to other structures having turn-off p-type MOSFETs.

Still another embodiment of the present invention will be described next.

In the embodiment shown in FIG. 58A, a MOSFET for discharging holes is formed near an n-type emitter layer 504 by using a trench 515. More specifically, a MOSFET is formed in the vertical direction by using a p-type base layer 503, an n-type well layer 511, a p$^+$-type layer 512, an insulating film 509 formed in the trench 515, and a gate electrode 510 (G2). In addition, a MOSFET for injecting electrons is formed as a planar type by using a gate insulating film 507 and a gate electrode 508 (G1).

An operation method of this embodiment will be described below. As shown in FIG. 63A, when a turn-on operation is to be performed, a positive or zero voltage is applied to the gate electrode G2 to turn off a channel 514, and a positive voltage is applied to the gate electrode G1 to turn on a channel 513. As a result, electrons are injected from the n-type emitter layer 504, and holes are injected from a p-type emitter layer 501 into a p-type base layer 502, thus turning on the element.

A turn-off operation in this embodiment is performed as follows. A positive voltage is applied to the gate electrode G1 to turn on the channel 513. While injection of electrons continues in this state, a negative voltage is applied to the gate electrode G2 to turn on the channel 514 to open a path through which holes in the p-type base layer 513 are discharged into a cathode electrode 506 via the p$^+$-type layer 512. With this operation, a state equivalent to an IGBT is obtained. After that, as in the embodiment shown in FIG. 56, a negative voltage is applied to the gate electrode G1 to turn off the channel 513 and stop the injection of electrons, thereby turning off the element. As described above, when the MOSFET for discharging holes is turned on, the MOSFET for injecting electrons is turned on to flow an electron current. For this reason, a current concentration phenomenon due to a reduction in conducting region of an electron current as in a normal case does not occur, and hence the element can be turned off up to a larger current.

In the embodiment shown in FIG. 58B, a bottom portion of a trench 528 extends to an n-type base layer, unlike the embodiment shown in FIG. 58A. This embodiment is operated by the same method as that of the embodiment shown in FIG. 58A.

In the embodiment shown in FIG. 59A, a MOSFET for injecting electrons is formed by using a trench 516, and a MOSFET for discharging holes is formed as a planar type using a gate electrode 523 (G2). More specifically, a gate electrode (G1) 517 is buried in the trench 516 via a gate insulating film 518, and a vertical type MOSFET for injecting electrons, which has a channel 526 formed between an n-type base layer 502 and an n-type emitter layer 504, is formed. In addition, n$^+$-type layers 520 and 521 are formed in a p-type base layer 503, and the gate electrode 523 (G2) is formed between n$^+$-type layers 520 and 521 via a gate insulating film 522, thus forming a planar type MOSFET for discharging holes.

When holes are to be discharged, the holes in the p-type base layer 503 are short-circuited with the n$^+$-type layer 520 via an electrode 519 formed near the n-type emitter layer 504, and a positive voltage is applied to the gate electrode 523 (G2). As a result, an electron current flows in the channel 527 and is discharged to a cathode electrode 524 via the n$^+$-type layer 521.

The thyristor of this embodiment is operated by the method indicated in FIG. 63B. The embodiments shown in FIGS. 58A and 59A are different from each other in channel type between the n-type channel MOSFET and the p-type channel MOSFET used as MOSFETs for discharging holes. Therefor, the gate electrode 523 (G2) of the embodiment shown in FIG. 59A is applied with voltages different in polarity from the gate electrode (G2) of the embodiment shown in FIG. 58A. However, the principle and the method are the same as those described above.

The difference of the embodiment shown in FIG. 59B from the embodiment shown in FIG. 59A will be described below. In the embodiment shown in FIG. 59B, a p-type MOSFET is used as a MOSFET for discharging holes. More specifically, a MOSFET constituted by $p^+$-type layers 529 and 530, an n-type well layer 531, and insulating film 532, and a gate electrode 533 (G2) serve to discharge holes from p-type base layer 503 to a cathode electrode 534 via the $p^+$-type layer 529, a channel 535, and the $p^+$-type layer 530. The operation method of this embodiment is indicated in FIG. 63A, which is the same as that of the embodiment shown in FIG. 58A.

Figure 60A:
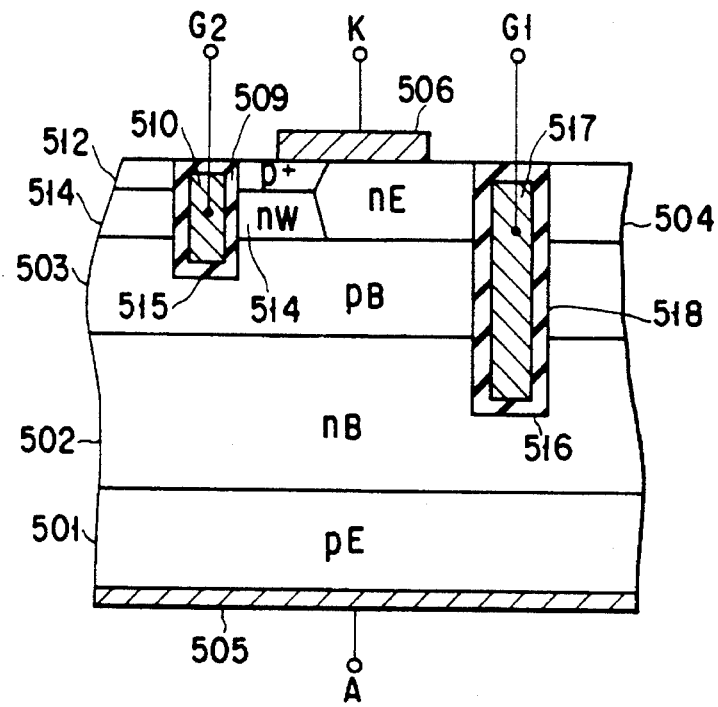
FIGS. 60A and 60B are sectional views, each showing a thyristor in which both a hole discharge MOSFET and an electron injection MOSFET are formed as vertical type MOSFETs.

In the embodiment shown in FIG. 60A, both a MOSFET for injecting electrons and a MOSFET for discharging holes are formed in side walls of trenches. More specifically, the MOSFET for discharging holes is formed in a trench 515, similar to the embodiment shown in FIG. 58A, and the MOSFET for injecting electrons is formed in a trench 516, similar to the embodiment shown in FIG. 59A. The operation method of this embodiment is the same as that of the embodiment shown in FIG. 58A.

Figure 60B:
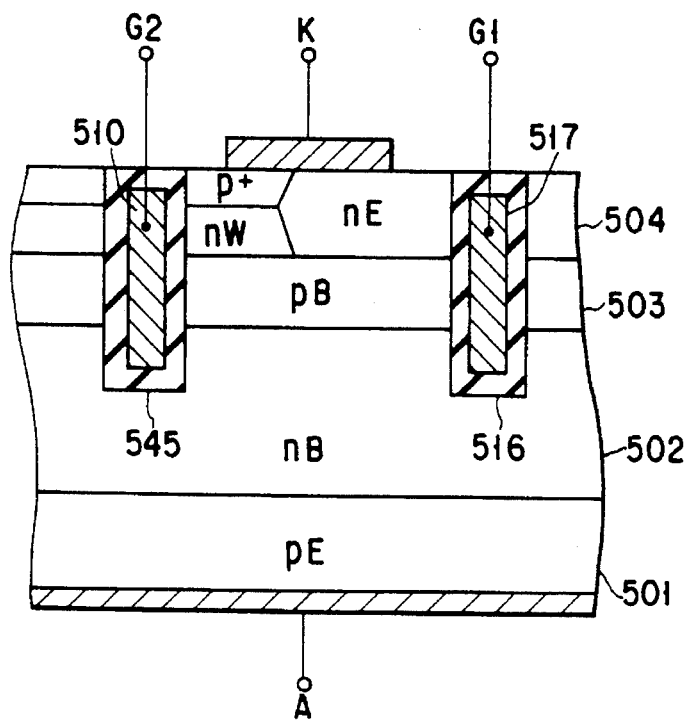

The embodiment shown in FIG. 60B is different from the embodiment shown in FIG. 60A in that a bottom portion of a trench 545 in which a MOSFET for discharging holes is to be formed extends to an n-type base layer. The operation method of this embodiment is the same as that of the embodiment shown in FIG. 58A.

In the embodiment shown in FIG. 61, a MOSFET (gate electrode G2) for discharging holes is formed in a striped form in a perpendicular direction with respect to the drawing surface. FIG. 61 is a sectional view of the MOSFET at different positions. An electrode 536 is continuously formed on the bottom portion of a striped trench 555, and an $p^+$-type layer 537 is intermittently formed to cover the electrode 536 under the striped trench 555.

In a hole discharging operation of this embodiment, holes in a p-type base layer 503 are short-circuited with the $p^+$-type layer 537 via the electrode 536 formed near an n-type emitter layer 504. A positive voltage is then applied to a gate electrode 538 (G2). As a result, an electron current flows in a channel 539 and is discharged to a cathode electrode 506 via an n-type emitter layer 504.

The operation method of this embodiment is indicated in FIG. 63B and is the same as that of the embodiment shown in FIG. 59A.

In the embodiment shown in FIG. 62, both a MOSFET for injecting electrons and a MOSFET for discharging holes are formed on side walls of trenches. More specifically, the MOSFET (gate electrode G1) for injecting electrons is formed in a trench 540, and the MOSFET (gate electrode G2) for discharging holes is formed in a trench 541.

Similar to the embodiment shown in FIG. 60A, the MOSFET (G1) for injecting electrons turns on and off a channel current flowing in the vertical direction, whereas the MOSFET for discharging holes turns on and off a channel current in the horizontal direction. More specifically, in this embodiment, a p-type base layer 503 is always in contact with a cathode electrode 506, but their contact ratio is set to be small so as to reduce the number of holes which escape in an ON state. In a hole discharging operation, a negative voltage is applied to the gate electrode G2 to store holes on a channel surface 542. As a result, the channel resistance greatly decreases, and a hole current 543 flows in the p-type base layer 503 in the horizontal direction, thus discharging the holes. The operation method of this embodiment is indicated in FIG. 63A and is the same as that of the embodiment shown in FIG. 58A.

As described above, in the embodiments shown in FIGS. 59 to 62, since a MOSFET for discharging holes is formed near an n-type emitter layer, unlike the conventional structure, no horizontal resistance is produced in the discharge path of a hole current. In addition, according to the operation method of these embodiments, when the MOSFET for discharging holes is turned on, the MOSFET for injecting electrons is turned on to let an electron current flow, so that a current concentration phenomenon due to a reduction in conducting region of an electron current as in a conventional case does not occur. Therefore, the element can be turned off up to a larger current as compared with the prior art.

Still another embodiment of the present invention will be described next, with reference to FIG. 65 showing the layout of the embodiment and FIG. 66 showing a sectional view taken along a line LXVI—LXVI of FIG. 65.

The same reference numerals as the prior art of FIG. 64 are added to the portions corresponding to those of the prior art of FIG. 64, and the detail explanation will be omitted. As is obvious from the comparison between this embodiment and the prior art of FIG. 64, an drain electrode 8 is formed to be in contact with a p-type base layer 2 at the position adjacent to an n-type emitter layer 3 according to this embodiment. An n-type drain layer 7 is short-circuited with the p-type base layer 2 by the drain electrode 8.

An n-type source layer 11 is formed at the position, which is a away from the n-type drain layer 7 at a predetermined distance. An insulated gate electrode 10 is formed between the drain layer 7 and the source layer 11. A source electrode 12 is integrally formed with and electrically connected to the cathode electrode 5. According to this embodiment, similar to the drain electrode 8, the source electrode 12 is formed to be in contact with the p-type base layer 2 as well as the source layer 11. The source electrode 12 may be formed to be in contact with only the source layer 11.

In addition, a gate electrode 24 is formed on a surface portion of the p-type base layer 2 between the n-type emitter layer 3 and an n-type base layer 1 via a gate insulating film 23, thus forming an n-channel MOSFET.

The thyristor with insulated gates shown in FIGS. 65 and 66 is turned off by a gate operation method based on the timing chart indicated by lines in FIG. 2.

Figure 67A:
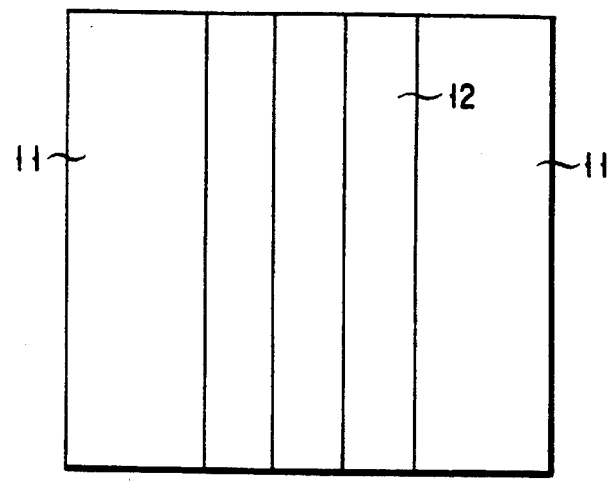
FIGS. 67A and 67B are plan and sectional views, respectively, showing the relation between an n-type source layer and a source electrode in the thyristor shown in FIGS. 65 and 66.
Figure 67B:
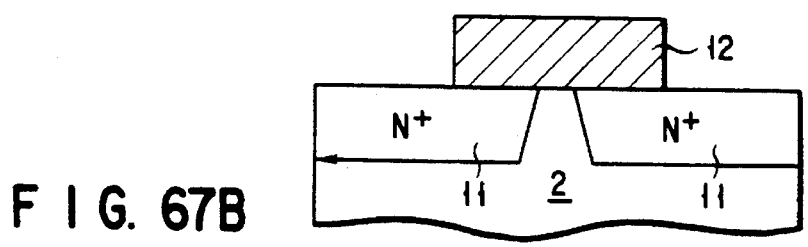

FIGS. 67A and 67B are plan and sectional views, respectively, showing the relation between the n-type source layer 11 and the source electrode 12 in the thyristor shown in FIGS. 65 and 66. As shown in FIGS. 67A and 67B, the source electrode 12 is short-circuited with the p-type base layer 2 along its entire length.

Figure 68A:
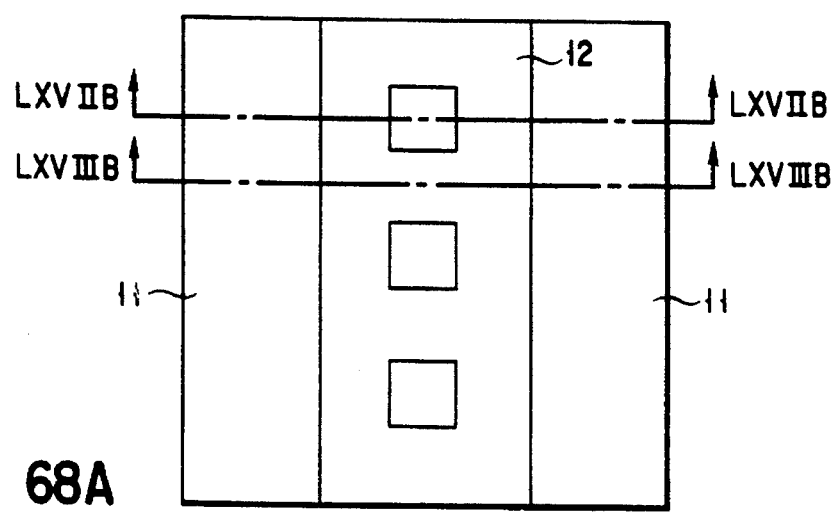
FIGS. 68A and 68B are a plan view and a sectional view taken along a line LXVIIIB—LXVIIIB of FIG. 68A, respectively, showing the relation between an n-type source layer and a source electrode in a modification of the thyristor shown in FIGS. 65 and 66.
Figure 68B:
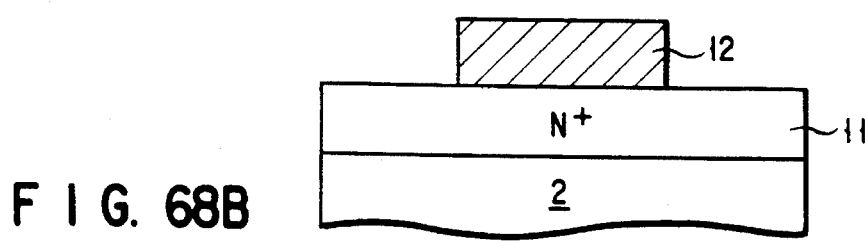

FIGS. 68A and 68B show a modification of the thyristor shown in FIGS. 65 and 66. FIGS. 68A and 68B are a plan view and a sectional view taken along a line LXVIIIB—LXVIIIB of FIG. 68A, respectively, showing the relation between the n-type source layer 11 and the source electrode 12 of the modification. The sectional view taken along a line LXVIIB—LXVIIB of FIG. 68A is substantially the same that shown in FIG. 67B.

In this embodiment, the source electrode 12 is partly short-circuited with the p-type base layer 2. However, this embodiment is operated in the same manner as that of the embodiment shown in FIGS. 67A and 67B, regardless that the source electrode 12 is partly short-circuited. Even where the source electrode 12 is not short-circuited with the p-type base layer 2, the device is operated in substantially the same manner.

As shown in FIG. 65, the drain electrode 8 is arranged inside the source electrode 12, and the cathode electrode 5 is arranged inside the drain electrode 8. The source and cathode electrodes 12 and 5 may be connected via a two-layer Al member. Further, part of the drain electrode may be cut out.

With the embodiments shown in FIGS. 65 to 68B, no horizontal resistance of the p-type base layer is generated in the bypass of a hole current at the time of turn-off. Furthermore, since the turn-off MOSFET is formed to surround the n-type emitter layer, the channel width of the turn-off MOSFET is increased so that the turn-off resistance of the thyristor is decreased.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A thyristor with insulated gates, comprising:

an emitter layer of a first conductivity type, a base layer of a second conductivity type, a base layer of the first conductivity type, and an emitter layer of the second conductivity type, arranged to form a pnpn structure;

a first well layer of the second conductivity type, electrically isolated from said base and emitter layers of the second conductivity type;

a first source layer and a first drain layer which are of the first conductivity type and formed in said first well layer, said emitter and first drain layers of the first conductivity type being electrically connected to each other;

a first gate electrode formed via a gate insulated film on a first interposed region of the second conductivity type as a portion of said base layer of the second conductivity type between said emitter and base layers of the first conductivity type;

a second gate electrode formed via a gate insulating film on a second interposed region of the second conductivity type as a portion of said first well layer between said first source and first drain layers of the first conductivity type;

a first main electrode connected to said emitter layer of the second conductivity type; and a second main electrode connected to said first source layer and the first conductivity type.

2. The thyristor according to claim 1, wherein said first and second gate electrodes are electrically connected to each other.

3. The thyristor according to claim 1, wherein said second main electrode is in contact with said first well layer so as to short-circuit said well layer with said first source layer of the first conductivity type.

4. The thyristor according to claim 1, further comprising:

a second drain layer of the first conductivity type short-circuited with said base layer of the second conductivity type via an electrode;

a second source layer of the first conductivity type connected to said second drain layer of the first conductivity type via a third interposed region of the second conductivity type, said second source layer of the first conductivity type being electrically connected to said second main electrode; and a third gate electrode formed via a gate insulating film on said third interposed region between said second source and second drain layers of the first conductivity type.

5. The thyristor according to claim 4, wherein said second source and second drain layers of the first conductivity type are formed in said base layer of the second conductivity type, and said third interposed region comprises a portion of said base layer of the second conductivity type.

6. The thyristor according to claim 4, wherein said second source and second drain layers of the first conductivity type are formed in said first well layer, and said third interposed region comprises a portion of said first well layer.

7. The thyristor according to claim 4, further comprising a second well layer of the second conductivity type, electrically isolated from said base, emitter, and first well layers of the second conductivity type, wherein said second source and second drain layers of the first conductivity type are formed in said second well layer, and said third interposed region comprises a portion of said second well layer.

8. The thyristor according to claim 1, further comprising:

a source layer of the second conductivity type electrically connected to said base layer of the second conductivity type;

a drain layer of second conductivity type connected to said source layer of the second conductivity type via a third interposed region of the first conductivity type, said drain layer of the second conductivity type being electrically connected to said second main electrode; and a third gate electrode formed via a gate insulating film on said third interposed region between said source and drain layers of the second conductivity type.

9. The thyristor according to claim 1, further comprising:

a drain layer of the second conductivity type connected to said emitter layer of the second conductivity type via a third interposed region of the first conductivity type, said drain layer of the second conductivity type being short-circuited with said base layer of the first conductivity type via an electrode; and a third gate electrode formed via a gate insulating film on said third interposed region between said emitter and drain layers of the second conductivity type.

10. The thyristor according to claim 1, further comprising:

a drain layer of the second conductivity type short-circuited with said base layer of the first conductivity type via an electrode;

a source layer of the second conductivity type connected to said drain layer of the second conductivity type via a third interposed region of the first conductivity type, said source layer of the second conductivity type being electrically connected to said first main electrode; and a third gate electrode formed via a gate insulating film on said third interposed region between said source and drain layers of the second conductivity type.

11. A thyristor with insulated gates, comprising:

a supporting substrate having an insulating surface;

first and second semiconductor sections arranged on said insulating surface of said supporting substrate and electrically isolated from each other;

a base layer of a first conductivity type and a base layer of a second conductivity type which are formed in said first semiconductor section and in contact with each other;

an emitter layer of the second conductivity type formed in said base layer of the first conductivity type so as to be out of contact with said base layer of the second conductivity type;

an emitter layer of the first conductivity type formed in said base layer of the second conductivity type so as to be out of contact with said base layer of the first conductivity type;

a first well layer of the second conductivity type formed in said second semiconductor section;

a first source layer and a first drain layer which are of the first conductivity type and formed in said first well layer, said emitter and first drain layers of the first conductivity type being electrically connected to each other;

a first gate electrode formed via a gate insulating film on a first interposed region of the second conductivity type as a portion of said base layer of the second conductivity type between said emitter and base layers of the first conductivity type;

a second gate electrode formed via a gate insulating film on a second interposed region of the second conductivity type as a portion of said first well layer between said first source and first drain layers of the first conductivity type;

a first main electrode connected to said emitter layer of the second conductivity type; and a second main electrode connected to said first source layer of the first conductivity type.

12. The thyristor according to claim 11, wherein said first and second gate electrodes are electrically connected to each other.

13. The thyristor according to claim 11, wherein said second main electrode is in contact with said first well layer so as to short-circuit said well layer with said first source layer of the first conductivity type.

14. The thyristor according to claim 11, further comprising:

a second drain layer of the first conductivity type short-circuited with said base layer of the second conductivity type via an electrode;

a second source layer of the first conductivity type connected to said second drain layer of the first conductivity type via a third interposed region of the second conductivity type, said second source layer of the first conductivity type being electrically connected to said second main electrode; and a third gate electrode formed via a gate insulating film on said third interposed region between said second source and second drain layers of the first conductivity type.

15. The thyristor according to claim 14, wherein said second source and second drain layers of the first conductivity type are formed in said base layer of the second conductivity type, and said third interposed region comprises a portion of said base layer of the second conductivity type.

16. The thyristor according to claim 14, wherein said second source and second drain layers of the first conductivity type are formed in said first well layer, and said third interposed region comprises a portion of said first well layer.

17. The thyristor according to claim 14, further comprising a third semiconductor section formed on said insulating surface of said supporting substrate and electrically isolated from said first and second semiconductor sections, and a second well layer of the second conductivity type formed in said third semiconductor section, wherein said second source and second drain layers of the first conductivity type are formed in said second well layer, and said third interposed region comprises a portion of said second well layer.

18. The thyristor according to claim 11, further comprising:

a source layer of the second conductivity type electrically connected to said base layer of the second conductivity type;

a drain layer of the second conductivity type connected to said source layer of the second conductivity type via a third interposed region of the first conductivity type, said drain layer of the second conductivity type being electrically connected to said second main electrode; and a third gate electrode formed via a gate insulating film on said third interposed region between said source and drain layers of the second conductivity type.

19. The thyristor according to claim 11, further comprising:

a drain layer of the second conductivity type connected to said emitter layer of the second conductivity type via a third interposed region of the first conductivity type, said drain layer of the second conductivity type being short-circuited with said base layer of the first conductivity type via an electrode; and a third gate electrode formed via a gate insulating film on said third interposed region between said emitter and drain layers of the second conductivity type.

20. The thyristor according to claim 11, further comprising:

a drain layer of the second conductivity type short-circuited with said base layer of the first conductivity type via an electrode;

a source layer of the second conductivity type connected to said drain layer of the second conductivity type via a third interposed region of the first conductivity type, said source layer of the second conductivity type being electrically connected to said first main electrode; and a third gate electrode formed via a gate insulating film on said third interposed region between said source and drain layers of the second conductivity type.

* * * * *